United States Patent
Drouin et al.

(10) Patent No.: US 10,712,403 B2
(45) Date of Patent: *Jul. 14, 2020

(54) MAGNETIC FIELD SENSOR AND ELECTRONIC CIRCUIT THAT PASS AMPLIFIER CURRENT THROUGH A MAGNETORESISTANCE ELEMENT

(71) Applicant: Allegro MicroSystems, LLC, Manchester, NH (US)

(72) Inventors: Mathew Drouin, Hooksett, NH (US); Devon Fernandez, Londonderry, NH (US); Jay M. Towne, Bow, NH (US); Alejandro Gabriel Milesi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/624,898

(22) Filed: Jun. 16, 2017

(65) Prior Publication Data

US 2017/0285117 A1   Oct. 5, 2017

Related U.S. Application Data

(63) Continuation of application No. 14/529,594, filed on Oct. 31, 2014, now Pat. No. 9,720,054.

(51) Int. Cl.
*G01R 33/09* (2006.01)
*G01R 33/00* (2006.01)
*G01R 33/028* (2006.01)

(52) U.S. Cl.
CPC ......... *G01R 33/09* (2013.01); *G01R 33/0023* (2013.01); *G01R 33/028* (2013.01)

(58) Field of Classification Search
CPC ... G01R 33/09; G01R 33/0023; G01R 33/028
See application file for complete search history.

(56) References Cited

U.S. PATENT DOCUMENTS

| | | |
|---|---|---|
| 3,132,337 A | 5/1964 | Martin |
| 3,195,043 A | 7/1965 | Burig et al. |
| 3,281,628 A | 10/1966 | Bauer et al. |
| 3,607,528 A | 9/1971 | Gassaway |
| 3,611,138 A | 10/1971 | Winebrener |
| 3,661,061 A | 5/1972 | Tokarz |
| 3,728,788 A | 4/1973 | Lucas et al. |

(Continued)

FOREIGN PATENT DOCUMENTS

| | | |
|---|---|---|
| CH | 683 469 A5 | 3/1994 |
| DE | 25 18 054 | 11/1976 |

(Continued)

OTHER PUBLICATIONS

Response to EPO Communication under Rules 161 and 162 EPC filed on Dec. 21, 2017 for EP Pat. Appl. No. 15853626.8; 2 pages.

(Continued)

*Primary Examiner* — Akm Zakaria
(74) *Attorney, Agent, or Firm* — Daly, Crowley, Mofford & Durkee, LLP

(57) ABSTRACT

Electronic circuits used in magnetic field sensors use transistors for passing a current through the transistors and also through a magnetoresistance element.

22 Claims, 14 Drawing Sheets

(56) References Cited

U.S. PATENT DOCUMENTS

| | | |
|---|---|---|
| 4,048,670 A | 9/1977 | Eysermans |
| 4,079,360 A | 3/1978 | Ookubo et al. |
| 4,180,753 A | 12/1979 | Cook, II |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |
| 4,315,523 A | 2/1982 | Mahawili et al. |
| 4,438,347 A | 3/1984 | Gehring |
| 4,490,674 A | 12/1984 | Ito |
| 4,573,258 A | 3/1986 | Lo et al. |
| 4,614,111 A | 9/1986 | Wolff |
| 4,649,796 A | 3/1987 | Schmidt |
| 4,670,715 A | 6/1987 | Fuzzell |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Aström et al. |
| 4,760,285 A | 7/1988 | Nelson |
| 4,764,767 A | 8/1988 | Ichikawa et al. |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,893,027 A | 1/1990 | Kammerer et al. |
| 4,908,685 A | 3/1990 | Shibasaki et al. |
| 4,910,861 A | 3/1990 | Dohogne |
| 4,935,698 A | 6/1990 | Kawaji et al. |
| 4,954,777 A | 9/1990 | Klopfer et al. |
| 4,970,411 A | 11/1990 | Halg et al. |
| 4,983,916 A | 1/1991 | Iijima et al. |
| 5,012,322 A | 4/1991 | Guillotte |
| 5,021,493 A | 6/1991 | Sandstrom |
| 5,028,868 A | 7/1991 | Murata et al. |
| 5,038,130 A | 8/1991 | Eck et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,168,244 A * | 12/1992 | Muranaka ............ G01R 33/09 327/510 |
| 5,185,919 A | 2/1993 | Hickey |
| 5,196,794 A | 3/1993 | Murata |
| 5,200,698 A | 4/1993 | Thibaud |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,247,278 A | 9/1993 | Pant et al. |
| 5,250,925 A | 10/1993 | Shinkle |
| 5,289,344 A | 2/1994 | Gagnon et al. |
| 5,286,426 A | 3/1994 | Rano, Jr. et al. |
| 5,304,926 A | 4/1994 | Wu |
| 5,315,245 A | 5/1994 | Schroeder et al. |
| 5,329,416 A | 7/1994 | Ushiyama et al. |
| 5,331,478 A * | 7/1994 | Aranovsky ............ G01R 33/09 327/510 |
| 5,332,956 A | 7/1994 | Oh |
| 5,332,965 A | 7/1994 | Wolf et al. |
| 5,341,097 A | 8/1994 | Wu |
| 5,399,968 A | 3/1995 | Sheppard et al. |
| 5,412,255 A | 5/1995 | Wallrafen |
| 5,414,355 A | 5/1995 | Davidson et al. |
| 5,424,558 A | 6/1995 | Borden et al. |
| 5,434,105 A | 7/1995 | Liou |
| 5,453,727 A | 9/1995 | Shibasaki et al. |
| 5,469,058 A | 11/1995 | Dunnam |
| 5,477,143 A | 12/1995 | Wu |
| 5,479,695 A | 1/1996 | Grader et al. |
| 5,486,759 A | 1/1996 | Seiler et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,521,501 A | 5/1996 | Dettmann et al. |
| 5,545,983 A | 8/1996 | Okeya et al. |
| 5,551,146 A | 9/1996 | Kawabata et al. |
| 5,581,170 A | 12/1996 | Mammano et al. |
| 5,581,179 A | 12/1996 | Engel et al. |
| 5,596,272 A | 1/1997 | Busch |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,696,790 A | 12/1997 | Graham et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,796,249 A | 8/1998 | Andräet et al. |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,886,070 A | 2/1999 | Honkura et al. |
| 5,883,567 A | 3/1999 | Mullins, Jr. |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jager et al. |
| 6,043,644 A | 3/2000 | de Coulon et al. |
| 6,136,250 A | 10/2000 | Brown |
| 6,169,396 B1 | 1/2001 | Yokotani et al. |
| 6,175,232 B1 | 1/2001 | De Coulon et al. |
| 6,175,233 B1 | 1/2001 | McCurley et al. |
| 6,180,041 B1 | 1/2001 | Takizawa |
| 6,181,036 B1 | 1/2001 | Kazama et al. |
| 6,184,679 B1 | 2/2001 | Popovic et al. |
| 6,194,893 B1 | 2/2001 | Yokotani et al. |
| 6,198,373 B1 | 3/2001 | Ogawa et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |
| 6,265,865 B1 | 7/2001 | Engel et al. |
| 6,278,269 B1 | 8/2001 | Vig et al. |
| 6,291,989 B1 | 9/2001 | Schroeder |
| 6,297,627 B1 | 10/2001 | Towne et al. |
| 6,297,628 B1 | 10/2001 | Bicking et al. |
| 6,323,642 B1 | 11/2001 | Nishimura et al. |
| 6,339,322 B1 | 1/2002 | Loreck et al. |
| 6,351,506 B1 | 2/2002 | Lewicki |
| 6,356,068 B1 | 3/2002 | Steiner et al. |
| 6,366,079 B1 | 4/2002 | Uenoyama |
| 6,392,478 B1 | 5/2002 | Mulder et al. |
| 6,436,748 B1 | 8/2002 | Forbes et al. |
| 6,437,558 B2 | 8/2002 | Li et al. |
| 6,452,381 B1 | 9/2002 | Nakatani et al. |
| 6,462,536 B1 | 10/2002 | Mednikov et al. |
| 6,492,804 B2 | 12/2002 | Tsuge et al. |
| 6,501,270 B1 | 12/2002 | Opie |
| 6,525,531 B2 | 2/2003 | Forrest et al. |
| 6,542,847 B1 | 4/2003 | Lohberg et al. |
| 6,545,332 B2 | 4/2003 | Huang |
| 6,545,457 B2 | 4/2003 | Goto et al. |
| 6,545,462 B2 | 4/2003 | Schott et al. |
| 6,566,862 B1 | 5/2003 | Goto et al. |
| 6,640,451 B1 | 11/2003 | Vinarcik |
| 6,653,968 B1 | 11/2003 | Schneider |

(56) References Cited

U.S. PATENT DOCUMENTS

| | | |
|---|---|---|
| 6,674,679 B1 * | 1/2004 | Perner .................. G11C 7/062 365/189.07 |
| 6,687,644 B1 | 2/2004 | Zinke et al. |
| 6,692,676 B1 | 2/2004 | Vig et al. |
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,815,944 B2 | 11/2004 | Vig et al. |
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Golfer et al. |
| 6,917,321 B1 | 7/2005 | Haurie et al. |
| 7,026,808 B2 | 4/2006 | Vig et al. |
| 7,031,170 B2 | 4/2006 | Daeche et al. |
| 7,038,448 B2 | 5/2006 | Schott et al. |
| 7,049,924 B2 | 5/2006 | Hayashi et al. |
| 7,126,327 B1 | 10/2006 | Busch |
| 7,184,876 B2 | 2/2007 | Tuelings et al. |
| 7,190,784 B2 | 3/2007 | Li |
| 7,193,412 B2 | 3/2007 | Freeman |
| 7,199,579 B2 | 4/2007 | Scheller et al. |
| 7,250,760 B2 | 7/2007 | Ao |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,292,095 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,058,870 B2 | 11/2011 | Sterling |
| 8,063,634 B2 | 11/2011 | Sauber et al. |
| 8,089,276 B2 | 1/2012 | Kentsch |
| 8,106,649 B2 | 1/2012 | Kaita et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,274,279 B2 | 9/2012 | Gies |
| 8,362,579 B2 | 1/2013 | Theuss et al. |
| 8,723,512 B1 | 5/2014 | Burdette et al. |
| 9,812,637 B2 | 11/2017 | Fermon et al. |
| 2001/0002791 A1 | 6/2001 | Tsuge et al. |
| 2001/0009367 A1 | 7/2001 | Seitzer et al. |
| 2001/0026153 A1 | 10/2001 | Nakamura et al. |
| 2002/0027488 A1 | 3/2002 | Hayat-Dawoodi et al. |
| 2002/0084923 A1 | 7/2002 | Li |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0107366 A1 | 6/2003 | Busch et al. |
| 2003/0173955 A1 | 9/2003 | Uenoyama |
| 2003/0227286 A1 | 12/2003 | Dunisch et al. |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0155647 A1 | 8/2004 | Stauth et al. |
| 2004/0170052 A1 * | 9/2004 | Inui .................. G11C 11/15 365/158 |
| 2004/0174164 A1 | 9/2004 | Ao |
| 2004/0184196 A1 | 9/2004 | Jayasekara |
| 2004/0189285 A1 | 9/2004 | Uenoyama |
| 2004/0196045 A1 | 10/2004 | Larsen |
| 2004/0263014 A1 | 12/2004 | Miya |
| 2005/0017709 A1 | 1/2005 | Stolfus et al. |
| 2005/0120782 A1 | 6/2005 | Kishibata et al. |
| 2005/0122095 A1 | 6/2005 | Dooley |
| 2005/0122099 A1 | 6/2005 | Imamoto et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0280411 A1 | 12/2005 | Bicking |
| 2006/0033487 A1 | 2/2006 | Nagano et al. |
| 2006/0038559 A1 | 2/2006 | Lamb et al. |
| 2006/0068237 A1 | 3/2006 | Murphy |
| 2006/0097717 A1 | 5/2006 | Tokuhara et al. |
| 2006/0125473 A1 | 6/2006 | Frachon et al. |
| 2006/0175674 A1 | 8/2006 | Taylor |
| 2006/0181263 A1 | 8/2006 | Doogue et al. |
| 2006/0202692 A1 | 9/2006 | Tatschl et al. |
| 2006/0238190 A1 | 10/2006 | Ishio |
| 2006/0261801 A1 | 11/2006 | Busch |
| 2007/0110199 A1 | 5/2007 | Momtaz et al. |
| 2007/0146647 A1 | 6/2007 | Sarayeddine et al. |
| 2007/0247141 A1 | 10/2007 | Pastre et al. |
| 2007/0285089 A1 | 12/2007 | Ibuki et al. |
| 2008/0012558 A1 | 1/2008 | Rossler et al. |
| 2008/0013298 A1 | 1/2008 | Sharma et al. |
| 2008/0094055 A1 | 4/2008 | Monreal et al. |
| 2008/0137784 A1 | 6/2008 | Krone |
| 2008/0237818 A1 | 10/2008 | Engel et al. |
| 2008/0238410 A1 | 10/2008 | Charlier et al. |
| 2009/0001964 A1 | 1/2009 | Strzalkowski |
| 2009/0001965 A1 | 1/2009 | Ausserlechner et al. |
| 2009/0001972 A1 | 1/2009 | Fernandez et al. |
| 2009/0058404 A1 | 3/2009 | Kurumado |
| 2009/0085706 A1 | 4/2009 | Baarman et al. |
| 2009/0102467 A1 | 4/2009 | Snell et al. |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0167298 A1 | 7/2009 | Kreutzbruck et al. |
| 2009/0206827 A1 | 8/2009 | Aimuta et al. |
| 2009/0206831 A1 | 8/2009 | Fermon et al. |
| 2009/0212765 A1 | 8/2009 | Doogue et al. |
| 2009/0243601 A1 | 10/2009 | Feldtkeller |
| 2009/0315543 A1 | 12/2009 | Guo et al. |
| 2009/0326860 A1 | 12/2009 | Hainz et al. |
| 2010/0026279 A1 | 2/2010 | Vig et al. |
| 2010/0072988 A1 | 3/2010 | Hammerschmidt et al. |
| 2010/0141249 A1 | 6/2010 | Ararao et al. |
| 2010/0188078 A1 | 7/2010 | Foletto et al. |
| 2010/0201356 A1 | 8/2010 | Koller et al. |
| 2010/0211347 A1 | 8/2010 | Friedrich et al. |
| 2010/0237450 A1 | 9/2010 | Doogue et al. |
| 2010/0276769 A1 | 11/2010 | Theuss et al. |

(56) References Cited

U.S. PATENT DOCUMENTS

| | | |
|---|---|---|
| 2010/0295140 A1 | 11/2010 | Theuss et al. |
| 2010/0330708 A1 | 12/2010 | Engel et al. |
| 2011/0018533 A1 | 1/2011 | Cesaretti et al. |
| 2011/0031960 A1 | 2/2011 | Hohe et al. |
| 2011/0048102 A1 | 3/2011 | Fernandez et al. |
| 2011/0074405 A1 | 3/2011 | Doogue et al. |
| 2011/0127998 A1 | 6/2011 | Elian et al. |
| 2011/0298448 A1 | 12/2011 | Foletto et al. |
| 2012/0007589 A1 | 1/2012 | Okada |
| 2012/0013333 A1 | 1/2012 | Ararao et al. |
| 2012/0019236 A1 | 1/2012 | Tiernan et al. |
| 2012/0086090 A1 | 4/2012 | Sharma et al. |
| 2012/0249133 A1 | 10/2012 | Friedrich |
| 2012/0274314 A1 | 11/2012 | Cesaretti et al. |
| 2012/0293167 A1 | 11/2012 | Kitanaka et al. |
| 2012/0303305 A1 | 11/2012 | Bergqvist et al. |
| 2013/0015845 A1 | 1/2013 | Fox |
| 2013/0113474 A1 | 5/2013 | Elian |
| 2013/0214774 A1 | 8/2013 | Cesaretti et al. |
| 2013/0320970 A1 | 12/2013 | Foletto et al. |
| 2014/0084906 A1 | 3/2014 | Ruigrok et al. |
| 2014/0175584 A1 | 6/2014 | Foletto et al. |
| 2014/0176126 A1 | 6/2014 | Friedrich et al. |
| 2014/0232379 A1 | 8/2014 | Nazarian et al. |
| 2014/0266176 A1 | 9/2014 | Fernandez et al. |
| 2017/0307696 A1 | 10/2017 | Werth et al. |

FOREIGN PATENT DOCUMENTS

| | | | |
|---|---|---|---|
| DE | 40 31 560 | | 4/1992 |
| DE | 195 39 458 A1 | | 4/1997 |
| DE | 196 34 715 A1 | | 3/1998 |
| DE | 196 50 935 A1 | | 6/1998 |
| DE | 198 38 433 | | 3/1999 |
| DE | 199 61 504 A1 | | 6/2001 |
| DE | 102 10 184 | | 9/2003 |
| DE | 103 14 602 A1 | | 10/2004 |
| DE | 10 2006 037 226 A1 | | 2/2008 |
| DE | 10 2007 018 238 A1 | | 10/2008 |
| DE | 10 2007 041 230 B3 | | 4/2009 |
| DE | 10 2010 016 584 | | 11/2010 |
| DE | 10 2011 102483 | | 11/2012 |
| EP | 0 289 414 A2 | | 11/1988 |
| EP | 0 289 414 A3 | | 11/1988 |
| EP | 0 357 013 A2 | | 3/1990 |
| EP | 0 357 013 A3 | | 3/1990 |
| EP | 0 361 456 A2 | | 4/1990 |
| EP | 0 361 456 A3 | | 4/1990 |
| EP | 0 504 583 | | 9/1992 |
| EP | 0 680 103 A1 | | 11/1995 |
| EP | 0 898 180 A2 | | 2/1999 |
| EP | 0 944 888 B1 | | 10/2001 |
| EP | 1 443 332 A1 | | 8/2004 |
| EP | 1 580 560 A1 | | 9/2005 |
| EP | 1 637 898 A1 | | 3/2006 |
| EP | 1 662 353 A1 | | 5/2006 |
| EP | 1 679 524 A1 | | 7/2006 |
| EP | 1 850 143 A1 | | 10/2007 |
| EP | 2 063 229 | | 5/2009 |
| EP | 2 730 893 A1 | | 5/2014 |
| FR | 2 748 105 | | 10/1997 |
| FR | 2 909 756 | | 6/2008 |
| GB | 2135060 A | | 8/1984 |
| GB | 2276727 A | | 10/1994 |
| GB | 2481482 | | 12/2011 |
| JP | 61-48777 | | 3/1986 |
| JP | 363 084176 A | | 4/1988 |
| JP | 63-263782 | | 10/1988 |
| JP | 63-300911 | | 12/1988 |
| JP | H02-116753 | | 5/1990 |
| JP | 02-149013 | | 6/1990 |
| JP | H03-29817 | | 2/1991 |
| JP | 04-152688 | | 5/1992 |
| JP | H06-273437 | | 9/1994 |
| JP | 08-97486 | | 4/1996 |
| JP | 09-166612 | | 6/1997 |
| JP | 10-38988 | | 2/1998 |
| JP | H10038988 | * | 2/1998 |
| JP | 10-332725 | | 12/1998 |
| JP | 11-064363 | | 3/1999 |
| JP | 11-74142 | | 3/1999 |
| JP | 2000-183241 A | | 6/2000 |
| JP | 2001-043475 | | 2/2001 |
| JP | 2001-141738 A | | 5/2001 |
| JP | 2001-165702 | | 6/2001 |
| JP | 2001-1659951 | | 6/2001 |
| JP | 2002-117500 | | 4/2002 |
| JP | 2002-149013 | | 5/2002 |
| JP | 2002-357920 | | 12/2002 |
| JP | 2003-177171 | | 6/2003 |
| JP | 2004-055932 | | 2/2004 |
| JP | 2004-093381 | | 3/2004 |
| JP | 2004-152688 | | 5/2004 |
| JP | 2004-356338 | | 12/2004 |
| JP | 2004-357858 | | 12/2004 |
| JP | 2005-517928 | | 6/2005 |
| JP | 2005-337866 | | 12/2005 |
| JP | 2005-345302 | | 12/2005 |
| JP | 2006-003096 | | 1/2006 |
| JP | 2007-012582 A | | 1/2007 |
| JP | 2007-218799 | | 8/2007 |
| JP | 2008-264569 | | 11/2008 |
| JP | 2009-150732 | | 7/2009 |
| WO | WO 88/09026 | | 11/1988 |
| WO | WO 93/12403 | | 6/1993 |
| WO | WO 94/08203 | | 4/1994 |
| WO | WO 95/18982 | | 7/1995 |
| WO | WO 96/02849 A1 | | 2/1996 |
| WO | WO 1999/49322 | | 9/1999 |
| WO | WO 2001/74139 A2 | | 10/2001 |
| WO | WO 2001/74139 A3 | | 10/2001 |
| WO | WO 2003/069358 A2 | | 8/2003 |
| WO | WO 2003/069358 A3 | | 8/2003 |
| WO | WO 2003/107018 A1 | | 12/2003 |
| WO | WO 2004/027436 | | 4/2004 |
| WO | WO 2004/072672 A1 | | 8/2004 |
| WO | WO 2005/013363 A2 | | 2/2005 |
| WO | WO 2005/013363 A3 | | 2/2005 |
| WO | WO 2006/056829 | | 6/2006 |
| WO | WO 2006/083479 | | 8/2006 |
| WO | WO 2007/138508 A1 | | 12/2007 |
| WO | WO 2008/008140 A2 | | 1/2008 |
| WO | WO 2008/008140 A3 | | 1/2008 |
| WO | WO 2008/048379 A1 | | 4/2008 |
| WO | WO 2008/121443 A1 | | 10/2008 |
| WO | WO 2008/145662 A1 | | 12/2008 |
| WO | WO 2009/108422 A2 | | 9/2009 |
| WO | WO 2009/108422 A3 | | 9/2009 |
| WO | WO 2010/014309 A1 | | 2/2010 |
| WO | WO 2010/065315 | | 6/2010 |
| WO | WO 2010/096367 A1 | | 8/2010 |
| WO | WO 2011/011479 | | 1/2011 |
| WO | WO 2012/148646 | | 11/2012 |
| WO | WO 2013/169455 | | 11/2013 |

OTHER PUBLICATIONS

Amended Claims in response to EPO Communication under Rules 161 and 162 EPC filed on Dec. 21, 2017 for EP Pat. Appl. No. 15853626.8; 7 pages.
Response (with RCE) to U.S. Final Office Action dated Sep. 8, 2017 for U.S. Appl. No. 13/946,417; Response with RCE filed Nov. 29, 2017; 16 pages.
U.S. Appl. No. 12/840,324, filed Jul. 21, 2010, Cesaretti et al.
U.S. Appl. No. 12/959,672, filed Dec. 3, 2010, Doogue et al.
U.S. Appl. No. 12/968,353, filed Dec. 15, 2010, Donovan et al.
U.S. Appl. No. 13/095,371, filed Apr. 27, 2011, Cesaretti et al.
U.S. Appl. No. 13/1424,613, filed Mar. 20, 2012, Doogue et al.
U.S. Appl. No. 13/350,970, filed Jan. 16, 2012, Milano et at.
U.S. Appl. No. 13/398,127, filed Feb. 16, 2012, Cesaeretti et al.
U.S. Appl. No. 13/439,094, filed Apr. 4, 2012, Friedrich et al.
U.S. Appl. No. 13/526,106, filed Jun. 18, 2012, Vig et al.

(56) References Cited

OTHER PUBLICATIONS

U.S. Appl. No. 13/748,999, filed Jan. 24, 2013, Vig et al.
U.S. Appl. No. 13/871,131, filed Apr. 26, 2013, David et al.
U.S. Appl. No. 13/946,010, filed Jul. 19, 2013, David et al.
U.S. Appl. No. 13/946,380, filed Jul. 19, 2013, Taylor et al.
U.S. Appl. No. 13/946,400, filed Jul. 19, 2013, David et al.
U.S. Appl. No. 13/946,417, filed Jul. 19, 2013, Burdette et al.
U.S. Appl. No. 13/946,830, filed Jul. 19, 2013, Taylor et al.
U.S. Appl. No. 14/529,577, filed Oct. 31, 2014, Foletto et al.
U.S. Appl. No. 14/529,606, filed Oct. 31, 2014, Foletto et al.
U.S. Appl. No. 14/529,669, filed Oct. 31, 2014, David et al.
Ahn et al. "A New Toroidal-Meander Type Integrated Inductor With A Multilevel Meander Magnetic Core", IEEE Transactions on Magnetics, vol. 30, No. 1, Jan. 1994, pp. 73-79.
Allegro "Two-Wire True Zero Speed Miniature Differential Peak-Detecting Gear Tooth Sensor;" ATS645LSH; 2004; Allegro MicroSystems, Inc., Worcester, MA 01615; pp. 1-14.
Allegro Microsystems, Inc. Data Sheet A1341 "High Precision, Highly Programmable Linear Hall Effect Sensor IC with EEPROM, Output Protocols SENT and PWM, and Advanced Output Linearization Capabilities;" May 17, 2010; 46 pages.
Allegro Microsystems, Inc. Data Sheet ATS601LSG "Non-TPOS, Tooth Detecting Speed Sensor;" Nov. 1, 2011; 9 pages.
Allegro Microsystems, Inc. "Gear-Tooth Sensor For Automotive Applications," Aug. 3, 2001.
Allegro MicroSystems, Inc. Hall-Effect IC Applications Guide, http://www.allegromicro.com/en/Products/Design/an/an27701.pdf, Copyright 1987, 1997, pp. 1-36.
Allegro "True Zero-Speed Low-Jitter High Accuracy Gear Tooth Sensor;" ATS625LSG; 2005; Allegro MicroSystems, Inc. Worcester, MA 01615; pp. 1-21.
Ausserlechner et al. "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al. "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner "Limits of Offset Cancellation by the Principle of Spinning Current Hall Probe;" Proceedings of IEEE Sensors; Oct. 2004; pp. 1117-1120.
Ausserlechner "The piezo-Hall effect in n-silicon for arbitrary crystal orientation;" Proceedings of IEEE Sensors; vol. 3; Oct. 24, 2004; ISBN: 0-7803-8692-2; pp. 1149-1152.
Bahreyni et al. "A Resonant Micromachined Magnetic Field Sensor;" IEEE Sensors Journal; vol. 7, No. 9, Sep. 2007; pp. 1326-1334.
Barrettino et al. "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.
Baschirotto et al. "Development and Analysis of PCB Vector 2-D Magnetic Field Sensor System for Electronic Compass;" IEEE Sensors Journal vol. 6, No. 2; Apr. 2006; pp. 365-371.
Bilotti et al. "Monolithic Magnetic Hall Sensor Using Dynamic Quadrature Offset Cancellation;" IEEE Journal of Solid-State Circuits; vol. 32, Issue 6; Jun. 1997; pp. 829-836.
Bowers et al. "Microfabrication and Process Integration of Powder-Based Permanent Magnets", Interdisciplinary Microsystems Group, Dept. Electrical and Computer Engineering, University of Florida, Usa; Technologies for Future Micro-Nano Manufacturing Workshop, Napa, California, Aug. 8-10, 2011, pp. 162-165.
Demierre et al. "Reference Magnetic Actuator for Self-Calibration of a Very Small Hall Sensor Array;" Sensors and Actuators A97-98; Apr. 2002; pp. 39-46.
Dwyer "Back-Biased Packaging Advances (SE, SG & SH versus SA & SB)," http://www.allegromicro.com/en/Products/Design/packaging_advances/index.asp, Copyright 2008, pp. 1-5.
Frick et al. "CMOS Microsystem for AC Current Measurement with Galvanic Isolation;" IEEE Sensors Journal; vol. 3, No. 6; Dec. 2003; pp. 752-760.

Halg "Piezo-Hall Coefficients of n-Type Silicon;" Journal of Applied Physics; vol. 64, No. 1; Jul. 1, 1988; pp. 276-282.
Honeywell International, Inc. "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.
Hosticka "CMOS Sensor Systems;" Sensors and Actuators A66; Apr. 1998; pp. 335-341.
Infineon Product Brief, TLE 4941plusC, Differential Hall IC for Wheel Speed Sensing, Oct. 2010, www.infineon.com/sensors, 2 pages.
Infineon Technologies "Differential Two-Wire Hall Effect Sensor IC;" TLE4942 Preliminary Data Sheet; Jun. 2000; pp. 1-13.
Johnson et al. "Hybrid Hall Effect Device," Appl. Phys. Lett., vol. 71, No. 7, Aug. 1997, pp. 974-976.
Kanda et al. "The Piezo-Hall Effect in n-Silicon;" $22^{nd}$ International Conference on the Physics of Semiconductors; vol. 1, Jan. 1995; pp. 89-92.
Krammerer et al. "A Hall effect sensors network insensitive to mechanical stress;" Proceedings of IEEE Sensors; vol. 3, Oct. 2004; pp. 1071-1074.
Lagorce et al. "Magnetic and Mechanical Properties of Micromachined Strontium Ferrite/Polyimide Composites;" Journal of Microelectromechanical Systems; vol. 6, No. 4; Dec. 1997; pp. 307-312.
Lequesne et al. "High-Accuracy Magnetic Position Encoder Concept;" IEEE Transactions on Industry Applications; vol. 35, No. 3; May/Jun. 1999; pp. 568-576.
Magnani et al. "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.
Manic et al. "Short and Long-Term Stability Problems of Hall Plates in Plastic Packages;" IEEE $38^{th}$ Annual International Reliability Physics Symposium; Apr. 2000; pp. 225-230.
Manic "Drift in Silicon Integrated Sensors and Circuits Due to the Thermo-Mechanical Stresses;" Lausanne, École Polytechnique Fédérale De Lausanne 2000; Part 1 of 2; 74 pages.
Manic "Drift in Silicon Integrated Sensors and Circuits Due to the Thermo-Mechanical Stresses;" Lausanne, École Polytechnique Fédérale De Lausanne 2000; Part 2 of 2; 102 pages.
Melexis Microelectronic Systems, Hall Applications Guide, Section 3—Applications,1997 (48 pages).
Motz et al. "An Integrated Magnetic Sensor with Two Continuous-Time $\Delta\Sigma$-Converters and Stress Compensation Capability;" IEEE International Solid-State Circuits Conference; Digest of Technical Papers; Feb. 6, 2006; ISBN: 1-4244-0079-1; pp. 1151-1160.
Motz et al. "A Chopped Hall Sensor with Small Jitter and Programmable "True Power-On" Function;" IEEE Journal of Solid-State Circuits; vol. 40, No. 7; Jul. 2005; pp. 1533-1540.
Motz et al. "An Integrated Hall Sensor Platform Design for Position, Angle and Current Sensing;" IEEE Sensors 2006; Exco, Daegu, Korea / Oct. 22-25, 2006; pp. 1008-1011.
Munter "A Low-offset Spinning-current Hall Plate;" Sensors and Actuators A21-A23; 1990; pp. 742-746.
Munter "Electronic Circuitry for a Smart Spinning-current Hall Plate with Low Offset;" Sensors and Actuators A; Jun. 1991; pp. 747-751.
Oniku et al. "High-Energy-Density Permanent Micromagnets Formed From Heterogeneous Magnetic Powder Mixtures", Interdisciplinary Microsystems Group, Dept. of Electrical and Computer Engineering, University of Florida, Gainesville, FL 32611, USA; Preprint of MEMS 2012 Conf. Paper, 4 pages.
Park et al. "Batch-Fabricated Microinductors with Electroplated Magnetically Anisotropic and Laminated Alloy Cores", IEEE Transactions on Magnetics, vol. 35, No. 5, Sep. 1999, 10 pages.
Park et al. "Ferrite-Based Integrated Planar Inductors and Transformers Fabricated at Low Temperature;" IEEE Transactions on Magnetics; vol. 33, No. 5; Sep. 1997; pp. 3322-3324.
Partin et al. "Temperature Stable Hall Effect Sensors;" IEEE Sensors Journal, vol. 6, No. 1; Feb. 2006; pp. 106-110.

(56) References Cited

OTHER PUBLICATIONS

Pastre et al. "A Hall Sensor Analog Front End for Current Measurement with Continuous Gain Calibration;" IEEE Sensors Journal; vol. 7, No. 5; May 2007; pp. 860-867.
Pastre et al. "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
Popovic "Sensor Microsystems;" Proc. 20th International Conference on Microelectronics (MWIL 95); vol. 2, NIS, Serbia, Sep. 12-14, 1995; pp. 531-537.
Randhawa "Monolithic Integrated Hall Devices in Silicon Circuits;" Microelectronics Journal; vol. 12, No. 6; Sep. 14-17, 1981; pp. 24-29.
Robert Bosch GMBH Stuttgart "Active Sensor for ABS/ASR/VDC-Systems with 2-Wire-Current Interface;" Specification TLE4941/TLE4942; Version 5; Jun. 25, 2000; 44 pages.
Ruther et al. "Integrated CMOS-Based Sensor Array for Mechanical Stress Mapping;" 5th IEEE Conference on Sensors, Oct. 2007; pp. 1131-1134.
Ruther et al. "Thermomagnetic Residual Offset in Integrated Hall Plates;" IEEE Sensors Journal; vol. 3, No. 6; Dec. 2003; pp. 693-699.
Sargent "Switched-capacitor IC controls feedback loop;" EDN; Design Ideas; Feb. 17, 2000; pp. 154 and 156.
Schneider "Temperature Calibration of CMOS Magnetic Vector Probe for Contactless Angle Measurement System," IEDM 1996 pp. 533-536.
Schott et al. "Linearizing Integrated Hall Devices;" 1997 International Conference on Solid-State Sensors and Actuators, Jun. 16-19, 1997; pp. 393-396.
Schott et al. "CMOS Single-Chip Electronic Compass with Microcontroller;" IEEE Journal of Solid-State Circuits; vol. 42, No. 12; Dec. 2007; pp. 2923-2933.
Simon et al. "Autocalibration of Silicon Hall Devices;" 8th International Conference on Solid-State Sensors and Actuators; vol. 2; Jun. 25, 1995; pp. 237-240.
Smith et al. "Low Magnetic Field Sensing with GMR Sensors;" Sensor Magazine; Part 1; Sep. 1999; http://archives.sensorsmag.com/articles/0999/76mail.shtml; pp. 1-8.
Smith et al. "Low Magnetic Field Sensing with GMR Sensors;" Sensor Magazine; Part 2; Oct. 1999; http://archives.sensorsmag.com/articles/1099/84/mail.shtml; pp. 1-11.
Steiner et al. "Double-Hall Sensor with Self-Compensated Offset;" International Electron Devices Meeting; Dec. 7, 1997; ISBN: 0-7803-4100-7; pp. 911-914.
Steiner et al. Offset Reduction in Hall Devices by Continuous Spinning Current Method; Sensors and Actuators A66; 1998; pp. 167-172.
Stellrecht et al. Characterization of Hygroscopic Swelling Behavior of Mold Compounds and Plastic Packages; IEEE Transactions on Components and Packaging Technologies; vol. 27, No. 3; Sep. 2004; pp. 499-506.
Tian et al. "Multiple Sensors on Pulsed Eddy-Current Detection for 3-D Subsurface Crack Assessment;" IEEE Sensors Journal, vol. 5, No. 1; Feb. 2005; pp. 90-96.
Trontelj et al. "CMOS Integrated Magnetic Field Source Used as a Reference in Magnetic Field Sensors on Common Substrate;" WEP 1-6; IMTC; May 1994; pp. 461-463.
Wu et al. "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.
Zou et al. "Three-Dimensional Die Surface Stress Measurements in Delaminated and Non-Delaminated Plastic Packages;" 48th Electronic Components and Technology Conference; May 25, 1998; pp. 1223-1234.
Office Action/Restriction Requirement dated May 14, 2010; for U.S. Appl. No. 12/037,393; 6 pages.
Response to Office Action/Restriction Requirement dated May 14, 2010; for U.S. Appl. No. 12/037,393; 6 pages.
Office Action dated Jun. 30, 2010; for U.S. Appl. No. 12/037,393; 21 pages.
Response to Office Action dated Jun. 30, 2010; for U.S. Appl. No. 12/037,393; 34 pages.
Notice of Allowance dated Nov. 3, 2010; for U.S. Appl. No. 12/037,393; 7 pages.
Request for Continued Examination dated Jan. 25, 2011; for U.S. Appl. No. 12/037,393; 1 page.
Notice of Allowance dated Febuary 11, 2011; for U.S. Appl. No. 12/037,393; 8 pages.
Office Action dated Feb. 2, 2011; for U.S. Appl. No. 12/959,672; 13 pages.
Response to Office Action dated Feb. 2, 2011; for U.S. Appl. No. 12/959,672; 8 pages.
Notice of Allowance dated Jun. 27, 2011; for U.S. Appl. No. 12/959,672; 8 pages.
Request for Continued Examination dated Jul. 12, 2011; for U.S. Appl. No. 12/959,672; 2 pages.
Notice of Allowance dated Jul. 19, 2011; for U.S. Appl. No. 12/959,672; 8 pages.
Restriction Requirement dated Apr. 12, 2012; for U.S. Appl. No. 12/183,367; 6 pages.
Response to Office Action/Restriction Requirement dated Apr. 12, 2013; for U.S. Appl. No. 12/183,367;2 pages.
Office Action dated May 12, 2011; for U.S. Appl. No. 12/183,367; 17 pages.
Response to Office Action dated May 12, 2011; for U.S. Appl. No. 12/183,367; 13 pages.
Office Action dated Oct. 20, 2011; for U.S. Appl. No. 12/183,367; 11 pages.
Supplemental Response to Restriction Requirement dated Feb. 6, 2013; for U.S. Appl. No. 12/183,367; 2 pages.
Response to Office Action dated Oct. 20, 2011; for U.S. Appl. No. 12/183,367; 15 pages.
Final Office Action dated May 2, 2013; for U.S. Appl. No. 12/183,367; 15 pages.
Response to Final Office Action dated May 2, 2013; for U.S. Appl. No. 12/183,367; 8 pages.
Final Office Action dated Jul. 1, 2013; for U.S. Appl. No. 12/183,367; 6 pages.
Final Office Action dated Jul. 23, 2013; for U.S. Appl. No. 12/183,367; 8 pages.
Response to Office Action dated Jul. 23, 2013; for U.S. Appl. No. 12/183,367; 13 pages.
Notice of Allowance dated Sep. 6, 2013; for U.S. Appl. No. 12/183,367; 7 pages.
Office Action dated Jun. 7, 2012; for U.S. Appl. No. 12/360,889; 9 pages.
Response to Office Action dated Jun. 7, 2012; for U.S. Appl. No. 12/360,889; 11 pages.
Office Action dated Jan. 18, 2013; for U.S. Appl. No. 12/360,889; 7 pages.
Response to Office Action dated Jan. 18, 2013; for U.S. Appl. No. 12/360,889; 6 pages.
Office Action dated Jun. 28, 2013; for U.S. Appl. No. 12/360,889; 7 pages.
Response to Office Action dated Jun. 28, 2013; for U.S. Appl. No. 12/360,889; 15 pages.
Office Action/Restriction Requirement dated Oct. 23, 2009; for U.S. Appl. No. 12/328,798; 7 pages.
Response to Office Action/Restriction Requirement dated Oct. 23, 2009; for U.S. Appl. No. 12/328,798; 1 page.
Office Action dated Dec. 14, 2009; for U.S. Appl. No. 12/328,798; 20 pages.
Response to Office Action dated Dec. 14, 2009; for U.S. Appl. No. 12/328,798; 22 pages.
Office Action dated May 24, 2010; for U.S. Appl. No. 12/328,798; 22 pages.
Response to Office Action dated May 24, 2010; for U.S. Appl. No. 12/328,798; 23 pages.

(56) References Cited

OTHER PUBLICATIONS

Office Action dated Oct. 31, 2011; for U.S. Appl. No. 12/328,798; 23 pages.
Response to Office Action dated Oct. 31, 2011; for U.S. Appl. No. 12/328,798; 14 pages.
Final Office Action dated May 10, 2012; for U.S. Appl. No. 12/328,798; 17 pages.
Response to Final Office Action dated May 10, 2012; for U.S. Appl. No. 12/328,798; 6 pages.
Request for Continued Examination dated Aug. 9, 2012; for U.S. Appl. No. 12/328,798; 1 page.
Notice of Allowance dated Oct. 26, 2012; for U.S. Appl. No. 12/328,798; 13 pages.
Request for Continued Examination dated Jan. 24, 2013; for U.S. Appl. No. 12/328,798; 3 pages.
Notice of Allowance dated Mar. 1, 2013; for U.S. Appl. No. 12/328,798; 10 pages.
Office Action dated Feb. 22, 2012; for U.S. Appl. No. 13/241,380; 23 pages.
Response to Office Action dated Feb. 22, 2012; for U.S. Appl. No. 13/241,380; 16 pages.
Office Action dated Jul. 19, 2012; for U.S. Appl. No. 13/241,380; 18 pages.
Response to Office Action dated Jul. 19, 2012; for U.S. Appl. No. 13/241,380; 6 pages.
Notice of Allowance dated Oct. 29, 2012; for U.S. Pat. App. No. 13/241,380; 23 pages.
Request for Continued Examination dated Jan. 24, 2013; for U.S. Appl. No. 13/241,380; 3 pages.
Notice of Allowance dated Feb. 21, 2013; for U.S. Appl. No. 13/241,380; 9 pages.
Office Action dated Jul. 6, 2012; for U.S. Appl. No. 12/706,318; 29 pages.
Response to Office Action dated Jul. 6, 2012; for U.S. Appl. No. 12/706,318; 12 pages.
Supplemental Response to Office Action dated Jul. 6, 2012; for U.S. Appl. No. 12/706,318; 12 pages.
Notice of Allowance dated Dec. 10, 2012; for U.S. Appl. No. 12/706,318; 9 pages.
Office Action dated Sep. 11, 2012; for U.S. Appl. No. 12/840,324; 30 pages.
Response to Office Action dated Sep. 11, 2012; for U.S. Appl. No. 12/840,324; 15 pages.
Final Office Action dated Feb. 12, 2013; for U.S. Appl. No. 12/840,324; 19 pages.
Response to Final Office Action dated Feb. 12, 2013; for U.S. Appl. No. 12/840,324; 12 pages.
Notice of Allowance dated May 24, 2013; for U.S. Appl. No. 12/840,324; 12 pages.
Corrected Notice of Allowability dated Jul. 17, 2013; for U.S. Appl. No. 12/840,324; 7 pages.
Corrected Notice of Allowability dated Aug. 9, 2013; for U.S. Appl. No. 12/840,324; 6 pages.
Office Action dated Jun. 11, 2013; for U.S. Appl. No. 13/095,371; 31 pages.
Response to Office Action dated Jun. 11, 2013; for U.S. Appl. No. 13/095,371; 25 pages.
Notice of Allowance dated Oct. 28, 2013; for U.S. Appl. No. 13/095,371; 19 pages.
European Board of Appeals Decision dated Feb. 28, 2005; for European Pat. App. No. 03 710 766.1; 14 pages.
European Communication for the Board of Appeals dated Apr. 30, 2009; for European Pat. App. No. 03 710 766.1; 2 pages.
European Board of Appeals Datasheet for the Decision dated Nov. 22, 2007; for European Pat. App. No. 03 710 766.1; 22 pages.
European Preliminary Amendment from the Board of Appeal dated May 26, 2009; for European Pat. App. No. 03 710 766.1; pages.
Letter from Yuasa and Hara dated Jun. 4, 2008; Japanese First Office Action dated Apr. 7, 2008; for JP Pat. App. No. 2009-568426; 5 pages.
Letter from Yuasa and Hara dated Oct. 21, 2008; Japanese Response to First Office Action filed Sep. 22, 2008; for JP Pat. App. No. 2009-568426; 14 pages.
Letter from Yuasa and Hara dated Dec. 12, 2008; Japanese Second Office Action; for JP Pat. App. No. 2009-568426; 4 pages.
Letter from Yuasa and Hara dated Apr. 23, 2009; Japanese Response to Second Office Action filed Mar. 25, 2009; for JP Pat. App. No. 2009-568426; 8 pages.
Letter from Yuasa and Hara dated Jan. 17, 2011; Japanese Third Office Action dated Feb. 16, 2011; for JP Pat. App. No. 2009-568426; 5 pages.
Letter from Yuasa and Hara dated Jun. 9, 2011; Japanese Response to Third Office Action filed May 13, 2011; for JP Pat. App. No. 2009-568426; 27 pages.
Japanese Notice of Allowance dated Nov. 8, 2011; for Japanese Pat. App. No. 2009-568426; 3 pages.
Letter from NTD Patent & Trademark Agency Limited dated Oct. 13, 2010; for Chinese Pat. App. No. 200880008895.3; 2 pages.
Chinese Office Action (with English translation) dated Sep. 9, 2010; for Chinese Pat. App. No. 200880008895.3; 12 pages.
Letter from NTD Patent & Trademark Agency Limited dated Mar. 28, 2011; for Chinese Pat. App. No. 200880008895.3; 1 page.
Chinese Response to Office Action dated Mar. 28, 2011; for Chinese Pat. App. No. 200880008895.3; 7 pages.
Chinese Notice of Allowance (with English translation) dated Jul. 4, 2011; for Chinese Pat. App. No. 200880008895.3; 4 pages.
Letter from Yuasa and Hara dated Jul. 26, 2012; for Japanese Pat. App. No. 2010-201028; 5 pages.
Japanese First Office Action (English translation) dated Jul. 26, 2012; for Japanese Pat. App. No. 2010-201028; 5 pages.
Letter from Yuasa and Hara dated Oct. 16, 2012; for Japanese Pat. App. No. 2010-201028; 2 pages.
Japanese Response to First Office Action (with English translation) dated Oct. 16, 2012; for Japanese Pat. App. No. 2010-201028; 10 pages.
Letter from Yuasa and Hara dated Aug. 7, 2013; for Japanese Pat. App. No. 2010-201028; 4 pages.
Japanese Second Office Action (English translation) dated Aug. 7, 2013; for Japanese Pat. App. No. 2010-201028; 3 pages.
Letter from NTD Patent and Trademark Office dated Oct. 10, 2012; for Chinese Pat. App. No. 200980106535.4; 2 pages.
Chinese First Office Action (with English translation) dated Aug. 29, 2012; for Chinese Pat. App. No. 200980106535.4; 8 pages.
Letter to NTD Patent and Trademark Office dated Dec. 11, 2012; for Chinese Pat. App. No. 200980106535.4; 8 pages.
Letter from NTD Patent and Trademark Office dated Jan. 19, 2013; for Chinese Pat. App. No. 200980106535.4; 1 page.
Response to Chinese First Office Action dated Aug. 29, 2012; for Chinese Pat. App. No. 200980106535.4; 12 pages.
Letter from NTD Patent and Trademark Office dated May 21, 2013; for Chinese Pat. App. No. 200980106535.4; 2 pages.
Chinese Second Office Action (with English translation) dated Apr. 15, 2013; for Chinese Pat. App. No. 200980106535.4; 9 pages.
Letter to NTD Patent and Trademark Agency dated Jun. 19, 2013; for Chinese Pat. App. No. 200980106535.4; 11 pages.
Letter from NTD Patent and Trademark Agency dated Jul. 11, 2013; for Chinese Pat. App. No. 200980106535.4; 1 pages.
Response to Chinese Second Office Action dated Aug. 29, 2012; for Chinese Pat. App. No. 200980106535.4; 12 pages.
Letter from Yuasa and Hara dated May 27, 2013; for Japanese Pat. App. No. 2010-547666; 2 pages.
Japanese Notice of Reasons for Rejection (English translation) for Japanese Pat. App. No. 2010-547666; 4 pages.
Email from NTD Patent and Trademark Office dated Jun. 11, 2012; for Chinese Pat. App. No. 200920783766.7; 2 pages.
Japanese First Office Action (with English translation) dated May 3, 2012; for Chinese Pat. App. No. 200920783766.7; 13 pages.
Letter to NTD Patent and Trademark Office dated Aug. 29, 2012; for Chinese Pat. App. No. 200920783766.7; 20 pages.
Letter from NTD Patent and Trademark Office dated Oct. 18, 2012; for Chinese Pat. App. No. 200920783766.7; 1 pages.
Response to Japanese First Office Action dated May 3, 2013; for Chinese Pat. App. No. 200920783766.7; 9 pages.

(56) References Cited

OTHER PUBLICATIONS

Letter from NTD Patent and Trademark Agency dated Feb. 6, 2013; for Chinese Pat. App. No. 200920783766.7; 2 pages.
Japanese Second Office Action dated Jan. 18, 2013; for Chinese Pat. App. No. 200920783766.7; 8 pages.
Letter to NTD Patent and Trademark Agency dated Feb. 6, 2013; for Chinese Pat. App. No. 200920783766.7; 2 pages.
Letter from NTD Patent and Trademark Agency dated Mar. 21, 2013; for Chinese Pat. App. No. 200920783766.7; 1 page.
Response to Japanese Second Office Action (with English translation) dated Jan. 18, 2013; for Chinese Pat. App. No. 200920783766.7; 7 pages.
Chinese Notice of Completing Formalities for Patent Registration (with English translation); dated Mar. 6, 2013; for Chinese Pat. App. No. 200920783766.7; 4 pages.
Letter from Yuasa and Hara dated Aug. 16, 2013; for Japanese Pat. App. No. 2011-539582; 3 pages.
Japanese Notice of Reasons for Rejection; dated Jul. 16, 2013; for Japanese Pat. App. No. 2011-539582; 3 pages.
EP Official Communication; dated Feb. 23, 2012; for EP. Pat. App. No. 10739429.8; 2 pages.
Response to EP Official Communication dated Feb. 23, 2012 for EP. Pat. App. No. 10739429.8; filed on Sep. 4, 2012, 21 pages.
European Decision to Grant Patent dated Sep. 5, 2013; for European Pat. App. No. 10739429.8; 2 pages.
PCT Search Report dated Nov. 19, 2003 for PCT Pat. App. No. PCT/US03/02489; 5 pages.
PCT Search Report for PCT/US2006/000363 dated May 11, 2006.
PCT International Preliminary Report and Written Opinion on Patentability of the ISA dated Aug. 7, 2007; for PCT/US2006/000363; 9 pages.
PCT Search Report and Written Opinion of the ISA for PCT/US2008/053551; dated Jul. 15, 2008; 11 pages.
PCT International Preliminary Report on Patentability for PCT/US2008/053551; dated Oct. 8, 2009; 7 pages.
PCT Search Report of the ISA for PCT/US2009/031776 dated Oct. 23, 2009.
PCT International Preliminary Report on Patentability and Written Opinion dated Sep. 10, 2010 for PCT/US2009/031776.
PCT Search Report of the ISA for PCT/US2009/048237 dated Aug. 25, 2009; 2 pages.
PCT International Preliminary Report on Patentability and Written Opinion for PCT/US2009/048237 dated Feb. 10, 2011, 8 pages.
European Response to Written Opinion dated Apr. 18, 2011; for European Pat. App. No. 09789890.2; 11 pages.
PCT Search Report and Written Opinion for PCT/US2009/065044 dated Jan. 7, 2010; 11 pages.
PCT International Preliminary Report on Patentability and Written Opinion of the ISA; dated Jun. 7, 2011; for PCT Pat. App. No. PCT/US2009/065044; 7 pages.
PCT Search Report and Written Opinion of the ISA for PCT/US2010/024256 dated Aug. 11, 2010; 11 pages.
Amendment under PCT Article 19 filed on Oct. 5, 2010 in PCT/US2010/024256; 18 pages, 18 pages.
PCT International Preliminary Report on Patentability and Written Opinion of the ISA dated Sep. 1, 2011; for PCT Pat. App. No. PCT/US2010/024256; 9 pages.
PCT Search Report and Written Opinion of the ISA for PCT/US2010/042694 dated Sep. 27, 2010; 13 pages.
PCT International Preliminary Report on Patentability and Written Opinion of the ISA; dated Feb. 2, 2012; for PCT Pat. App. No. PCT/US2010/042694; 11 pages.
European Search Report dated Jul. 4, 2011; for European Pat. App. No. 13169661.9; 11 pages.
PCT Search Report and Written Opinion of the ISA for PCT Pat. App. No. PCT/US2012/032315; dated Jun. 22, 2012; 16 pages.
PCT Search Report and the Written Opinion of the ISA dated Jul. 17, 2013; for PCT/US2013/037065; 13 pages.

Bowers et al.; "Microfabrication and Process Integration of Powder-Based Permanent Magnets;" Technologies for Future Micro-Nano Manufacturing Workshop; Aug. 2011; pp. 162-165.
Kapser et al.; "Integrated GMR Based Wheel Speed Sensor for Automotive Applications;" IEEE 2007 Conference on Sensors; Oct. 2007; pp. 848-851.
Oniku et al.; "High-Energy-Density Permanent Micromagnets Formed From Heterogeneous Magnetic Powder Mixtures;" IEEE $25^{th}$ International Conference on Micro Electro Mechanical Systems, Jan. 2012; 4 pages.
Office Action in U.S. Appl. No. 13/468,478 dated Jan. 15, 2014, 36 pages.
International Search Report and Written Opinion dated Oct. 28, 2014 for Int'l PCT Application PCT/US2014/044991; 12 pages.
International Search Report and Written Opinion dated Nov. 4, 2014 for Int'l PCT Application PCT/US2014/044993; 13 pages.
PCT Invitation to Pay Additional Fees and Partial Search Report dated Nov. 4, 2014; for PCT Pat. App. No. PCT/US2014/044236; 7 pages.
PCT Search Report and Written Opinion of the ISA dated Dec. 19, 2014; for PCT Pat. App. No. PCT/US2014/044236; 23 pages.
Office Action dated Mar. 20, 2015; for U.S. Appl. No. 13/946,417; 54 pages.
Response filed on Jun. 19, 2015 to Office Action dated Mar. 20, 2015; for U.S. Appl. No. 13/946,417; 15 pages.
Office Action dated Jul. 9, 2015; for U.S. Appl. No. 13/946,380; 63 pages.
Final Office Action dated Aug. 28, 2015; for U.S. Appl. No. 13/946,417; 34 pages.
Response dated Nov. 9, 2015 to Final Office Action dated Aug. 28, 2015; For U.S. Appl. No. 13/946,417; 14 pages.
Request for Continued Examination dated Nov. 9, 2015; For U.S. Appl. No. 13/946,417; 3 pages.
Response dated Nov. 9, 2015 to Office Action dated Jul. 9, 2015; For U.S. Appl. No. 13/946,380; 26 pages.
Non-Final Office Action dated Dec. 3, 2015; for U.S. Appl. No. 13/946,417; 29 pages.
Final Office Action dated Dec. 15, 2015; For U.S. Appl. No. 13/946,380; 36 pages.
PCT International Search Report and Written Opinion of the ISA dated Dec. 23, 2015; For PCT App. No. PCT/US2015/055233; 12 pages.
PCT International Search Report and Written Opinion of the ISA dated Jan. 15, 2016; For PCT Pat. App. No. PCT/US2015/055236; 12 pages.
PCT International Preliminary Report on Patentability and Written Opinion of the ISA dated Jan. 28, 2016; For PCT Pat. App. No. PCT/US2014/044236; 17 pages.
PCT International Search Report and Written Opinion of the ISA dated Feb. 4, 2016; For PCT Pat. App. No. PCT/US2015/055474; 15 pages.
Response dated Mar. 3, 2016 to Office Action dated Dec. 3, 2015; For U.S. Appl. No. 13/946,417; 17 pages.
Response with RCE filed on Apr. 12, 2016 to the Final Office Action dated Dec. 15, 2015; for U.S. Appl. No. 13/946,380; 20 pages.
Office Action dated Jul. 28, 2016 for U.S. Appl. No. 14/529,669; 78 pages.
International Search Report and Written Opinion of the ISA dated Aug. 3, 2016; for PCT Application No. PCT/US2015/055230; 12 pages.
Office Action dated Aug. 26, 2016 for U.S. Appl. No. 13/946,380; 40 pages.
Final Office Action dated Oct. 6, 2016; for U.S. Appl. No. 13/946,417; 45 pages.
Image File Wrapper Part 1 downloaded Oct. 21, 2016 for U.S. Appl. No. 13/946,380; 175 pages.
Image File Wrapper Part 2 downloaded Oct. 21, 2016 for U.S. Appl. No. 13/946,380; 175 pages.
Image File Wrapper Part 3 downloaded Oct. 21, 2016 for U.S. Appl. No. 13/946,380; 197 pages.
Image File Wrapper Part 1 downloaded Oct. 21, 2016 for U.S. Appl. No. 14/529,669; 200 pages.

(56) References Cited

OTHER PUBLICATIONS

Image File Wrapper Part 2 downloaded Oct. 21, 2016 for U.S. Appl. No. 14/529,669; 197 pages.
Image File Wrapper Part 1 downloaded Oct. 21, 2016 for U.S. Appl. No. 13/946,417; 175 pages.
Image File Wrapper Part 2 downloaded Oct. 21, 2016 for U.S. Appl. No. 13/946,417; 175 pages.
Image File Wrapper Part 3 downloaded Oct. 21, 2016 for U.S. Appl. No. 13/946,417; 175 pages.
Image File Wrapper Part 4 downloaded Oct. 21, 2016 for U.S. Appl. No. 13/946,417; 96 pages.
Image File Wrapper Part 1 downloaded Oct. 21, 2016 for U.S. Appl. No. 14/529,606; 200 pages.
Image File Wrapper Part 2 downloaded Oct. 21, 2016 for U.S. Appl. No. 14/529,606; 189 pages.
Image File Wrapper Part 1 downloaded Oct. 21, 2016 for U.S. Appl. No. 14/529,577; 200 pages.
Image File Wrapper Part 2 downloaded Oct. 21, 2016 for U.S. Appl. No. 14/529,577; 158 pages.
Office Action dated Nov. 3, 2016 regarding U.S. Appl. No. 14/529,606; 12 pages.
Response to Office Action dated Jul. 28, 2016 for U.S. Appl. No. 14/529,669; Response filed on Oct. 28, 2016; 18 Pages.
Response filed on Nov. 9, 2016 to the Non-Final Office Action dated Aug. 26, 2016; for U.S. Appl. No. 13/946,380; 19 pages.
Office Action dated Nov. 9, 2016 regarding U.S. Appl. No. 14/529,577; 14 pages.
Response to Office Action filed on Nov. 9, 2016 for U.S. Appl. No. 13/946,380; 19 pages.
EP Response filed on Dec. 9, 2016 to Official Communication dated Oct. 14, 2016 regarding European Pat. Appl. No. 14742067.3; 23 pages.
Final Office Action dated Jan. 9, 2017 for U.S. Appl. No. 14/529,669; 11 pages.
Response to Oct. 6, 2016 Final Office Action from U.S. Appl. No. 13/946,417, filed Jan. 24, 2017; 14 Pages.
Response to Office Action filed Jan. 27, 2017 for U.S. Appl. No. 14/529,577; 18 pages.
Response to Office Action filed on Jan. 26, 2017 for U.S. Appl. No. 14/529,606; 19 pages.
Final Office Action dated Jan. 12, 2017 for U.S. Appl. No. 13/946,380; 32 pages.
Notice of Allowance dated Mar. 10, 2017 for U.S. Appl. No. 14/529,577; 8 pages.
Office Action dated Mar. 15, 2017 from U.S. Appl. No. 13/946,417; 43 Pages.
Amendment filed Mar. 30, 2017 for U.S. Appl. No. 14/529,669; 12 pages.
European Search Report dated Apr. 5, 2017 for EP Pat. Appl. No. 16192498.0; 10 pages.
Request for Continued Examination filed on Apr. 11, 2017 for U.S. Appl. No. 13/946,380; 3 pages.
Amendment filed on Apr. 11, 2017 for U.S. Appl. No. 13/946,380; 18 pages.
Request for Continued Examination filed on Apr. 21, 2017 for U.S. Appl. No. 14/529,606; 3 pages.
Preliminary Amendment filed on Apr. 21, 2017 for U.S. Appl. No. 14/529,606; 12 pages.
Non-final Office Action dated May 19, 2017 for U.S. Appl. No. 14/529,606; 11 pages.
Office Action dated May 19, 2017 for U.S. Appl. No. 13/946,380; 20 pages.
Notice of Allowance dated May 10, 2017 for U.S. Appl. No. 14/529,594, 8 pages.
Response to Office Action filed on Jun. 14, 2017 for U.S. Appl. No. 13/946,417, 10 pages.
Response to Office Action filed on Jun. 22, 2017 for U.S. Appl. No. 13/946,380; 8 pages.
Response to Office Action filed on Jul. 5, 2017 for U.S. Appl. No. 14/529,606; 13 pages.
Notice of Allowance dated Jul. 13, 2017 for U.S. Appl. No. 13/946,380; 9 pages.
English translations of Claims on File dated Sep. 20, 2018 for Japanese Application No. 2017-522906; 7 Pages.
Instruction Letter to Foreign Associate dated Jul. 30, 2018 for Japanese Application No. 2017-522906; 2 Pages.
Letter from Foreign Associate dated Sep. 20, 2018 reporting voluntary amendment filed for Japanese Application No. 2017-522906; 2 Pages.
EP Reply to Official Communication filed on Nov. 29, 2017 for EP Pat. Appl. No. 15787111.2; 2 pages.
EP Amended Specification filed on Nov. 29, 2017 for EP Pat. Appl. No. 15787111.2; 2 pages.
EP Amended Claims filed on Nov. 29, 2017 for EP Pat. Appl. No. 15787111.2; 13 pages.
A.A. Thornton letter filed Dec. 15, 2017 in response to EPO communication under Rule 161 and 162EPC for EP Pat. Appl. No. 15791066.2; 2 pages.
Amended claims filed on Dec. 15, 2017 in response to EPO communication under Rule 161 and 162EPC for EP Pat. Appl. No. 15791066.2; 5 pages.
U.S. Final Office Action dated Sep. 8, 2017 for U.S. Appl. No. 13/946,417; 56 pages.
Examination Report dated Mar. 8, 2018 for EP Appl. No. 15791066.2; 4 pages.
Response to Final Office Action dated Jun. 15, 2018 for U.S. Appl. No. 13/946,417, filed Sep. 14, 2018; 15 Pages.
Communication Pursuant to Article 94(3) EPC dated Jul. 9, 2018 for EP Application No. 15853626.8; 4 Pages.
Amended p. 5 Description with tracked changed and New p. 5a Description as filed on Jul. 13, 2018 for EP Application No. 15791066.2; 2 Pages.
Amended Description with tracked changes as filed on Jul. 13, 2018 for EP Application No. 15791066.2; 11 Pages.
Amended Claims with tracked changes as filed on Jul. 13, 2018 for EP Application No. 15791066.2; 4 Pages.
Response to the Official Communication dated Mar. 8, 2018 for EP Application No. 15791066.2 as filed on Jul. 13, 2018; 2 Pages.
Communication under Rule 71(3) EPC for EP Pat. Appl. No. 15787111.2 dated Feb. 28, 2018; 7 pages.
Allowed specification for EP Pat. Appl. No. 15787111.2 dated Nov. 29, 2017; 87 pages.
U.S. Non-Final Office Action dated Feb. 8, 2018 for U.S. Appl. No. 13/946,417; 37 Pages.
U.S. Final Office Action dated Jun. 15, 2018 for U.S. Appl. No. 13/946,417; 33 Pages.
Response to U.S. Non-Final Office Action dated Feb. 8, 2018 for U.S. Appl. No. 13/946,417; Response filed on Apr. 19, 2018; 14 pages.
A.A. Thornton letter dated Nov. 26, 2018 in to response Official Communication dated Jul. 9, 2018 for EP Pat. Appl. No. 15853626.8; 4 pages.
Amended Claims filed on Nov. 26, 2018 for EP Pat. Appl. No. 15853626.8; 4 pages.
Response to Final Office Action dated Jul. 26, 2018 for U.S. Appl. No. 15/655,135, filed Oct. 11, 2018; 21 Pages.
Communication under Rule 71(3) EPC dated Oct. 10, 2018 for International Application No. 15791066.2; 7 Pages.
Allowed Specification dated Oct. 10, 2018 for International Application No. 15791066.2; 102 Pages.
Response to Final Office Action dated Jun. 15, 2018 for U.S. Appl. No. 13/946,417, filed Nov. 14, 2018; 14 Pages.
Office Action dated Jul. 10, 2019 for U.S. Appl. No. 15/658,757; 23 pages.
Notice of Intention to Grant dated May 27, 2019 for EP Pat. Appl. No. 15787099.9; 7 pages.
Allowed Specification dated May 6, 2016 for EP Pat. Appl. No. 15787099.9; 71 pages.
DCMD Instruction letter dated Feb. 13, 2019 for KR Pat. Appl. No. 10-2016-7004180; 2 pages.
21st Century Letter dated Mar. 14, 2019 regarding Voluntary Amendment and Substantive Examination for KR Pat. Appl. No. 10-2016-7004180; 1 page.

(56) References Cited

OTHER PUBLICATIONS

21st Century Listing of Pending Claims filed on Mar. 14, 2019 regarding Voluntary Amendment and Substantive Examination for KR Pat. Appl. No. 10-2016-7004180; 13 pages.
Intention to Grant dated Apr. 25, 2019 for EP Pat. Appl. No. 15853626.8-1022: 7 pages.
Allowed Specification dated Jul. 7, 2016 for EP Pat. Appl. No. 15853626.8; 104 pages.
Response to U.S. Non-Final Office Action dated Feb. 7, 2019 for U.S. Appl. No. 13/946,417; Response filed Apr. 22, 2019; 14 pages.
Yuasa and Hara Letter dated Apr. 1, 2019 for JP Pat. Appl. No. 2017-522907; 3 pages.
Yuasa and Hara Notice for Reasons for Rejection filed on Mar. 1, 2019 for JP Pat. Appl. No. 2017-522907; 5 pages.
Yuasa and Hara Claims Now on File filed on Mar. 1, 2019 for JP Pat. Appl. No. 2017-522907; 12 pages.
Response filed on May 29, 2019 for Japanese Patent Application No. 2017-522907 with English Translation; 40 Pages.
Notice of Allowance dated Jun. 10, 2019 for Japanese Patent Application No. 2017-522908 with English Translation of Allowed Claims; 9 Pages.
Final Office Action dated Nov. 21, 2019 for U.S. Appl. No. 15/658,757; 24 pages.
Response to Office Action with English translation dated Dec. 26, 2019 for Japanese Application No. 2017-522906; 16 pages.
Partial European Search Report dated Dec. 4, 2019 for EP Application No. 19198294.1-1022, 13 Pages.
Response to Office Action and Request for Continued Examination (RCE) dated Jan. 16, 2020 for U.S. Appl. No. 15/658,757; 19 pages.
Response to Office Action dated Jan. 14, 2020 for U.S. Appl. No. 16/136,844; 14 pages.
Current Source Wikipedia https://en.wikipedia.org/wiki/Current_source, downloaded on Nov. 12, 2019; 10 pages.
Notice of Allowance dated Sep. 11, 2019 for U.S. Appl. No. 13/946,417; 10 pages.
Supplemental Notice of Allowability dated Oct. 2, 2019 for U.S. Appl. No. 13/946,417; 7 pages.
Office Action dated Oct. 24, 2019 for U.S. Appl. No. 16/136,844; 21 pages.
Response to Office Action dated Sep. 23, 2019 for U.S. Appl. No. 15/658,757; 15 pages.
Office Action with English translation dated Oct. 23, 2019 for Japanese Application No. 2017-522906; 5 pages.
Notice of Allowance with English Allowed Claims dated Oct. 31, 2019 for Japanese Application No. 2017-522907; 17 pages.

* cited by examiner

MAGNETIC FIELD SENSOR AND ELECTRONIC CIRCUIT THAT PASS AMPLIFIER CURRENT THROUGH A MAGNETORESISTANCE ELEMENT

CROSS REFERENCE TO RELATED APPLICATIONS

This application is a Continuation application and claims the benefit of U.S. patent application Ser. No. 14/529,594, filed on Oct. 31, 2014, which is incorporated herein by reference in its entirety.

STATEMENT REGARDING FEDERALLY SPONSORED RESEARCH

Not Applicable.

FIELD OF THE INVENTION

This invention relates generally to magnetic field sensors and, more particularly, to a magnetic field sensor, or an electronic circuit used therein, that pass an amplifier supply current through a magnetic field sensing element.

BACKGROUND

Magnetoresistance elements are known. A magnetoresistance element changes resistance in response to a magnetic field. Magnetic field sensors having electronic circuits coupled to the magnetoresistance element can inject a current into the magnetoresistance element and use a voltage resulting across the magnetoresistance element as being representative of a sensed magnetic field.

Conventionally, the current used to drive the magnetoresistance element uses power.

It would be desirable to provide a magnetic field sensor and associated electronic circuit for which a magnetoresistance element requires no extra power beyond that which is otherwise used by the magnetic field sensor.

SUMMARY

The present invention provides a magnetic field sensor and associated electronic circuit for which a magnetoresistance element requires no extra power beyond that which is otherwise used by the magnetic field sensor.

In accordance with an example useful for understanding an aspect of the present invention, an electronic circuit includes a first magnetoresistance element having first and second terminals. The electronic circuit also includes a first transistor having a control node, a first current passing node, and a second current passing node. The electronic circuit also includes a first voltage source having first and second nodes between which a first voltage is generated. The first terminal of the first magnetoresistance element is coupled to the first current passing node of the first transistor. The first node of the first voltage source is coupled to the control node of the first transistor and the second node of the first voltage source is coupled to the second terminal of the first magnetoresistance element. The electronic circuit is operable to generate a first current signal at the second current passing node of the first transistor related to a resistance value of the first magnetoresistance element.

In accordance with another example useful for understanding an aspect of the present invention, a magnetic field sensor includes a substrate and an electronic circuit disposed upon the substrate. The electronic circuit includes a first magnetoresistance element having first and second terminals. The electronic circuit further includes a first transistor having a control node, a first current passing node, and a second current passing node. The electronic circuit further includes a first voltage source having first and second nodes between which a first voltage is generated, wherein the first terminal of the first magnetoresistance element is coupled to the first current passing node of the first transistor, and wherein the first node of the first voltage source is coupled to the control node of the first transistor and the second node of the first voltage source is coupled to the second terminal of the first magnetoresistance element. The electronic circuit is operable to generate a first current signal at the second current passing node of the first transistor related to a resistance value of the first magnetoresistance element. The electronic circuit further includes a second magnetoresistance element having first and second terminals and a second transistor having a control node, a first current passing node, and a second current passing node. The electronic circuit further includes a second voltage source having first and second nodes between which a second voltage is generated. The electronic circuit further includes a load coupled to the second current passing node of the first transistor, wherein the second current passing node of the first transistor is coupled to the second current passing node of the second transistor. The first terminal of the second magnetoresistance element is coupled to the first current passing node of the second transistor. The first node of the second voltage source is coupled to the control node of the second transistor and the second node of the second voltage source is coupled to the second terminal of the second magnetoresistance element. The electronic circuit is operable to generate a second current signal at the second current passing node of the second transistor related to a resistance value of the second magnetoresistance element, wherein a current passing through the load is equal to a difference between the first current signal and the second current signal.

In accordance with another example useful for understanding an aspect of the present invention, a magnetic field sensor includes a substrate and an electronic circuit disposed upon the substrate. The electronic circuit includes a first magnetoresistance element having first and second terminals and a first transistor having a control node, and first current passing node, and a second current passing node. The electronic circuit further includes a first voltage source having first and second nodes between which a first voltage is generated. The first terminal of the first magnetoresistance element is coupled to the first current passing node of the first transistor. The first node of the first voltage source is coupled to the control node of the first transistor and the second node of the first voltage source is coupled to the second terminal of the first magnetoresistance element. The electronic circuit is operable to generate a first current signal at the second current passing node of the first transistor related to a resistance value of the first magnetoresistance element. The electronic circuit further includes a second magnetoresistance element having first and second terminals and a second transistor having a control node, a first current passing node, and a second current passing node. The electronic circuit further includes a second voltage source having first and second nodes between which a second voltage is generated. The electronic circuit further includes a load coupled to the second current passing node of the first transistor. The second current passing node of the first transistor is coupled to the second current passing node of the second transistor. The first terminal of the second magnetoresistance element is coupled to the first current passing node of the second transistor. The first node of the second voltage source is coupled to the control node of the second transistor and the second node of the second voltage source is coupled to the second terminal of the second magnetoresistance element. The electronic circuit is operable to generate a second current signal at the second current passing node of the second transistor related to a resistance value of the second magnetoresistance element. A current passing through the load is equal to a difference between the first current signal and the second current signal. The electronic circuit further includes a third magnetoresistance element having first and second terminals and a third transistor having a control node, and first current passing node, and a second current passing node. The electronic circuit further includes a third voltage source having first and second nodes between which a third voltage is generated. The first terminal of the third magnetoresistance element is coupled to the first current passing node of the third transistor. The first node of the third voltage source is coupled to the control node of the third transistor and the second node of the third voltage source is coupled to the second terminal of the third magnetoresistance element. The electronic circuit is operable to generate a third current signal at the second current passing node of the third transistor related to a resistance value of the third magnetoresistance element. The electronic circuit further includes a fourth magnetoresistance element having first and second terminals and a fourth transistor having a control node, a first current passing node, and a second current passing node. The electronic circuit further includes a fourth voltage source having first and second nodes between which a fourth voltage is generated. The electronic circuit further includes a second load coupled to the second current passing node of the third transistor. The second current passing node of the third transistor is coupled to the second current passing node of the fourth transistor. The first terminal of the fourth magnetoresistance element is coupled to the first current passing node of the fourth transistor. The first node of the fourth voltage source is coupled to the control node of the fourth transistor and the second node of the fourth voltage source is coupled to the second terminal of the fourth magnetoresistance element. The electronic circuit is operable to generate a fourth current signal at the second current passing node of the fourth transistor related to a resistance value of the fourth magnetoresistance element, wherein a current passing through the second load is equal to a difference between the third current signal and the fourth current signal.

BRIEF DESCRIPTION OF THE DRAWINGS

The foregoing features of the invention, as well as the invention itself may be more fully understood from the following detailed description of the drawings, in which.

DETAILED DESCRIPTION

Figure 2:
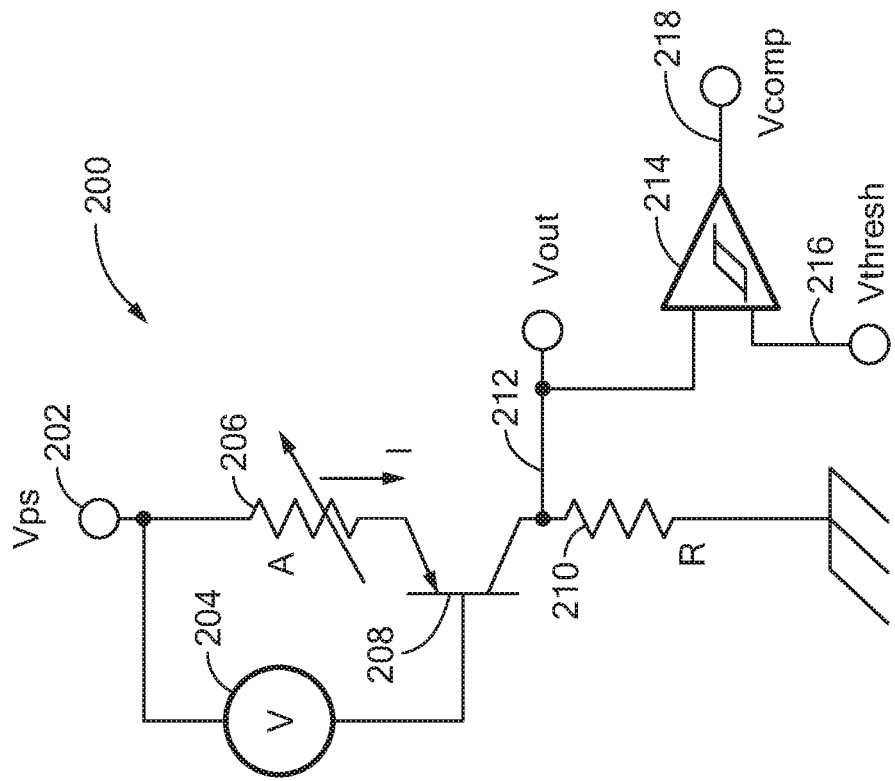
FIG. 2 is a schematic diagram of another example of an electronic circuit as may be used in another magnetic field sensor, and which has or is otherwise coupled to one magnetoresistance element.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe and electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions.

Both bipolar junction transistors (BJTs) (or more simply, bipolar transistors) and field effect transistors (FETs) are used in examples herein. It should be understood that, for a bipolar transistor, most of the current flowing through the bipolar transistor flows between a collector terminal and an emitter terminal. Similarly, it should be understood that, for a field effect transistor, most of the current flowing through the field effect transistor flows between a drain terminal and a source terminal. Therefore, for bipolar transistors, the collector terminal and the emitter terminal are both sometimes referred to herein as "current passing terminals." Similarly, for field effect transistors, the drain terminal and the source terminal are also both sometimes referred to herein as "current passing terminals."

It should be also understood that the current flowing through a bipolar transistor is controlled by a current at a base terminal. Similarly, it should be understood that the current flowing through a field effect transistor is controlled by a voltage at a gate terminal. Thus, for bipolar transistors, the base terminal is sometimes referred to herein as a "control terminal." Similarly, for field effect transistors, the gate terminal is sometimes also referred to herein as a "control terminal."

Both current sources and current sinks are described herein. As used herein, the term "current generator" is used to describe either a current source or a current sink.

Figure 1:
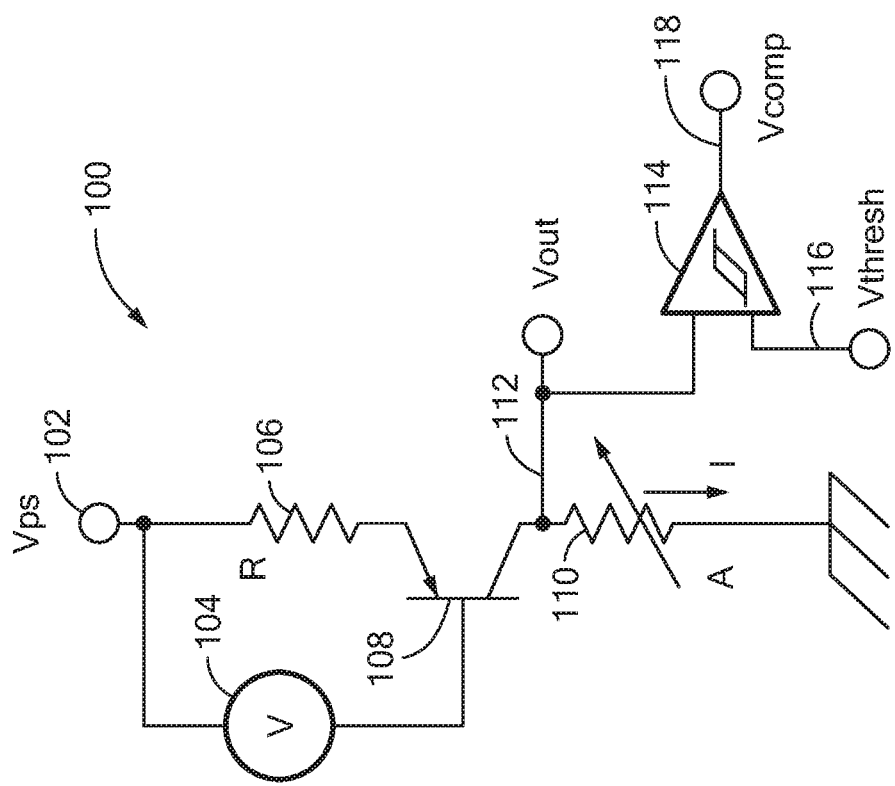
FIG. 1 is a schematic diagram of an example of an electronic circuit as may be used in a magnetic field sensor, and which has or is otherwise coupled to one magnetoresistance element.

Referring to FIG. 1, an example of an electronic circuit 100 can be used in a magnetic field sensor. The electronic circuit 100 can include a fixed resistor 106 having first and second terminals, wherein the first terminal of the resistor 106 is coupled to receive a voltage 102 and the second terminal of the resistor 106 is coupled to an emitter of a PNP bipolar transistor 108.

The electronic circuit 100 can include a voltage source 104 having first and second terminals, wherein the first terminal of the voltage source 104 is coupled to receive the voltage 102 and the second terminal of the voltage source 104 is coupled to a base of the PNP bipolar transistor 108.

The electronic circuit 100 can also include a magnetoresistance element 110 having first and second terminals, wherein the first terminal of the magnetoresistance element 110 is coupled to a collector of the PNP bipolar transistor 108 and the second terminal of the magnetoresistance element 110 is coupled to a voltage reference, for example, a ground voltage.

An output voltage 112 can be generated at the collector of the PNP bipolar transistor 108.

In some embodiments, the electronic circuit 100 can include a comparator 114 having first and second input terminals, wherein a first input terminal of the comparator 114 is coupled to the collector of the PNP bipolar transistor 108 and the second input terminal of the comparator 114 is coupled to receive a threshold voltage 116. The comparator 114 can be configured to generate a comparison signal 118. The comparison signal 118 can have two states.

It will be understood that, for embodiments here and below that use a comparator, the associated electronic circuits form an electronic switch, wherein a state of the comparison signal 118 is determined by a strength of a magnetic field experienced by the magnetoresistance element 110. It should also be understood that embodiments shown below that are not shown to include a comparator can be adapted to use a comparator to provide an electronic switch.

It should be appreciated that the voltage source 104, the resistor 106, and the PNP bipolar transistor 108 form a current source operable to provide a fixed current, I, to the magnetoresistance element 110. Thus, the output voltage 112 is generated according to the following relationships. In this and in all equations that follow in conjunction with other figures below, a base current of bipolar transistors is relatively small and is disregarded.

$$V\text{out}=I \times A=(V-Vbe)/R \times A \qquad (1)$$

where:
V=voltage of voltage source 204
R=resistance of resistor 106
A=resistance of the magnetoresistance element 110
Vbe=base emitter voltage of PNP bipolar transistor 108=approx. 0.7 volts In the electronic circuit 100, it should be appreciated that the same current, I. flows through the PNP bipolar transistor 108 and through the magnetoresistance element 110.

Referring now to FIG. 2, another example of an electronic circuit 200 can be used in another magnetic field sensor. The electronic circuit 200 can include a magnetoresistance element 206 having first and second terminals, wherein the first terminal of the magnetoresistance element 206 is coupled to receive a voltage 202 and the second terminal of the magnetoresistance element 206 is coupled to an emitter of a PNP bipolar transistor 208.

The electronic circuit 200 can include a voltage source 204 having first and second terminals, wherein the first terminal of the voltage source 204 is coupled to receive the voltage 202 and the second terminal of the voltage source 104 is coupled to a base of the PNP bipolar transistor 208.

The electronic circuit 200 can include a resistor 210 having first and second terminals, wherein the first terminal of the resistor 210 is coupled to a collector of the PNP bipolar transistor 208 and the second terminal of the resistor 210 is coupled to a voltage reference, for example, a ground voltage.

An output voltage 212 can be generated at the collector of the PNP bipolar transistor 208.

In some embodiments, the electronic circuit 200 can include a comparator 214 having first and second input terminals, wherein a first input terminal of the comparator 214 is coupled to the collector of the PNP bipolar transistor 208 and the second input terminal of the comparator 214 is coupled to receive a threshold voltage 216. The comparator 214 can be configured to generate a comparison signal 218.

It should be appreciated that the voltage source 204, the magnetoresistance element 206, and the PNP bipolar transistor 208 form a variable current source operable to provide a variable current, I, to the resistor 110. The variable current, I, varies in accordance with a variable resistance of the magnetoresistance element 206, which varies in accordance with a sensed magnetic field. Thus, the output voltage 112 is generated according to the following:

$$V\text{out}=I \times R=(V-Vbe)/A \times R \qquad (2)$$

where:
V=voltage of voltage source 204
R=resistance of resistor 210
A=resistance of the magnetoresistance element 206
Vbe=base emitter voltage of PNP bipolar transistor 208=approx. 0.7 volts In the electronic circuit 200, it should be appreciated that the same current, I, flows through the PNP bipolar transistor 208 and through the magnetoresistance element 206.

Figure 3:
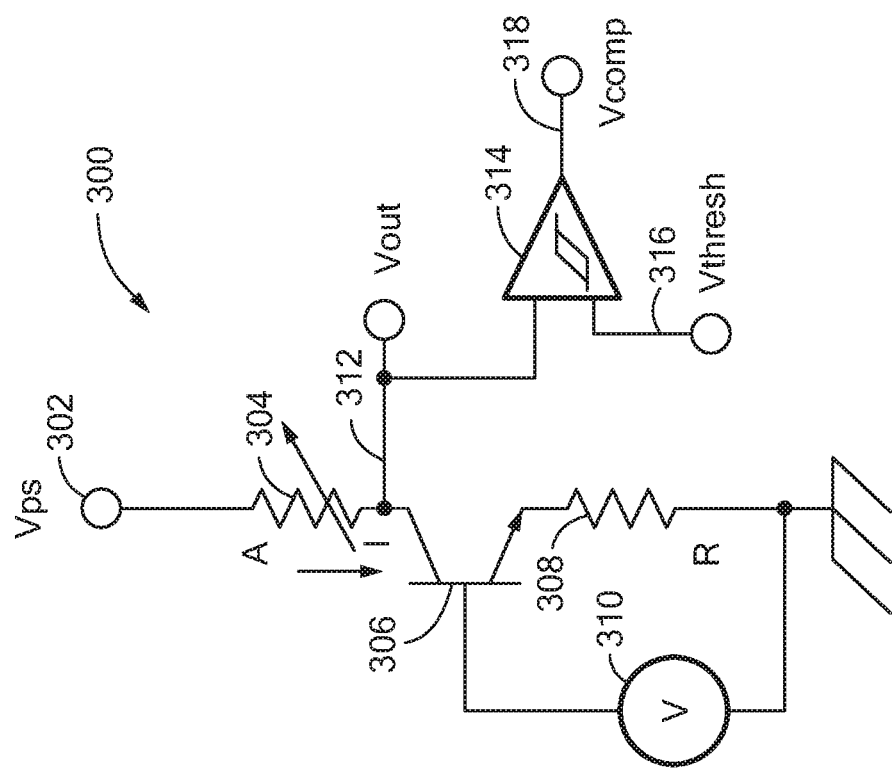
FIG. 3 is a schematic diagram of another example of an electronic circuit as may be used in another magnetic field sensor, and which has or is otherwise coupled to one magnetoresistance element.

Referring to FIG. 3, another example of an electronic circuit 300 can be used in another magnetic field sensor. The electronic circuit 300 can include a magnetoresistance element 304 having first and second terminals, wherein the first terminal of the magnetoresistance element 304 is coupled to receive a voltage 302 and the second terminal of the magnetoresistance element 304 is coupled to a collector of an NPN bipolar transistor 306.

The electronic circuit 300 can include a resistor 308 having first and second terminals, wherein the first terminal of the resistor 308 is coupled to an emitter of the NPN bipolar transistor 306 and the second terminal of the resistor 308 is coupled to a reference voltage, for example, a ground reference voltage.

The electronic circuit 300 can include a voltage source 310 having first and second terminals, wherein the first terminal of the voltage source 310 is coupled to a base of the NPN bipolar transistor 306 and the second terminal of the voltage source 310 is coupled to the second terminal of the resistor 308.

An output voltage 312 can be generated at the collector of the NPN bipolar transistor 306.

In some embodiments, the electronic circuit 300 can include a comparator 314 having first and second input terminals, wherein a first input terminal of the comparator 314 is coupled to the collector of the NPN bipolar transistor 306 and the second input terminal of the comparator 314 is coupled to receive a threshold voltage 316. The comparator 314 can be configured to generate a comparison signal 318.

It should be appreciated that the voltage source 310, the resistor 308, and the NPN bipolar transistor 306 form a current sink operable to provide a fixed current, I, to the magnetoresistance element 304. Thus, the output voltage 312 is generated according to the following:

$$V\text{out}=I \times A=(V-Vbe)/R \times A \qquad (3)$$

where:
V=voltage of voltage source 310
R=resistance of resistor 308
A=resistance of the magnetoresistance element 304
Vbe=base emitter voltage of NPN bipolar transistor 306=approx. 0.7 volts In the electronic circuit 300, it should be appreciated that the same current, I. flows through the NPN bipolar transistor 306 and through the magnetoresistance element 304.

Figure 4:
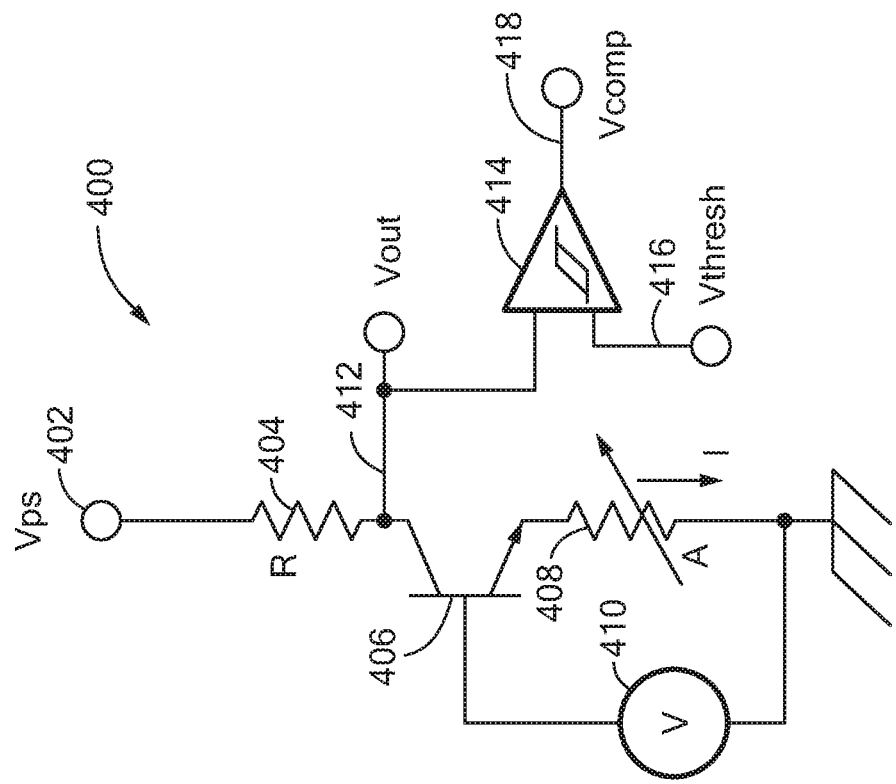
FIG. 4 is a schematic diagram of another example of an electronic circuit as may be used in another magnetic field sensor, and which has or is otherwise coupled to one magnetoresistance element.

Referring now to FIG. 4, another example of an electronic circuit 400 can be used in another magnetic field sensor. The electronic circuit 400 can include a resistor 404 having first and second terminals, wherein the first terminal of the resistor 404 is coupled to receive a voltage 402 and the second terminal of the resistor 404 is coupled to a collector of an NPN bipolar transistor 406.

The electronic circuit 400 can include a magnetoresistance element 408 having first and second terminals, wherein the first terminal of the magnetoresistance element 408 is coupled to an emitter of the NPN bipolar transistor 406 and the second terminal of the magnetoresistance element 408 is coupled to a reference voltage, for example, a ground reference voltage.

The electronic circuit 400 can include a voltage source 410 having first and second terminals, wherein the first terminal of the voltage source 410 is coupled to a base of the NPN bipolar transistor 408 and the second terminal of the voltage source 410 is coupled to the second terminal of the magnetoresistance element 408

An output voltage 412 can be generated at the collector of the NPN bipolar transistor 406.

In some embodiments, the electronic circuit 400 can include a comparator 414 having first and second input terminals, wherein a first input terminal of the comparator 414 is coupled to the collector of the NPN bipolar transistor 406 and the second input terminal of the comparator 414 is coupled to receive a threshold voltage 416. The comparator 414 can be configured to generate a comparison signal 418.

It should be appreciated that the voltage source 410, the magnetoresistance element 408, and the NPN bipolar transistor 406 form a variable current sink operable to provide a variable current, I, to the resistor 404. The variable current, I, varies in accordance with a variable resistance of the magnetoresistance element 408, which varies in accordance with a sensed magnetic field. Thus, the output voltage 412 is generated according to the following:

$$Vout = I \times R = (V - Vbe)/A \times R \quad (4)$$

where:
V=voltage of voltage source 410
R=resistance of resistor 404
A=resistance of the magnetoresistance element 408
Vbe=base emitter voltage of PNP bipolar transistor 406=approx. 0.7 volts In the electronic circuit 400, it should be appreciated that the same current, I. flows through the NPN bipolar transistor 406 and through the magnetoresistance element 408.

Figure 5:
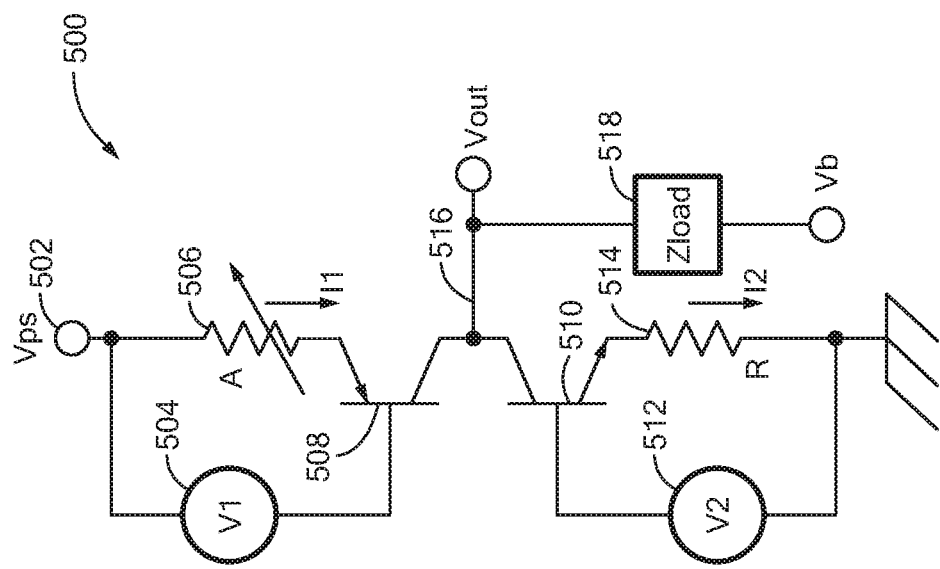
FIG. 5 is a schematic diagram of another example of an electronic circuit as may be used in another magnetic field sensor, and which has or is otherwise coupled to one magnetoresistance element.

Referring now to FIG. 5, another example of an electronic circuit 500 can be used in another magnetic field sensor. The electronic circuit 500 can include a magnetoresistance element 506 having first and second terminals, wherein the first terminal of the magnetoresistance element 506 is coupled to receive a voltage 502 and the second terminal of the magnetoresistance element 506 is coupled to an emitter of a PNP bipolar transistor 508.

The electronic circuit 500 can include a voltage source 504 having first and second terminals, wherein the first terminal of the voltage source 504 is coupled to receive the voltage 502 and the second terminal of the voltage source 504 is coupled to a base of the PNP bipolar transistor 508.

The electronic circuit 500 can include a resistor 514 having first and second terminals, wherein the first terminal of the resistor 514 is coupled to an emitter of an NPN bipolar transistor 510 and the second terminal of the resistor 514 is coupled to a voltage reference, for example, a ground voltage.

The electronic circuit 500 can include another voltage source 512 having first and second terminals, wherein the first terminal of the voltage source 512 is coupled a base of the NPN bipolar transistor 510 and the second terminal of the voltage source 512 is coupled to the second terminal of the resistor 514.

A collector of the PNP bipolar transistor 508 can be coupled to a collector of the NPN bipolar transistor 510 at a junction node.

A load 518, which can be a resistive or a complex load, can be coupled between the junction node and a bias voltage, Vb. Current can flow into and/or out of the load 518.

The load 518 is labeled Zload. The nomenclature, Zload, used here and in figures below is not intended to limit the load 518 or loads discussed below to one or more passive electronic components. Instead, the load 518 and loads discussed below can be comprised of passive electronic components, active electronic components, or both.

An output voltage 516 can be generated at the collector of the PNP bipolar transistor 508 (i.e., at the junction node).

In some embodiments, the electronic circuit 500 can include a comparator coupled to the junction node that is the same as or similar to the comparators shown above in conjunction with FIGS. 1-4.

It should be appreciated that the voltage source 504, the magnetoresistance element 506, and the PNP bipolar transistor 508 form a variable current source operable to provide a variable current, I1. The variable current, I1, varies in accordance with a variable resistance of the magnetoresistance element 506, which varies in accordance with a sensed magnetic field. It should be appreciated that the voltage source 512, the resistor 514, and the NPN bipolar transistor 510 form a current sink operable to provide a fixed current, I2. Thus, the output voltage 516 is generated according to the following:

$$Vout = Vb + [(I1 - I2) = Zload]$$

$$I1 = (V1 - Vbe)/A$$

$$I2 = (V2 - Vbe)/R$$

$$I1 - I2 = (V1 - Vbe)/A - (V2 - Vbe)/R$$

$$Vout = Vb + [[(V1 - Vbe)/A - (V2 - Vbe)/R] \times Zload] \quad (5)$$

where:
V1=voltage of voltage source 504
V2=voltage of voltage source 512
R=resistance of resistor 514
A=resistance of the magnetoresistance element 506
Vb=bias voltage
Vbe=base emitter voltage of PNP bipolar transistor 508 and of NPN bipolar transistor 510=approx. 0.7 volts It should be understood that the load 518 can be made to have a high impedance to achieve a gain not obtained with the electronic circuits of FIGS. 1-4 described above.

In the electronic circuit 500, it should be appreciated that the same current, I1, flows through the PNP bipolar transistor 508 and through the magnetoresistance element 506.

Figure 6:
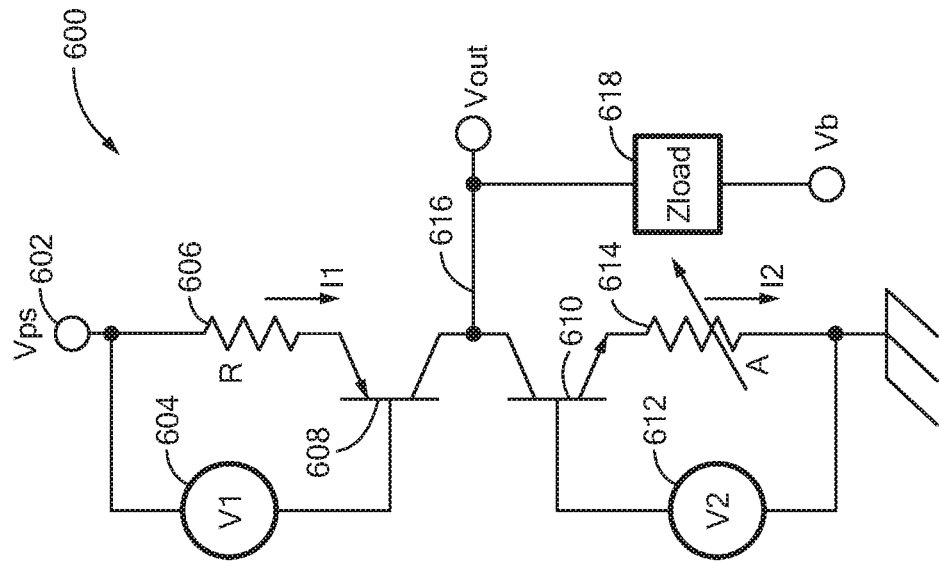
FIG. 6 is a schematic diagram of an example of another electronic circuit as may be used in another magnetic field sensor, and which has or is otherwise coupled to one magnetoresistance element.

Referring now to FIG. 6, another example of an electronic circuit 600 can be used in another magnetic field sensor. The electronic circuit 600 can include a resistor 606 having first and second terminals, wherein the first terminal of the resistor 606 is coupled to receive a voltage 602 and the second terminal of the resistor 606 is coupled to an emitter of a PNP bipolar transistor 608.

The electronic circuit 600 can include a voltage source 604 having first and second terminals, wherein the first terminal of the voltage source 604 is coupled to receive the voltage 602 and the second terminal of the voltage source 604 is coupled to a base of the PNP bipolar transistor 608.

The electronic circuit 600 can include a magnetoresistance element 614 having first and second terminals, wherein the first terminal of the magnetoresistance element 614 is coupled to an emitter of an NPN bipolar transistor 610 and the second terminal of the magnetoresistance element 614 is coupled to a voltage reference, for example, a ground voltage.

The electronic circuit 600 can include another voltage source 612 having first and second terminals, wherein the first terminal of the voltage source 612 is coupled a base of the NPN bipolar transistor 610 and the second terminal of the voltage source 612 is coupled to the second terminal of the magnetoresistance element 614.

A collector of the PNP bipolar transistor 608 can be coupled to a collector of the NPN bipolar transistor 610 at a junction node.

A load 618, which can be a resistive or a complex load, can be coupled between the junction node and a bias voltage, Vb. Current can flow into and/or out of the load 618.

The load 618 is labeled Zload. The nomenclature, Zload, used here and in figures below is not intended to limit the load 618 or loads discussed below to one or more passive electronic components. Instead, the load 618 and loads discussed below can be comprised of passive electronic components, active electronic components, or both.

An output voltage 616 can be generated at the collector of the PNP bipolar transistor 608 (i.e., at the junction node).

In some embodiments, the electronic circuit 600 can include a comparator coupled to the junction node that is the same as or similar to the comparators shown above in conjunction with FIGS. 1-4. Other electronic circuits described below can also include a comparator, though not shown.

It should be appreciated that the voltage source 604, the resistor 606, and the PNP bipolar transistor 608 form a current source operable to provide a fixed current, I1. It should be appreciated that the voltage source 612, the magnetoresistance element 614, and the NPN bipolar transistor 610 form a variable current sink operable to provide a variable current, I2.

The variable current, I2, varies in accordance with a variable resistance of the magnetoresistance element 614, which varies in accordance with a sensed magnetic field. Thus, the output voltage 616 is generated according to the following:

$$Vout=Vb+[(I1+I2) \times Zload]$$

$$I1=(V1-Vbe)/R$$

$$I2=(V2-Vbe)/A$$

$$I1-I2=(V1-Vbe)/R-(V2-Vbe)/A$$

$$Vout=Vb+[[(V1-Vbe)/R-(V2-Vbe)/A] \times Zload] \quad (6)$$

where:
V1=voltage of voltage source 604
V2=voltage of voltage source 612
R=resistance of resistor 606
A=resistance of the magnetoresistance element 614
Vb=bias voltage
Vbe=base emitter voltage of PNP bipolar transistor 608 and of NPN bipolar transistor 610=approx. 0.7 volts It should be understood that the load 618 can be made to have a high impedance to achieve a gain not obtained with the electronic circuits of FIGS. 1-4 described above.

In the electronic circuit 600, it should be appreciated that the same current, I2, flows through the NPN bipolar transistor 610 and through the magnetoresistance element 614.

Figure 7:
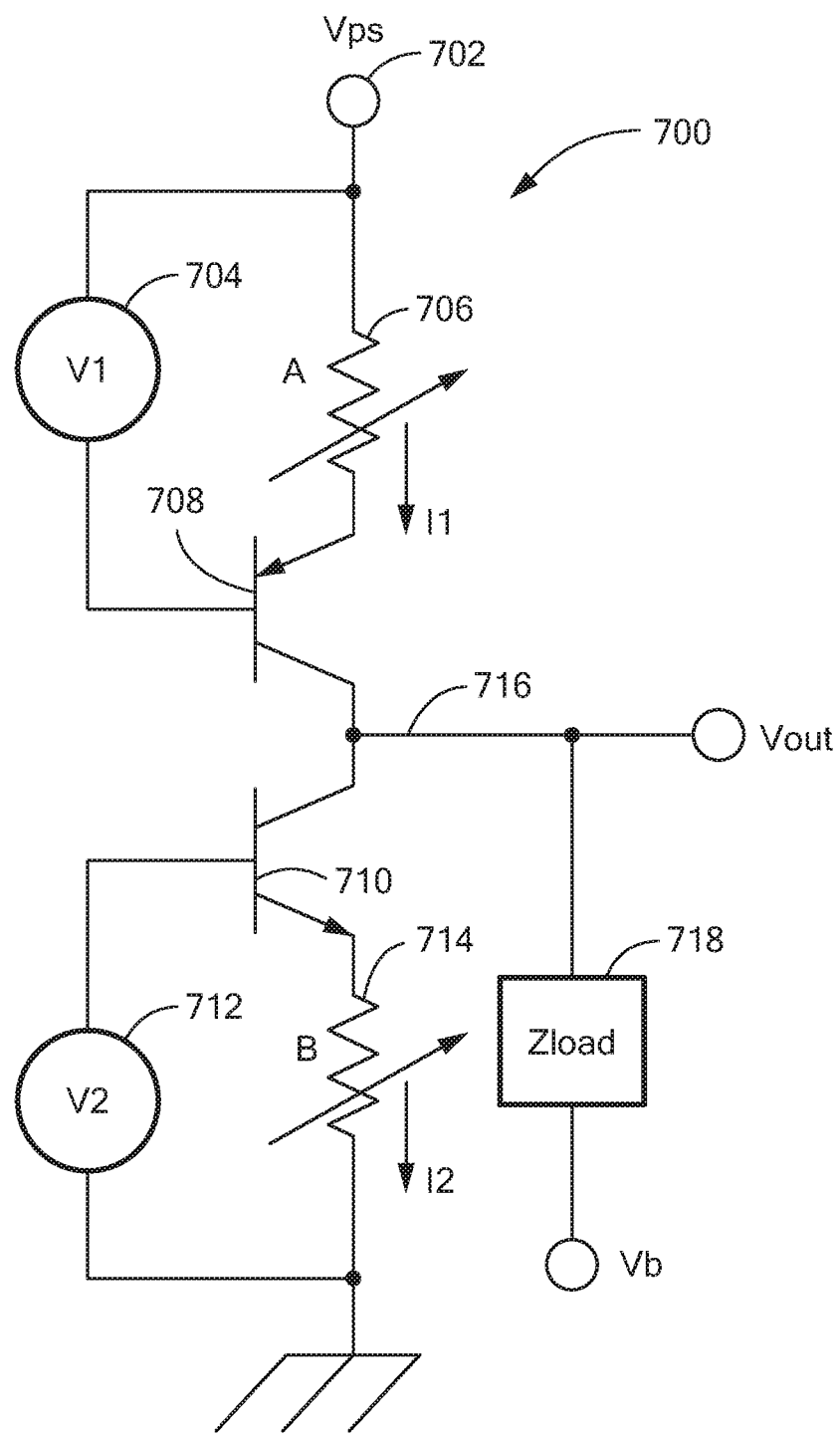
FIG. 7 is a schematic diagram of an example of another electronic circuit as may be used in another magnetic field sensor, and which has or is otherwise coupled to two magnetoresistance elements.

Referring now to FIG. 7, another example of an electronic circuit 700 can be used in another magnetic field sensor. The electronic circuit 700 can include a magnetoresistance element 706 having first and second terminals, wherein the first terminal of the magnetoresistance element 706 is coupled to receive a voltage 702 and the second terminal of the magnetoresistance element 706 is coupled to an emitter of a PNP bipolar transistor 708.

The electronic circuit 700 can include a voltage source 704 having first and second terminals, wherein the first terminal of the voltage source 704 is coupled to receive the voltage 702 and the second terminal of the voltage source 704 is coupled to a base of the PNP bipolar transistor 708.

The electronic circuit 700 can include another magnetoresistance element 714 having first and second terminals, wherein the first terminal of the magnetoresistance element 714 is coupled to an emitter of an NPN bipolar transistor 710 and the second terminal of the magnetoresistance element 714 is coupled to a voltage reference, for example, a ground voltage.

The electronic circuit 700 can include another voltage source 712 having first and second terminals, wherein the first terminal of the voltage source 712 is coupled a base of the NPN bipolar transistor 710 and the second terminal of the voltage source 712 is coupled to the second terminal of the magnetoresistance element 714.

A collector of the PNP bipolar transistor 708 can be coupled to a collector of the NPN bipolar transistor 710 at a junction node.

A load 718, which can be a resistive or a complex load, can be coupled between the junction node and a bias voltage, Vb. Current can flow into and/or out of the load 718.

The load 718 is labeled Zload. The nomenclature, Zload, used here and in figures below is not intended to limit the load 718 or loads discussed below to one or more passive electronic components. Instead, the load 718 and loads discussed below can be comprised of passive electronic components, active electronic components, or both.

An output voltage 716 can be generated at the collector of the PNP bipolar transistor 708 (i.e., at the junction node).

In some embodiments, the electronic circuit 700 can include a comparator coupled to the junction node that is the same as or similar to the comparators shown above in conjunction with FIGS. 1-4. Other electronic circuits described below can also include a comparator, though not shown or described below.

It should be appreciated that the voltage source 704, the magnetoresistance element 706, and the PNP bipolar transistor 708 form a variable current source operable to provide a variable current, I1. The variable current, I1, varies in accordance with a variable resistance of the magnetoresistance element 706, which varies in accordance with a sensed magnetic field. It should be appreciated that the voltage source 712, the magnetoresistance element 714, and the NPN bipolar transistor 710 form a variable current sink operable to provide a variable current, I2. The variable current, I2, varies in accordance with a variable resistance of the magnetoresistance element 714, which varies in accordance with a sensed magnetic field. Thus, the output voltage 716 is generated according to the following:

$$V_{out}=V_b+[(I1+I2)\times Z_{load}]$$

$$I1=(V1-V_{be})/A$$

$$I2=(V2-V_{be})/B$$

$$I1-I2=(V1-V_{be})/R-(V2-V_{be})/A$$

$$V_{out}=V_b+[[(V1-V_{be})/A-(V2-V_{be})/B]\times Z_{load}] \quad (7)$$

where:
- V1=voltage of voltage source 704
- V2=voltage of voltage source 712
- A=resistance of magnetoresistance element 706
- B=resistance of the magnetoresistance element 714
- Vb=bias voltage
- Vbe=base emitter voltage of PNP bipolar transistor 706 and of NPN bipolar transistor 710=approx. 0.7 volts It should be understood that the load 718 can be made to have a high impedance to achieve a gain not obtained with the electronic circuits of FIGS. 1-4 described above.

In the electronic circuit 700, noises of the two magnetoresistance elements 706, 714 add incoherently to result in the square root of two times the noise of one magnetoresistance element. However, signals resulting from resistance changes of the two magnetoresistance elements 706, 714 add coherently to result in an output signal 716 two times a signal that would result from one magnetoresistance element, for example, as provided by the electronic circuits of FIGS. 1-6. Thus, a signal to noise ratio improvement is obtained. Similar improvements in signal to noise ratio can be obtained for similar reasons with circuits described below.

In the electronic circuit 700, it should be appreciated that the same current, I1, flows through the PNP bipolar transistor 708 and through the magnetoresistance element 706. Also, the same current, I2, flows through the NPN bipolar transistor 710 and through the magnetoresistance element 714.

Figure 8:
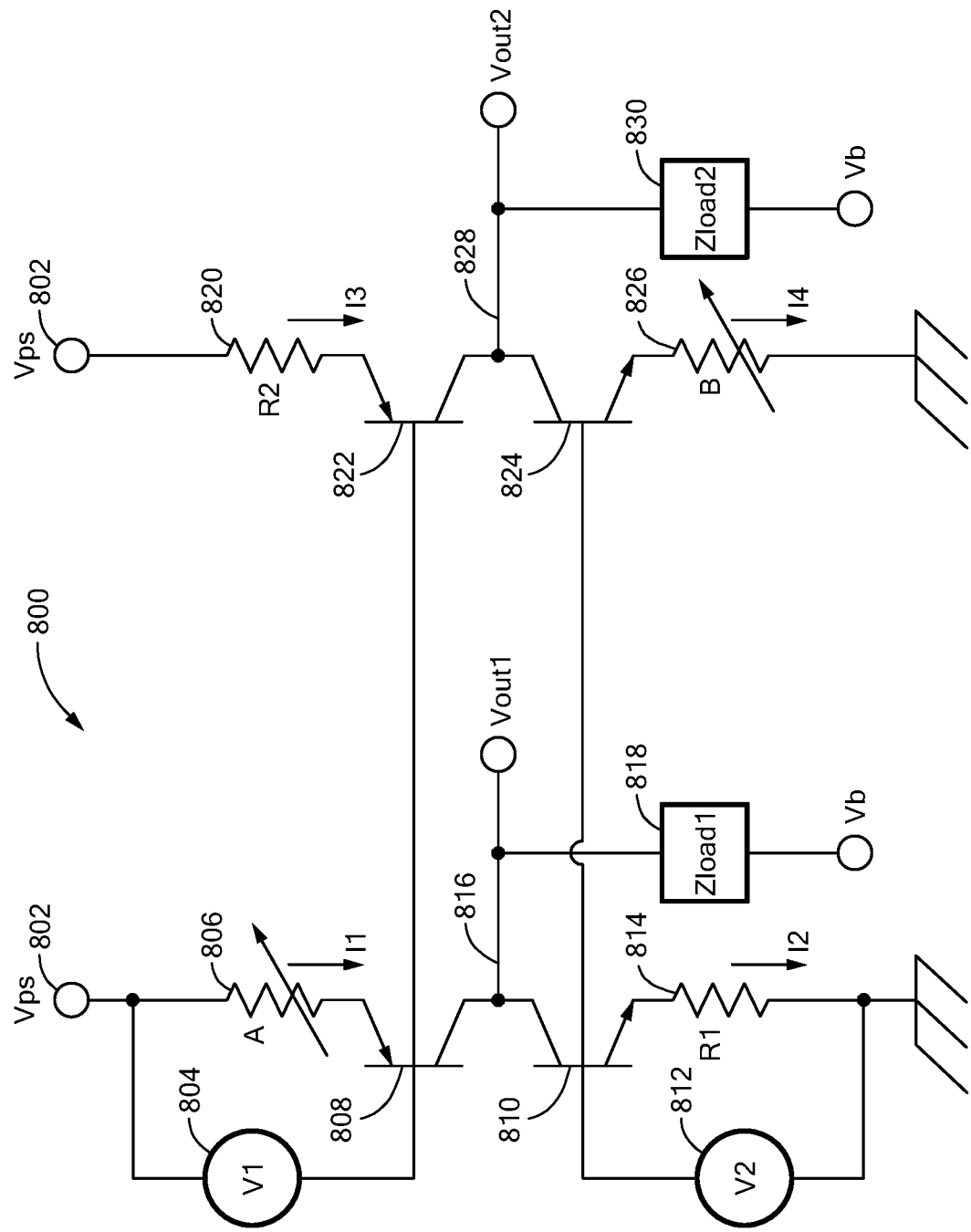
FIG. 8 is a schematic diagram of an example of another electronic circuit as may be used in another magnetic field sensor, and which has or is otherwise coupled to two magnetoresistance elements.

Referring now to FIG. 8, another example of an electronic circuit 800 can be used in another magnetic field sensor. The electronic circuit 800 can include a magnetoresistance element 806 having first and second terminals, wherein the first terminal of the magnetoresistance element 806 is coupled to receive a voltage 802 and the second terminal of the magnetoresistance element 806 is coupled to an emitter of a PNP bipolar transistor 808.

The electronic circuit 800 can include a voltage source 804 having first and second terminals, wherein the first terminal of the voltage source 804 is coupled to receive the voltage 802 and the second terminal of the voltage source 804 is coupled to a base of the PNP bipolar transistor 808.

The electronic circuit 800 can include a resistor 814 having first and second terminals, wherein the first terminal of the resistor 814 is coupled to an emitter of an NPN bipolar transistor 810 and the second terminal of the resistor 814 is coupled to a voltage reference, for example, a ground voltage.

The electronic circuit 800 can include another voltage source 812 having first and second terminals, wherein the first terminal of the voltage source 812 is coupled a base of the NPN bipolar transistor 810 and the second terminal of the voltage source 812 is coupled to the second terminal of the resistor 814.

A collector of the PNP bipolar transistor 808 can be coupled to a collector of the NPN bipolar transistor 810 at a junction node.

A load 818, which can be a resistive or a complex load, can be coupled between the junction node and the second terminal of the resistor 814.

An output voltage 816 can be generated at the collector of the PNP bipolar transistor 808 (i.e., at the junction node).

It should be appreciated that the voltage source 804, the magnetoresistance element 806, and the PNP bipolar transistor 808 form a variable current source operable to provide a variable current, I1. The variable current, I1, varies in accordance with a variable resistance of the magnetoresistance element 806, which varies in accordance with a sensed magnetic field. It should be appreciated that the voltage source 812, the resistor 814, and the NPN bipolar transistor 810 form a current sink operable to provide a fixed current, I2. Thus, the output voltage 816 is generated according to the following:

$$V_{out1}=V_b+[(I1+I2)\times Z_{load1}]$$

$$I1=(V1-V_{be})/A$$

$$I2=(V2-V_{be})/R1$$

$$I1-I2=(V1-V_{be})/A-(V2-V_{be})/R1$$

$$V_{out1}=V_b+[[(V1-V_{be})/A-(V2-V_{be})/R1]\times Z_{load1}] \quad (8)$$

where:
- Zload1=impedance of load 818
- Vout1=voltage 816
- V1=voltage of voltage source 804
- V2=voltage of voltage source 812
- R1=resistance of resistor 814
- A=resistance of the magnetoresistance element 806
- Vb=bias voltage
- Vbe=base emitter voltage of PNP bipolar transistor 808 and of NPN bipolar transistor 810=approx. 0.7 volts In the electronic circuit 800, it should be appreciated that the same current, I1 flows through the PNP bipolar transistor 808 and through the magnetoresistance element 806.

The electronic circuit 800 can also include a resistor 820 having first and second terminals, wherein the first terminal of the resistor 820 is coupled to receive the voltage 802 and the second terminal of the resistor 820 is coupled to an emitter of a PNP bipolar transistor 822.

The second terminal of the voltage source 804 can be coupled to a base of the PNP bipolar transistor 822.

The electronic circuit 800 can include a magnetoresistance element 826 having first and second terminals, wherein the first terminal of the magnetoresistance element 826 is coupled to an emitter of an NPN bipolar transistor 824 and the second terminal of the magnetoresistance element 826 is coupled to a voltage reference, for example, a ground voltage.

The first terminal of the voltage source 812 is coupled a base of the NPN bipolar transistor 824.

A collector of the PNP bipolar transistor 822 can be coupled to a collector of the NPN bipolar transistor 824 at a junction node.

A load 830, which can be a resistive or a complex load, can be coupled between the junction node and the second terminal of the magnetoresistance element 826.

An output voltage 828 can be generated at the collector of the PNP bipolar transistor 822 (i.e., at the junction node).

It should be appreciated that the voltage source 804, the resistor 820, and the PNP bipolar transistor 822 form a current source operable to provide a fixed current, I3. It should be appreciated that the voltage source 812, the magnetoresistance element 826, and the NPN bipolar transistor 824 form a variable current sink operable to provide a variable current, I4.

The variable current, I4, varies in accordance with a variable resistance of the magnetoresistance element 826, which varies in accordance with a sensed magnetic field. Thus, the output voltage 828 is generated according to the following:

$$Vout2=Vb+[(I3+I4)\times Zload2]$$

$$I3=(V1-Vbe)/R2$$

$$I4=(V2-Vbe)/B$$

$$I3-I4=(V1-Vbe)/R2-(V2-Vbe)/B$$

$$Vout2=Vb+[[(V1-Vbe)/R2-(V2-Vbe)/B]\times Zload2] \quad (9)$$

where:
Zload2=impedance of load 830
Vout2=voltage 828
V1=voltage of voltage source 804
V2=voltage of voltage source 812
R2=resistance of resistor 820
B=resistance of the magnetoresistance element 826
Vb=bias voltage
Vbe=base emitter voltage of PNP bipolar transistor 822 and of NPN bipolar transistor 824=approx. 0.7 volts In the electronic circuit 800, it should be appreciated that the same current, I4, flows through the NPN bipolar transistor 824 and through the magnetoresistance element 826.

For the electronic circuit 800, the output voltages 816, 828 can be taken individually (i.e., each can be a single ended signal). In other embodiments, the electronic circuit 800 provides a differential signal, Vdiff=voltage 816−voltage 828=Vout1−Vout2.

It should be understood that the loads 818, 830 can be made to have high impedances to achieve single ended gains not obtained with the electronic circuits of FIGS. 1-4 described above. Furthermore, the above described differential signal has an amplitude that is double the amplitude of the single ended signals.

Figure 9:
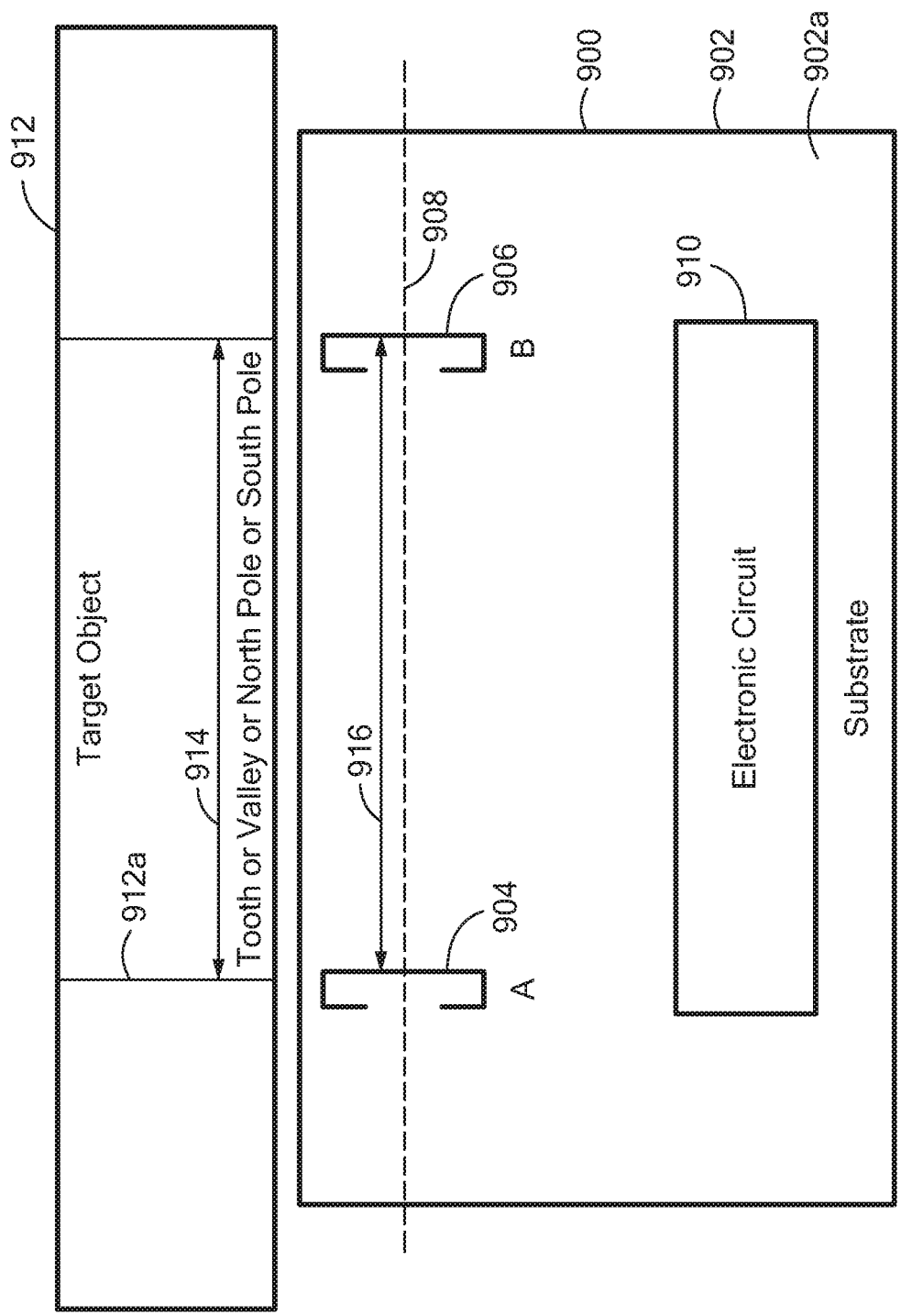
FIG. 9 is a block diagram of a magnetic field sensor having a substrate with two magnetoresistance elements disposed thereon, the substrate disposed proximate to a ferromagnetic target object having ferromagnetic target object features.

Referring now to FIG. 9, a magnetic field sensor 900 can include a substrate 902 having a surface 902a, which is one of two parallel major surfaces of the substrate 902.

Two magnetoresistance elements 904, 906 (also referred to herein as magnetoresistance elements A and B) can be disposed upon the surface 902a along an axis 908. The two magnetoresistance elements 904, 906 (A, B) can be part of or coupled to an electronic circuit 910, which is also disposed upon or within the surface 902a of the substrate 902. The two magnetoresistance elements 904, 906 (A, B) can be the same as or similar to the magnetic field sensing elements 706, 714 of FIG. 7 and the two magnetoresistance element 806, 812 of FIG. 3-8. The designations A, B can also be found in FIGS. 7 and 8 to represent resistance values.

Magnetoresistance elements, e.g., 904, 906 (A, B), are shown in all embodiments herein to be in the form of so-called "yokes," which have a C-shape (or a reverse C-shape). In some embodiments, the yokes can have longest yoke axes substantially perpendicular to the axis 908. Advantages of yoke shapes are known. It will be understood that other magnetoresistance elements used in embodiments herein can have other shapes, for example, lines, polylines, or rectangles.

Maximum response axes of the magnetoresistance elements 904, 906 (A, B) can be parallel to and along the axis 908 and in the same direction. It should be understood that the magnetoresistance elements 904, 906 (A, B) having maximum response axes parallel to the axis 908 are also responsive to magnetic fields at other angles in the plane of the substrate 902 (and also out of the plane of the substrate 902). The degree to which the magnetoresistance elements 904, 906 (A, B) are responsive to magnetic fields at other angles not parallel to the axis 908 (and not perpendicular to the longest yoke axes) is determined by a magnitude of a geometric projection of the magnetic field at the other angle onto the axis 908. Thus, the term "projected magnetic field" is used below to describe this projection.

In some other embodiments, where the yoke shapes of the magnetoresistance elements 904, 906 may be rotated so that the longest yokes axes are not perpendicular to the axis 908, the degree to which the magnetoresistance elements 904, 906 (A, B) are responsive to magnetic fields at other angles not parallel to the axis 908 is determined by a magnitude of a geometric projection of the magnetic field at the other angle onto an axis that is perpendicular to the longest axes of the yoke shapes. This is also referred to herein as a projected magnetic field.

The magnetic field sensor 900 is responsive to movement of a ferromagnetic target object 912 having features, e.g., 912a, with width 914. For back-biased arrangements in which the magnetic field sensor 900 also includes a magnet (not shown), the ferromagnetic target 912 object can be, for example, a gear having gear teeth, in which case, the feature 912a of the gear can be one of a plurality of gear teeth or one of a plurality of gear valleys. In other arrangements, the ferromagnetic target object 912 can be a multi-pole ring magnet having alternating north and south poles, in which case, the feature 912a can be one of a plurality of magnetic poles, for example, a north pole or a south pole.

In some embodiments, the two magnetoresistance elements 904, 906 (A, B) have a separation 916 between about one half and about one and one half of the width 914 of the target feature 912a, for example, a gear tooth of a ferromagnetic gear or a magnetic domain of a ferromagnetic ring magnet. In some other embodiments, the two magnetoresistance elements 904, 906 (A, B) have a separation 916 between about one half and about twice the width 914 of the target feature 912a. However, in other embodiments, the separation 916 is much smaller than half of the width 914, for example, one one hundredth of the width 914, or larger than twice the width 914.

In some embodiments, the separation 916 is about equal to the width 914 of the target feature 912a, for example, a gear tooth of a ferromagnetic gear or a magnetic domain of a ferromagnetic ring magnet.

In operation, the two magnetoresistance elements 904, 906 (A, B) can generate two output signals. FIGS. 7 and 8 above are representative of ways in which the two magnetic field sensing elements 904, 906 can generate two output signals. In FIGS. 7 and 8, the designation A and B are indicative of resistances and are also indicative of physical placement in relation to FIG. 9.

Using as an example the target feature 912a with a width 914 equal to the spacing 916 between the two magnetoresistance elements 904, 906, when the target feature 912a is centered about (i.e., between) the two magnetoresistance elements 904, 906 (A, B), it can be shown that any magnetoresistance element(s) (e.g., 904 (A)) on one side of a center of the target feature 912a experience a projected magnetic field pointed in one direction along the axis 908, and any magnetoresistance element(s) (e.g., 906 (B)) on the other side of the center of the target feature 912a experience a projected magnetic field pointed in the other direction.

Therefore, when the target feature 912a is centered about the two magnetoresistance elements 904, 906, any magnetoresistance element(s) (e.g., 904 (A)) on one side of the center of the target feature 912a changes resistance in one direction, and any magnetoresistance element(s) (e.g., 906 (B)) on the other side of the center of the target feature 912a changes resistance in the other direction.

In contrast, when an edge of the target feature 912a is centered about (i.e., between) the two magnetoresistance elements 904, 906 (A, B), it can be shown that the two magnetoresistance elements 904, 906 (A, B) experience projected magnetic fields pointed in the same direction along the axis 908. Thus, resistances of both of the two magnetoresistance elements 904, 906 (A, B) change in the same direction.

In view of the above, it should be understood that the electronic circuit 700 of FIG. 7 can operate as a so-called "edge detector," generating a largest voltage 716 when the two magnetoresistance elements 706, 714 are on opposite sides of an edge of the feature 912a. Similarly, it should be understood that the electronic circuit 800 of FIG. 8 can operate as a so-called "feature detector," generating a largest differential signal Vout1−Vout2 when the two magnetoresistance elements 806, 826 are on opposite sides of a center of the feature 912a.

As described above, while a magnet is not shown, it should be understood that in some embodiments, the magnetic field sensor 900 can include a magnet.

Figure 10:
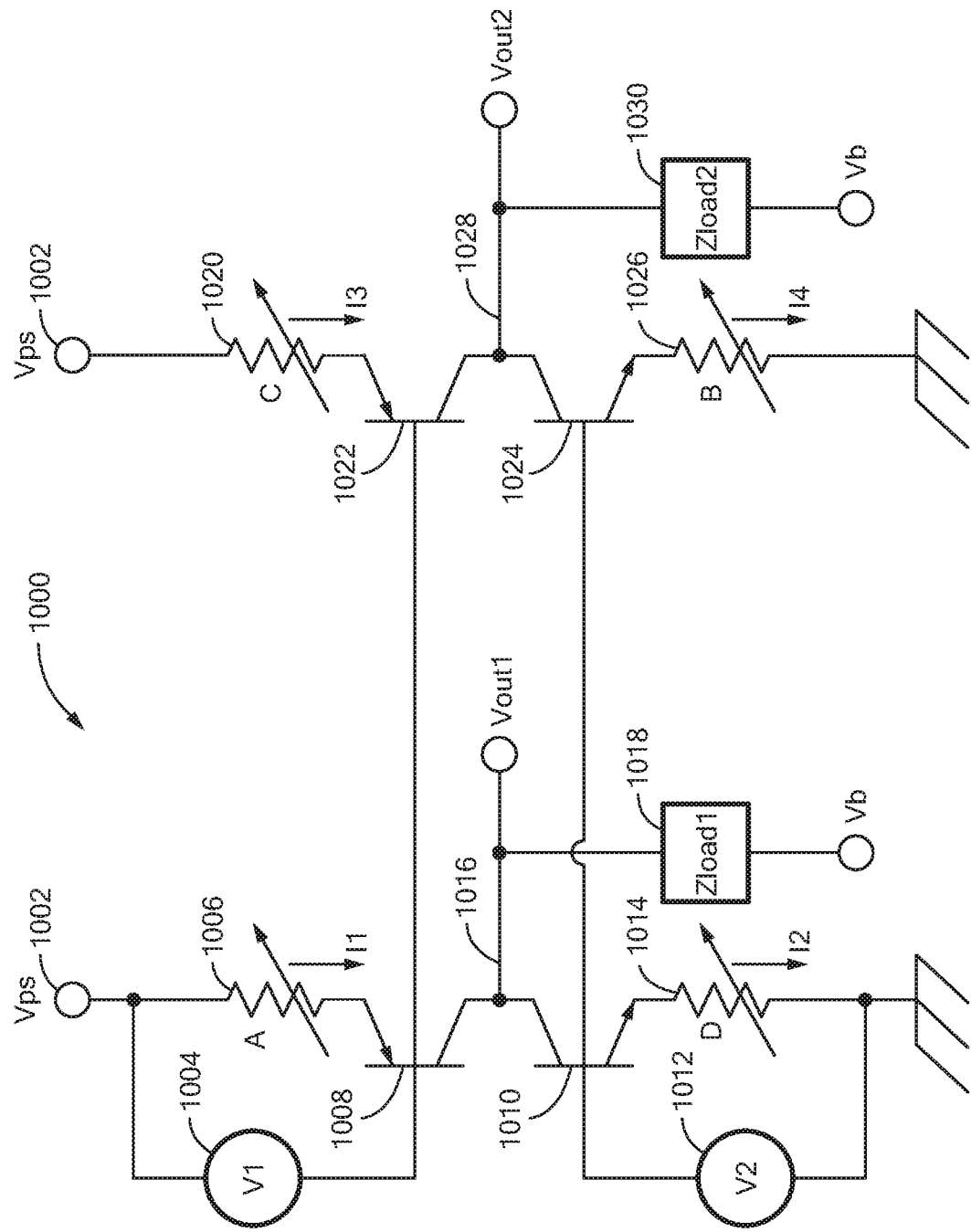
FIG. 10 is a schematic diagram of an example of another electronic circuit as may be used in another magnetic field sensor, and which has or is otherwise coupled to four magnetoresistance elements.

Referring now to FIG. 10, another example of an electronic circuit 1000 can be used in another magnetic field sensor. The electronic circuit 1000 can include a magnetoresistance element 1006 having first and second terminals, wherein the first terminal of the magnetoresistance element 1006 is coupled to receive a voltage 1002 and the second terminal of the magnetoresistance element 1006 is coupled to an emitter of a PNP bipolar transistor 1008.

The electronic circuit 1000 can include a voltage source 1004 having first and second terminals, wherein the first terminal of the voltage source 1004 is coupled to receive the voltage 1002 and the second terminal of the voltage source 1004 is coupled to a base of the PNP bipolar transistor 1008.

The electronic circuit 1000 can include another magnetoresistance element 1014 having first and second terminals, wherein the first terminal of the magnetoresistance element 1014 is coupled to an emitter of an NPN bipolar transistor 1010 and the second terminal of the magnetoresistance element 1014 is coupled to a voltage reference, for example, a ground voltage.

The electronic circuit 1000 can include another voltage source 1012 having first and second terminals, wherein the first terminal of the voltage source 1012 is coupled a base of the NPN bipolar transistor 1010 and the second terminal of the voltage source 1012 is coupled to the second terminal of the magnetoresistance element 1014.

A collector of the PNP bipolar transistor 1008 can be coupled to a collector of the NPN bipolar transistor 1010 at a junction node.

A load 1018, which can be a resistive or a complex load, can be coupled between the junction node and a bias voltage, Vb. Current can flow into and/or out of the load 1018.

The load 1018 is labeled Zload1. The nomenclature, Zload1, used here and in figures below is not intended to limit the load 1018 or loads discussed below to one or more passive electronic components. Instead, the load 1018 and loads discussed below can be comprised of passive electronic components, active electronic components, or both.

An output voltage 1016 can be generated at the collector of the PNP bipolar transistor 1008 (i.e., at the junction node).

It should be appreciated that the voltage source 1004, the magnetoresistance element 1006, and the PNP bipolar transistor 1008 form a variable current source operable to provide a variable current, I1. The variable current, I1, varies in accordance with a variable resistance of the magnetoresistance element 1006, which varies in accordance with a sensed magnetic field.

It should be appreciated that the voltage source 1012, the magnetoresistance element 1014, and the NPN bipolar transistor 1010 form a variable current sink operable to provide a variable current, I2. The variable current, I2, varies in accordance with a variable resistance of the magnetoresistance element 1014, which varies in accordance with a sensed magnetic field. Thus, the output voltage 1016 is generated according to the following:

$$Vout1 = Vb + [(I1+I2) \times Zload1]$$

$$I1 = (V1 - Vbe)/A$$

$$I2 = (V2 - Vbe)/D$$

$$I1 - I2 = (V1 - Vbe)/A - (V2 - Vbe)/D$$

$$Vout1 = Vb + [[(V1 - Vbe)/A - (V2 - Vbe)/D] \times Zload1] \quad (10)$$

where:
Zload1=impedance of load 1018
Vout1=voltage 1016
V1=voltage of voltage source 1004
V2=voltage of voltage source 1012
D=resistance of magnetoresistance element 1014
A=resistance of the magnetoresistance element 1006
Vb=bias voltage
Vbe=base emitter voltage of PNP bipolar transistor 1008 and of NPN bipolar transistor 1010=approx. 0.7 volts In the electronic circuit 1000, it should be appreciated that the same current, I1, flows through the PNP bipolar transistor 1008 and through the magnetoresistance element 1006. Also, the same current, I2, (different than I1) flows through the NPN bipolar transistor 1010 and through the magnetoresistance element 1014.

The electronic circuit 1000 can also include a magnetoresistance element 1020 having first and second terminals, wherein the first terminal of the magnetoresistance element 1020 is coupled to receive the voltage 1002 and the second terminal of the magnetoresistance element 1020 is coupled to an emitter of a PNP bipolar transistor 1022.

The second terminal of the voltage source 1004 can be coupled to a base of the PNP bipolar transistor 1022.

The electronic circuit 1000 can include another magnetoresistance element 1026 having first and second terminals, wherein the first terminal of the magnetoresistance element 1026 is coupled to an emitter of an NPN bipolar transistor 1024 and the second terminal of the magnetoresistance element 1026 is coupled to a voltage reference, for example, a ground voltage.

The first terminal of the voltage source 1012 is coupled a base of the NPN bipolar transistor 1024.

A collector of the PNP bipolar transistor 1022 can be coupled to a collector of the NPN bipolar transistor 1024 at a junction node.

A load 1030, which can be a resistive or a complex load, can be coupled between the junction node and a bias voltage, Vb. Current can flow into and/or out of the load 1030.

The load 1030 is labeled Zload2. The nomenclature, Zload2, used here and in FIGS. below is not intended to limit the load 1030 or loads discussed below to one or more passive electronic components. Instead, the load 1030 and loads discussed below can be comprised of passive electronic components, active electronic components, or both.

An output voltage 1028 can be generated at the collector of the PNP bipolar transistor 1022 (i.e., at the junction node).

It should be appreciated that the voltage source 1004, the magnetoresistance element 1020, and the PNP bipolar transistor 1022 form a current source operable to provide a variable current, I3. The variable current, I3, varies in accordance with a variable resistance of the magnetoresistance element 1020, which varies in accordance with a sensed magnetic field.

It should be appreciated that the voltage source 1012, the magnetoresistance element 1026, and the NPN bipolar transistor 1024 form a variable current sink operable to provide a variable current, I4. The variable current, I4, varies in accordance with a variable resistance of the magnetoresistance element 1026, which varies in accordance with a sensed magnetic field. Thus, the output voltage 1028 is generated according to the following:

$$Vout2=Vb+[(I3+I4)\times Zload2]$$

$$I3=(V1-Vbe)/C$$

$$I4=(V2-Vbe)/B$$

$$I3-I4=(V1-Vbe)/C-(V2-Vbe)/B$$

$$Vout2=Vb+[[(V1-Vbe)/C-(V2-Vbe)/B]\times Zload2] \quad (11)$$

where:
Zload2=impedance of load 1030
Vout2=voltage 1028
V1=voltage of voltage source 1004
V2=voltage of voltage source 1012
C=resistance of magnetoresistance element 1020
B=resistance of the magnetoresistance element 1026
Vb=bias voltage
Vbe=base emitter voltage of PNP bipolar transistor 1022 and of NPN bipolar transistor 1024=approx. 0.7 volts In the electronic circuit 1000, it should be appreciated that the same current, I3, (different than I1, I2) flows through the PNP bipolar transistor 1022 and through the magnetoresistance element 1020. Also, the same current, I4, (different than I1, I2, I3) flows through the NPN bipolar transistor 1024 and through the magnetoresistance element 1026.

For the electronic circuit 1000, the output voltages 1016, 1028 can be taken individually (i.e., each can be a single ended signal). In other embodiments, the electronic circuit 1000 provides a differential signal, Vdiff=voltage 1016–voltage 1028=Vout1−Vout2.

It should be understood that the loads 1018, 1030 can be made to have high impedances to achieve single ended gains not obtained with the electronic circuits of FIGS. 1–4 described above. Furthermore, the above described differential signal has an amplitude that is double the amplitude of the single ended signals.

Figure 11:
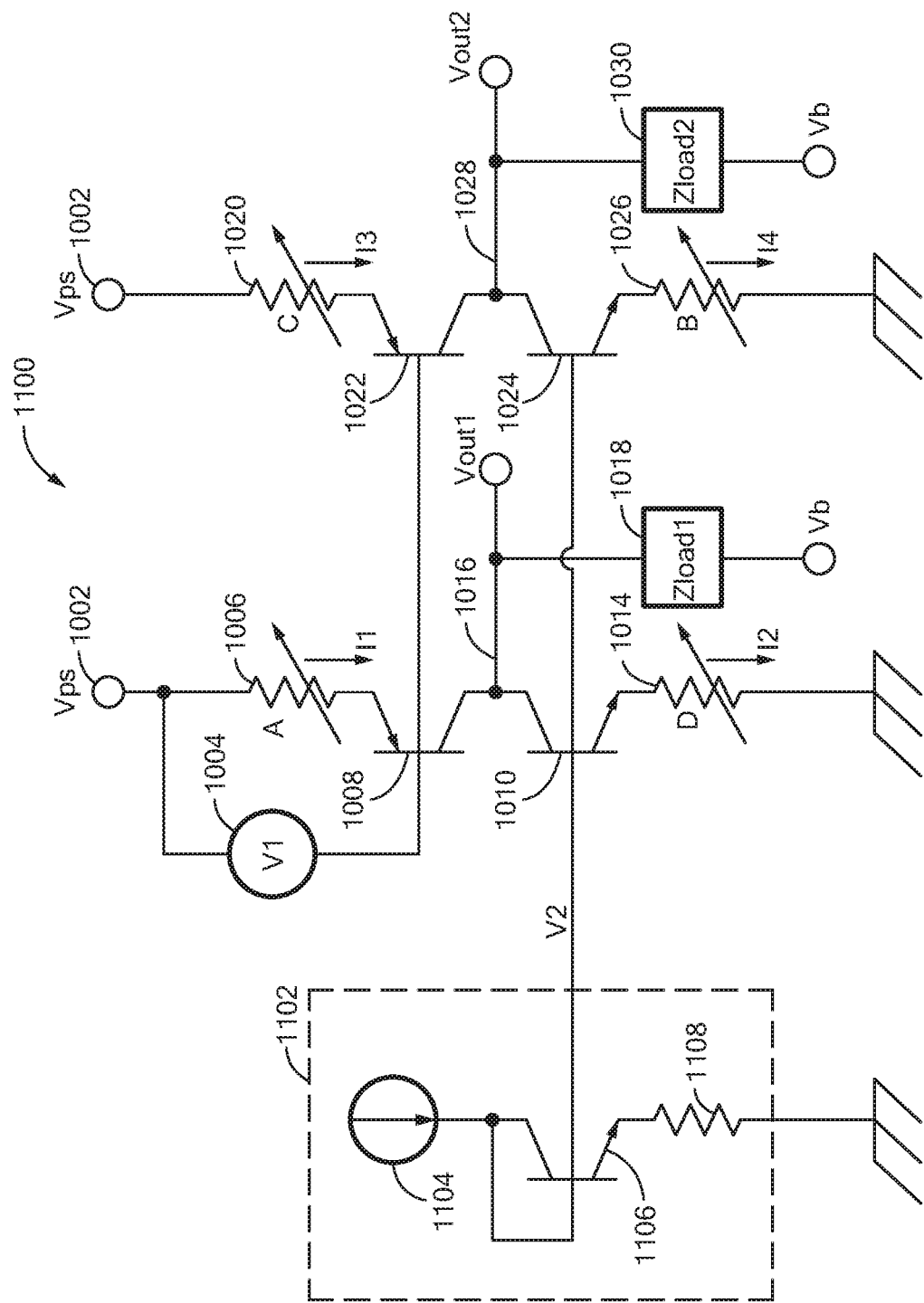
FIG. 11 is a schematic diagram of an example of another electronic circuit as may be used in another magnetic field sensor, and which has or is otherwise coupled to four magnetoresistance elements.

Referring now to FIG. 11, in which like elements of FIG. 10 are shown having like reference designations, in an electronic circuit 1100, the voltage source 1012 of FIG. 10 is replaced with a circuit portion 1102, which will be recognized to be a reference leg of a current mirror. The circuit portion 1102 can include a current source 1104 having an output node. A collector of an NPN bipolar transistor 1106 can be coupled to the current source. A base of the NPN bipolar transistor 1106 can be coupled to the collector of the NPN bipolar transistor 1106, such that the NPN bipolar transistor operates merely as a diode. A resistor 1180 having first and second terminals can be coupled such that the first terminal of the resistor is coupled to an emitter of the NPN bipolar transistor 1106 and the second terminal of the resistor 1108 is coupled to a reference voltage, for example, a ground voltage. The base or the NPN bipolar transistor 1106 is coupled to the bases of the NPN bipolar transistors 1010, 1024, The electronic circuit 1100 operates in substantially the same way as the electronic circuit 1000 of FIG. 10, and has the same operating equations.

Figure 12:
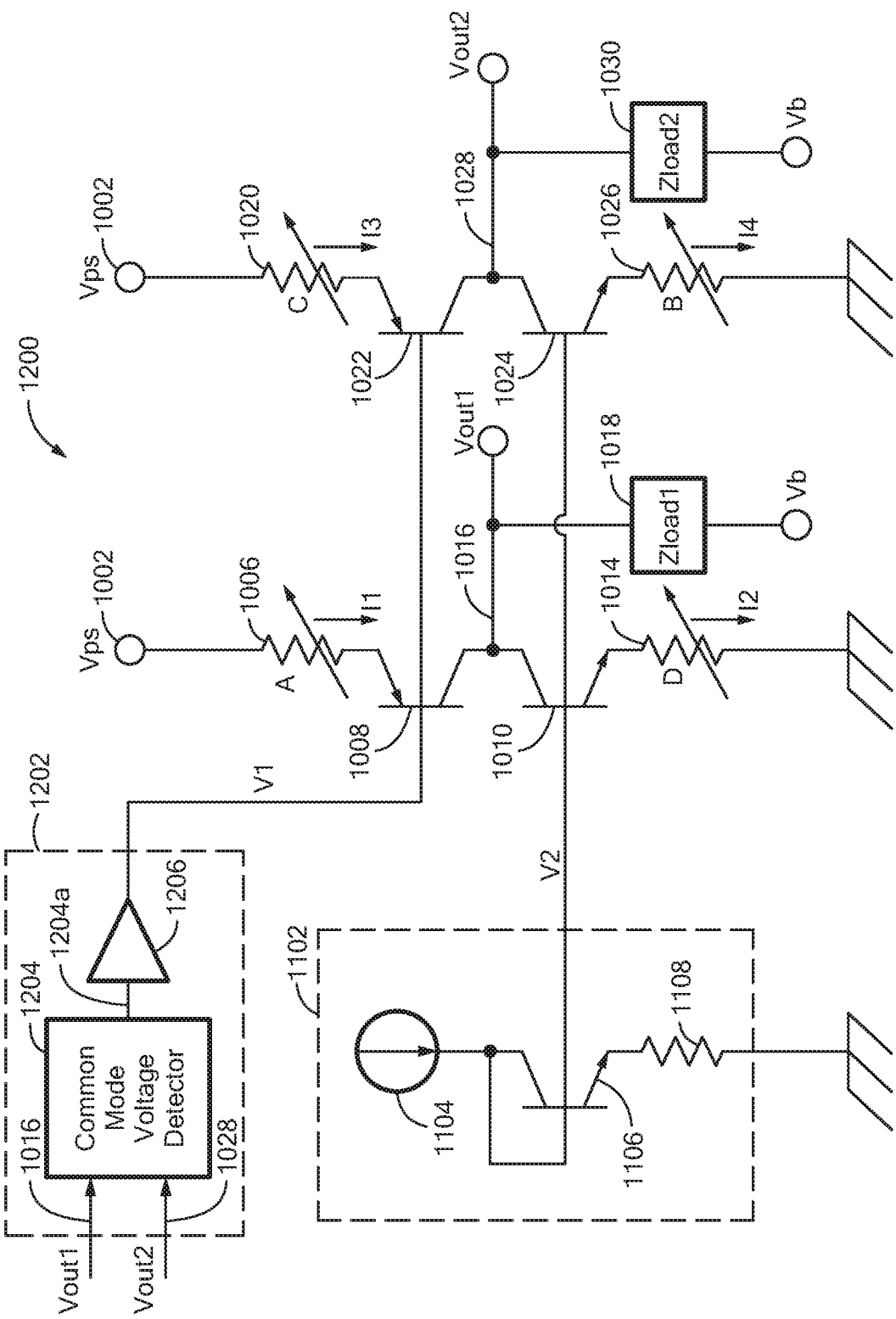
FIG. 12 is a schematic diagram of an example of another electronic circuit as may be used in another magnetic field sensor, and which has or is otherwise coupled to four magnetoresistance elements.

Referring now to FIG. 12, in which like elements of FIGS. 10 and 11 are shown having like reference designations, in an electronic circuit 1200, the voltage source 1004 of FIGS. 10 and 11 is replaced with a circuit portion 1202, which operates as a common mode voltage detector. The circuit portion 1202 can include a common mode voltage detector 1204 coupled to receive the two output voltages 1016, 1028 and operable to generate a common mode detection signal 1204a indicative of a common mode voltage of the output voltages 1016, 1028.

A voltage buffer or level translator 1206 can be coupled to receive the common mode detection signal 1204a and operable to generate a signal coupled to the bases of the PNP bipolar transistors 1008, 1022.

In operation, if a common voltage of a differential signal Vout1−Vout2 is not at a desired operating point, the common mode voltage detector 1204 can detect the error condition and adjust the current flowing through the two PNP bipolar transistors 1008, 1022 to remove the error condition.

The electronic circuit 1200 operates in substantially the same way as the electronic circuit 1000 of FIG. 10 and the electronic circuit 1100 of FIG. 1, and has the same operating equations.

Figure 13:
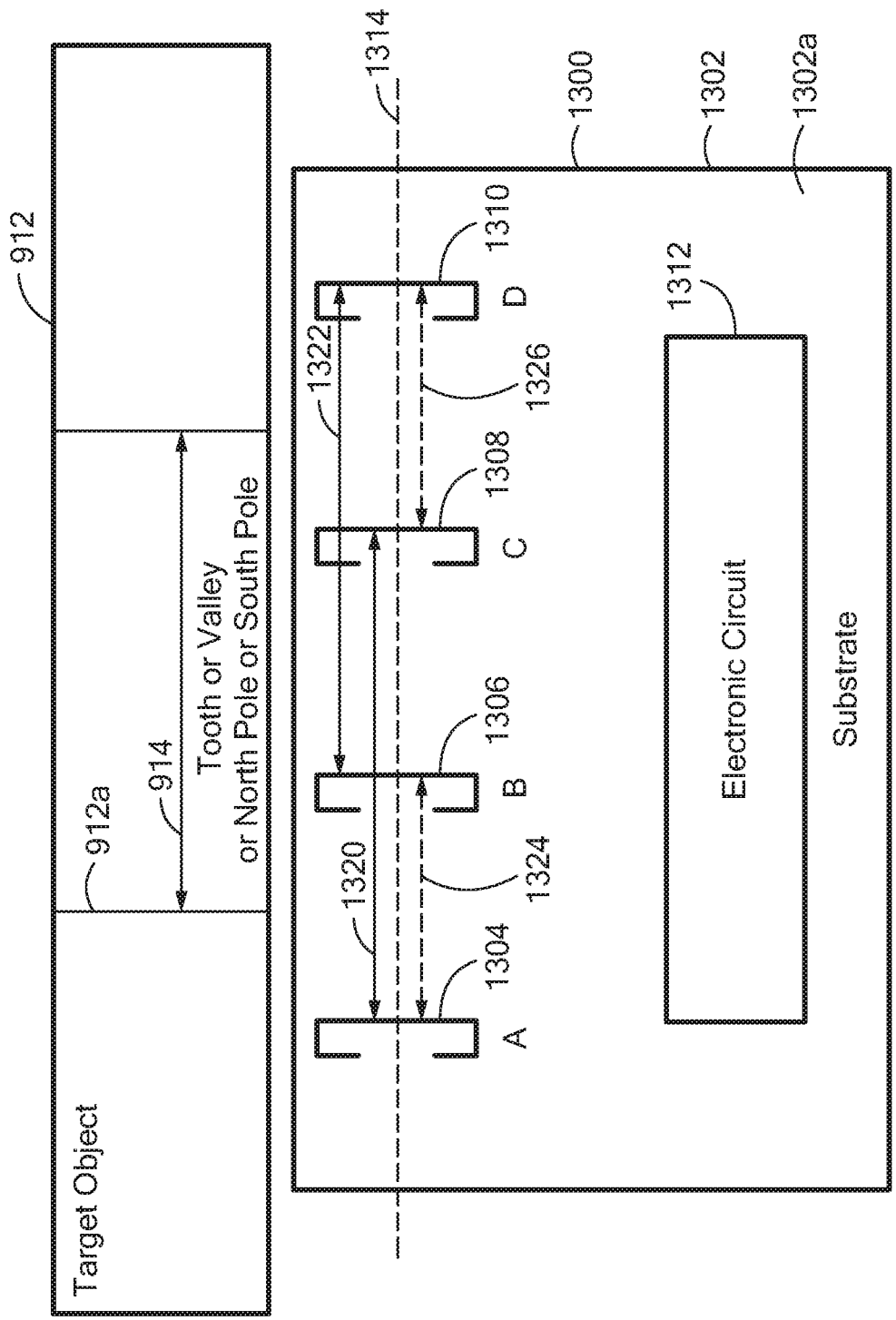
FIG. 13 is a block diagram of a magnetic field sensor having a substrate with four magnetoresistance elements disposed thereon, the substrate disposed proximate to a ferromagnetic target object having ferromagnetic target object features.

Referring now to FIG. 13, in which like elements of FIG. 9 are shown having like, reference designations, a magnetic field sensor 1300 can include a substrate 1302 having a surface 1302a, which is one of two parallel major surfaces of the substrate 1302.

Four magnetoresistance elements 1304, 1306, 1308, 1310 (A, B, C, D) can be disposed upon the surface 1302a along an axis 1314. The four magnetoresistance elements 1304, 1306, 1308, 1310 (A, B, C, D) can be part of or coupled to an electronic circuit 1312, which is also disposed upon or within the surface 1302a of the substrate 1302. The four magnetoresistance elements 1304, 1306, 1308, 1310 (A, B, C, D) can be the same as or similar to the magnetic field sensing elements 1006, 1026, 1020, 1014, respectively, of FIGS. 10 and 11.

Maximum response axes of the four magnetoresistance elements 1304, 1306, 1308, 1310 (A, B, C, D) can be parallel to and along an axis 1314, and in the same direction. Angles of magnetic fields are discussed above in conjunction with FIG. 9.

The magnetic field sensor 1300 is responsive to movement of the ferromagnetic target object 912.

In some embodiments, the four magnetoresistance elements 1304, 1306, 1308, 1310 (A, B, C, D) are disposed along the axis 1314 proximate to the ferromagnetic target object 912.

In some embodiments, the two magnetoresistance elements 1304, 1308 (A, C) have a separation 1320 between about one half and about one and one half of the width 914 of the target feature 912a, for example, a gear tooth of a ferromagnetic gear or a magnetic domain of a ferromagnetic ring magnet. In some other embodiments, the two magnetoresistance elements 1304, 1308 (A, C) have a separation

1320 between about one half and about twice the width 914 of the target feature 912a. However, in other embodiments, the separation 1320 is much smaller than half of the width 914, for example, one one hundredth of the width 914 or larger than twice the width 914.

In some embodiments used in examples below, the separation 1320 is about equal to the width 914 of the target feature 912a.

Similarly, in some embodiments, the two magnetoresistance elements 1306, 1310 (B, D) have a separation 1322 between about one half and about one and one half of the width 914 of the target feature 912a, for example, a gear tooth of a ferromagnetic gear or a magnetic domain of a ferromagnetic ring magnet. In some embodiments, the two magnetoresistance elements 1306, 1310 (B, D) have a separation 1322 between about one half and about twice the width 914 of the target feature 912a. However, in other embodiments, the separation 1322 is much smaller than half of the width 914, for example, one one hundredth of the width 914 or larger than twice the width 914.

In some embodiments used in examples below, the separation 1322 is about equal to the width 914 of the target feature 912a.

In some other embodiments, the two magnetoresistance elements 1304, 1306 (A, B) have a separation 1324 between about one half and about one and one half of the width 914 of the target feature 912a. In some other embodiments, the two magnetoresistance elements 1304, 1306 (A, B) have a separation 1324 between about one half and about twice the width 914 of the target feature 912a. However, in other embodiments, the separation 1324 is much smaller than half of the width 914, for example, one one hundredth of the width 914 or larger than twice the width 914.

In some embodiments used in examples below, the separation 1324 is about equal to the width 914 of the target feature 912a.

Similarly, in some other embodiments, the two magnetoresistance elements 1308, 1310 (C, D) have a separation 1326 between about one half and about one and one half of the width 914 of the target feature 912a. In some other embodiments, the two magnetoresistance elements 1308, 1310 (C, D) have a separation 1326 between about one half and twice the width 914 of the target feature 912a. However, in other embodiments, the separation 1326 is much smaller than half of the width 914, for example, one one hundredth of the width 914 or larger than twice the width 914.

In some embodiments used in examples below, the separation 1326 is about equal to the width 914 of the target feature 912a.

In operation, the four magnetoresistance elements 1304, 1306, 1308, 1310 (A, B, C, D) can generate at least two output signals. FIGS. 10, 11, and 12 above are representative of ways in which the four magnetoresistance elements 1304, 1306, 1308, 1310 (A, B, C, D) can generate at least two output signals. In FIGS. 10, 11, and 12, the designation A, B, C, and D are indicative of resistances and are also indicative of physical placement in relation to FIG. 13.

Using as an example the target feature 912a with a width 914 equal to the spacings 1320, 1322, when the target feature 912a is centered about (i.e., between) the four magnetoresistance elements 1304, 1306, 1308, 1310 (A, B, C, D), it can be shown that any magnetoresistance element(s) (e.g., 1304, 1306 (A, B)) on one side of a center of the target feature 912a experiences a projected magnetic field pointed in one direction along the axis 1314, and any magnetoresistance element(s) (e.g., 1308, 1310 (C, D)) on the other side of the center of the target feature 912a experiences a projected magnetic field pointed in the other direction.

Therefore, when the target feature 912a is centered about four magnetoresistance elements 1304, 1306, 1308, 1310 (A, B, C, D), any magnetoresistance element(s) (e.g., 1304, 1306 (A, B)) on one side of the center of the target feature 912a change resistance in one direction, and any magnetoresistance element(s) (e.g., 1308, 1310 (C, D)) on the other side of the center of the target feature 912a change resistance in the other direction.

In contrast, when an edge of the target feature 912a is centered about (i.e., between) the four magnetoresistance elements 1304, 1306, 1308, 1310 (A, B, C, D), it can be shown that the two magnetoresistance elements 1304, 1310 (A, D) experience projected magnetic fields pointed in the same direction along the axis 1314. Thus, resistance of both of the two magnetoresistance elements 1304, 1310 change in the same direction.

At the same time, when an edge of the target feature 912a is centered, the two magnetoresistance elements 1306, 1308 (B, C) experience projected magnetic fields pointed in the same direction along the axis 1314, but opposite in direction from the projected magnetic fields experienced by the two magnetoresistance elements 1304, 1310 (A, D). Thus, resistance of both of the two magnetoresistance elements 1306, 1308 (B, C) change in the same direction but opposite to the resistance change of the two magnetoresistance elements 1304, 1310 (A, D).

While a particular example of the spacings 1320, 1322 relative to the width 914 of the target feature 912a is given above, it should be appreciated that for other relative dimensions, magnetic fields at the four magnetoresistance elements 1304, 1306, 1308, 1310 (A, B, C, D) may not be exactly as described above and some resistance changes may be in other directions.

In view of the above, it should be understood that the electronic circuits 1000, 1100, 1200 of FIGS. 10, 11, 12 can operate as a feature detectors, generating a largest differential voltage Vout1−Vout2 when the four magnetoresistance elements 1004 (A), 1026 (B), 1020 (C), 1014 (D) of FIGS. 10, 11, 12 are arranged as shown in FIG. 13 by designations A-D, arranged relative to a center of the target feature 912a.

While a magnet is not shown, it should be understood that in some embodiments, the magnetic field sensor 1400 can include a magnet.

Figure 14:
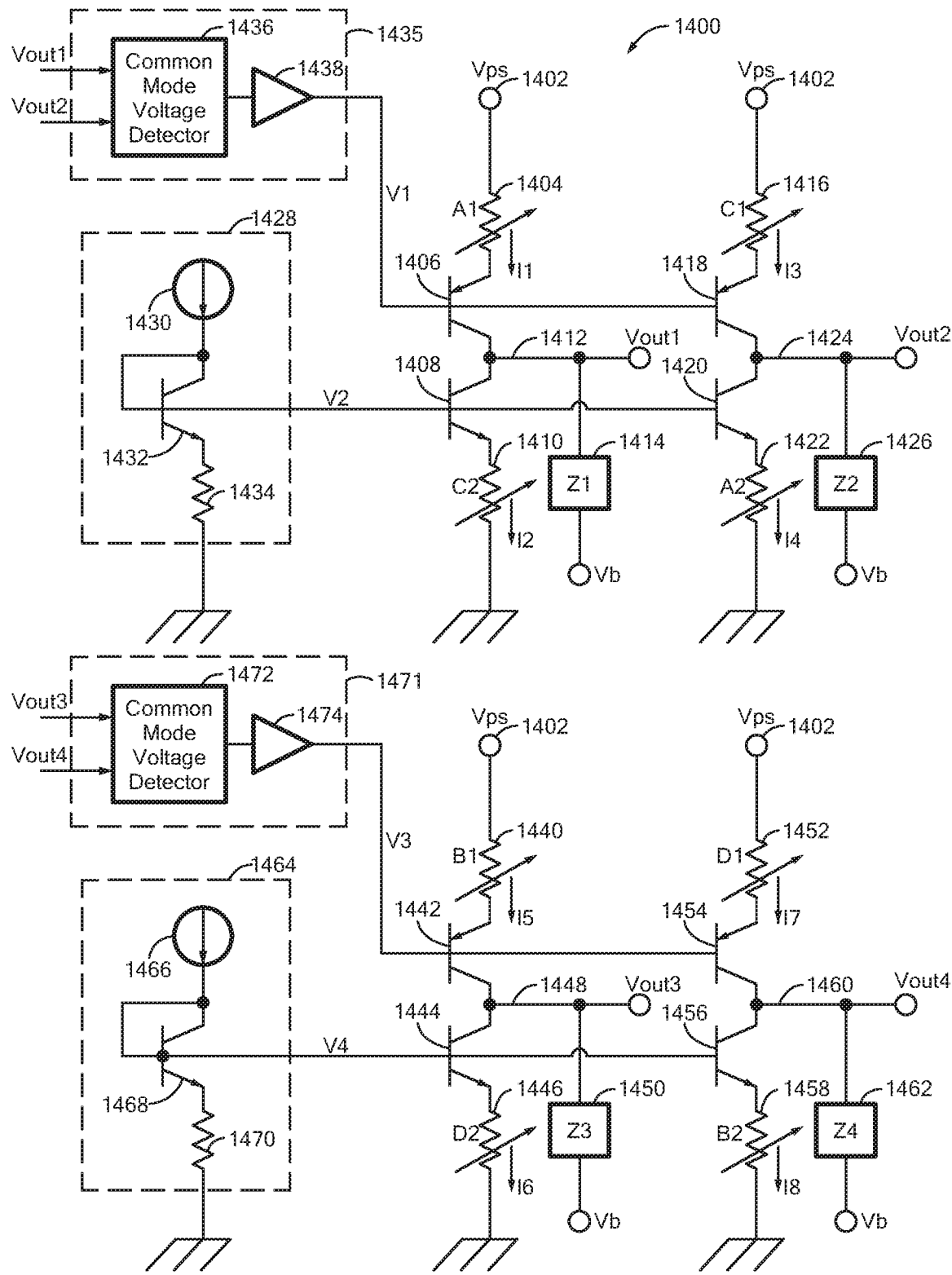
FIG. 14 is a schematic diagram of an example of another electronic circuit as may be used in another magnetic field sensor, and which has or is otherwise coupled to eight magnetoresistance elements.

Referring now to FIG. 14, another example of an electronic circuit 1400 can be used in another magnetic field sensor. The electronic circuit 1400 can include a magnetoresistance element 1404 having first and second terminals, wherein the first terminal of the magnetoresistance element 1404 is coupled to receive a voltage 1402 and the second terminal of the magnetoresistance element 1404 is coupled to an emitter of a PNP bipolar transistor 1406.

The electronic circuit 1400 can include a voltage source in the form of a common mode voltage detector circuit 1435 coupled to the base of the PNP bipolar transistor 1406.

The electronic circuit 1400 can include another magnetoresistance element 1410 having first and second terminals, wherein the first terminal of the magnetoresistance element 1410 is coupled to an emitter of an NPN bipolar transistor 1408 and the second terminal of the magnetoresistance element 1410 is coupled to a voltage reference, for example, a ground voltage.

The electronic circuit 1400 can include a voltage source in the form of a current mirror reference leg 1428 coupled to the base of the NPN bipolar transistor 1408.

A collector of the PNP bipolar transistor 1406 can be coupled to a collector of the NPN bipolar transistor 1408 at a junction node.

A load 1414, which can be a resistive or a complex load, can be coupled between the junction node and a bias voltage, Vb. Current can flow into and/or out of the load 1414.

The load 1414 is labeled Z1. The nomenclature, Z1, is not intended to limit the load 1414 to one or more passive electronic components. Instead, the load 1414 can be comprised of passive electronic components, active electronic components, or both.

An output voltage 1412 can be generated at the collector of the PNP bipolar transistor 1406 (i.e., at the junction node).

The output voltage 1412 is generated according to the following:

$$Vout1 = Vb + [(I1 + I2) \times Z1]$$

$$I1 = (V1 - Vbe)/A1$$

$$I2 = (V2 - Vbe)/C2$$

$$I1 - I2 = (V1 - Vbe)/A1 - (V2 - Vbe)/C2$$

$$Vout1 = Vb + [[(V1 - Vbe)/A1 - (V2 - Vbe)/C2] \times Z1] \tag{12}$$

where:
Z1=impedance of load 1414
Vout1=voltage 1412
V1=voltage of common mode voltage detector circuit 1435
V2=voltage of current mirror reference leg 1428
C2=resistance of magnetoresistance element 1410
A1=resistance of the magnetoresistance element 1404
Vb=bias voltage
Vbe=base emitter voltage of PNP bipolar transistor 1406 and of NPN bipolar transistor 1408=approx. 0.7 volts The electronic circuit 1400 can also include a magnetoresistance element 1416 having first and second terminals, wherein the first terminal of the magnetoresistance element 1416 is coupled to receive the voltage 1402 and the second terminal of the magnetoresistance element 1416 is coupled to an emitter of a PNP bipolar transistor 1418.

The common mode voltage detector circuit 1435 can be coupled to a base of the PNP bipolar transistor 1418.

The electronic circuit 1400 can include another magnetoresistance element 1422 having first and second terminals, wherein the first terminal of the magnetoresistance element 1422 is coupled to an emitter of an NPN bipolar transistor 1420 and the second terminal of the magnetoresistance element 1422 is coupled to a voltage reference, for example, a ground voltage.

The current mirror reference leg 1428 is coupled to a base of the NPN bipolar transistor 1420.

A collector of the PNP bipolar transistor 1418 can be coupled to a collector of the NPN bipolar transistor 1420 at a junction node.

A load 1426, which can be a resistive or a complex load, can be coupled between the junction node and a bias voltage, Vb. Current can flow into and/or out of the load 1426

The load 1426 is labeled Z2. The nomenclature, Z2, is not intended to limit the load 1426 to one or more passive electronic components. Instead, the load 1426 can be comprised of passive electronic components, active electronic components, or both.

An output voltage 1424 can be generated at the collector of the PNP bipolar transistor 1418 (i.e., at the junction node).

The output voltage 1424 is generated according to the following:

$$Vout2 = Vb + [(I3 + I4) \times Z2]$$

$$I3 = (V1 - Vbe)/C1$$

$$I4 = (V2 - Vbe)/A2$$

$$I3 - I4 = (V1 - Vbe)/C1 - (V2 - Vbe)/A2$$

$$Vout2 = Vb + [[(V1 - Vbe)/C1 - (V2 - Vbe)/A2] \times Z1] \tag{13}$$

where:
Z2=impedance of load 1426
Vout2=voltage 1424
V1=voltage of common mode voltage detector circuit 1435
V2=voltage of current mirror reference leg 1428
C1=resistance of resistor 1416
A2=resistance of the magnetoresistance element 1422
Vb=bias voltage
Vbe=base emitter voltage of PNP bipolar transistor 1418 and of NPN bipolar transistor 1024=approx. 0.7 volts In the electronic circuit 1400, it should be appreciated that the same current, I3, (different than I1, I2) flows through the PNP bipolar transistor 1418 and through the magnetoresistance element 1416. Also, the same current, I4, (different than I1, I2, I3) flows through the NPN bipolar transistor 1024 and through the magnetoresistance element 1422.

For the electronic circuit 1400, the output voltages 1412, 1424 can be taken individually (i.e. single ended signals). In other embodiments, the electronic circuit 1400 provides a differential signal, Vdiff=voltage 1412 voltage 1424=Vout1−Vout2.

It should be understood that the loads 1414, 1426 can be made to have high impedances to achieve single ended gains not obtained with the electronic circuits of FIGS. 1-4 described above. Furthermore, the above described differential signal has an amplitude that is double the amplitude of the single ended signals.

The electronic circuit 1400 can also include a magnetoresistance element 1440 having first and second terminals, wherein the first terminal of the magnetoresistance element 1440 is coupled to receive a voltage 1402 and the second terminal of the magnetoresistance element 1440 is coupled to an emitter of a PNP bipolar transistor 1442.

The electronic circuit 1400 can include a common mode voltage detector circuit 1471 coupled to a base of the PNP bipolar transistor 1442.

The electronic circuit 1400 can include another magnetoresistance element 1446 having first and second terminals, wherein the first terminal of the magnetoresistance element 1446 is coupled to an emitter of an NPN bipolar transistor 1444 and the second terminal of the magnetoresistance element 1446 is coupled to a voltage reference, for example, a ground voltage.

The electronic circuit 1400 can include a current mirror reference leg 1464 coupled a base of the NPN bipolar transistor 1444.

A collector of the PNP bipolar transistor 1442 can be coupled to a collector of the NPN bipolar transistor 1444 at a junction node.

A load 1450, which can be a resistive or a complex load, can be coupled between the junction node and a bias voltage, Vb. Current can flow into and/or out of the load 1450.

The load 1450 is labeled Z3. The nomenclature, Z3, is not intended to limit the load 1450 to one or more passive electronic components. Instead, the load 1450 can be comprised of passive electronic components, active electronic components, or both.

An output voltage 1448 can be generated at the collector of the PNP bipolar transistor 1442 (i.e., at the junction node).

The output voltage 1448 is generated according to the following:

$$V\text{out3}=Vb+[(I5+I6)\times Z3]$$

$$I5=(V3-Vbe)/B1$$

$$I6=(V4-Vbe)/D2$$

$$I5-I6=(V3-Vbe)/B1-(V4-Vbe)/D2$$

$$V\text{out3}=Vb+[[(V3-Vbe)/B1-(V4-Vbe)/D2]\times Z3] \quad (14)$$

where:
Z3=impedance of load 1450
Vout3=voltage 1448
V3=voltage of common mode voltage detector circuit 1471
V4=voltage of current mirror reference leg 1464
D2=resistance of magnetoresistance element 1446
B1=resistance of the magnetoresistance element 1440
Vb=bias voltage
Vbe=base emitter voltage of PNP bipolar transistor 1442 and of NPN bipolar transistor 1444=approx. 0.7 volts The electronic circuit 1400 can also include a magnetoresistance element 1452 having first and second terminals, wherein the first terminal of the magnetoresistance element 1452 is coupled to receive the voltage 1402 and the second terminal of the magnetoresistance element 1452 is coupled to an emitter of a PNP bipolar transistor 1454.

The common mode voltage detector circuit 1471 can be coupled to a base of the PNP bipolar transistor 1454.

The electronic circuit 1400 can include another magnetoresistance element 1458 having first and second terminals, wherein the first terminal of the magnetoresistance element 1458 is coupled to an emitter of an NPN bipolar transistor 1456 and the second terminal of the magnetoresistance element 1458 is coupled to a voltage reference, for example, a ground voltage.

The current mirror reference leg 1464 is coupled to a base of the NPN bipolar transistor 1456.

A collector of the PNP bipolar transistor 1454 can be coupled to a collector of the NPN bipolar transistor 1456 at a junction node.

A load 1462, which can be a resistive or a complex load, can be coupled between the junction node and a bias voltage, Vb. Current can flow into and/or out of the load 1462

The load 1462 is labeled Z4. The nomenclature, Z4, is not intended to limit the load 1462 to one or more passive electronic components. Instead, the load 1462 can be comprised of passive electronic components, active electronic components, or both.

An output voltage 1460 can be generated at the collector of the PNP bipolar transistor 1454 (i.e., at the junction node).

The output voltage 1460 is generated according to the following:

$$V\text{out4}=Vb+[(I7+I8)\times Z4]$$

$$I7=(V3-Vbe)/D1$$

$$I8=(V4-Vbe)/B2$$

$$I7-I8=(V3-Vbe)/D1-(V4-Vbe)/B2$$

$$V\text{out4}=Vb+[[(V3-Vbe)/D1-(V4-Vbe)/B2]\times Z4] \quad (15)$$

where:
Z4=impedance of load 1462
Vout4=voltage 1460
V3=voltage of common mode voltage detector circuit 1471
V4=voltage of current mirror reference leg 1464
D1=resistance of magnetoresistance element 1452
B2=resistance of the magnetoresistance element 1458
Vb=bias voltage
Vbe=base emitter voltage of PNP bipolar transistor 1454 and of NPN bipolar transistor 1456=approx. 0.7 volts For the electronic circuit 1400, the output voltages 1448, 1460 can be taken individually (i.e. single ended signals). In other embodiments, the electronic circuit 1400 provides a differential signal, Vdiff=voltage 1448 voltage 1460=Vout3−Vout4.

It should be understood that the loads 1450, 1462 can be made to have high impedances to achieve single ended gains not obtained with the electronic circuits of FIGS. 1-4 described above. Furthermore, the above described differential signal has an amplitude that is double the amplitude of the single ended signals.

As described above, for the electronic circuit 1400, the output voltages 1412, 1424, 1448, 1460 can be taken individually (i.e., single ended). However, in other embodiments, the output voltages 1412, 1424, 1448, 1460 can be combined in any way, for example, resulting in two differential signals.

Figure 15:
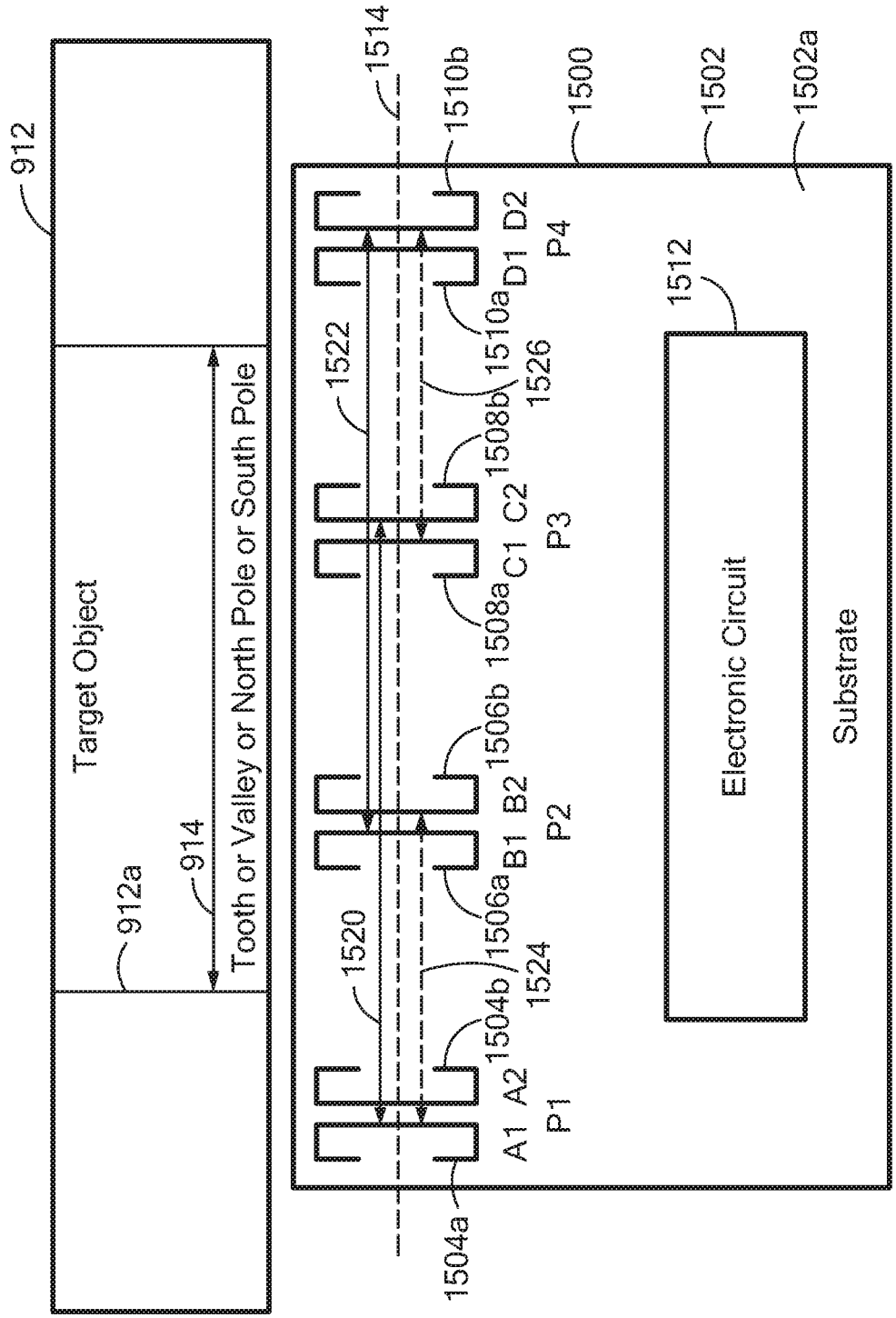
FIG. 15 is a block diagram of a magnetic field sensor having a substrate with eight magnetoresistance elements disposed thereon, the substrate disposed proximate to a ferromagnetic target object having ferromagnetic target object features.

Referring now to FIG. 15, in which like elements of FIG. 9 are shown having like reference designations, a magnetic field sensor 1500 can include a substrate 1502 having a surface 1502a, which is one of two parallel major surfaces of the substrate 1502.

The eight magnetoresistance elements 1504a, 1504b, 1506a, 1506b, 1508a, 1508b, 1510a, 1510b (A1, A2, B1, B2, C1, C2, D1, D2) can be disposed upon the surface 1502a along an axis 1514. The eight magnetoresistance elements 1504a, 1504b, 1506a, 1506b, 1508a, 1508b, 1510a, 1510b (A1, A2, B1, B2, C1, C2, D1, D2) can be part of or coupled to an electronic circuit 1512, which is also disposed upon or within the surface 1502a of the substrate 1502. The eight magnetoresistance elements 1504a, 1504b, 1506a, 1506b, 1508a, 1508b, 1510a, 1510b (A1, A2, B1, B2, C1, C2, D1, D2) can be the same as or similar to the eight magnetoresistance elements of FIG. 14.

Maximum response axes of the eight magnetoresistance elements 1504a, 1504b, 1506a, 1506b, 1508a, 1508b, 1510a, 1510b (A1, A2, B1, B2, C1, C2, D1, D2) can be parallel to and along an axis 1514, and in the same direction. Angles of magnetic fields are discussed above in conjunction with FIG. 9.

The magnetic field sensor 1500 is responsive to movement of the ferromagnetic target object 912.

In some embodiments, the eight magnetoresistance elements 1504a, 1504b, 1506a, 1506b, 1508a, 1508b, 1510a, 1510b (A1, A2, B1, B2, C1, C2, D1, D2) are disposed along the axis 1514 proximate to the ferromagnetic target object 912.

In some embodiments, the two magnetoresistance elements 1504a, 1504b (A1, A2) have a separation 1520 to the two magnetoresistance elements 1508a, 1508b (C1, C2) between about one half and about one and one half of the width 914 of the target feature 912a, for example, a gear tooth of a ferromagnetic gear or a magnetic domain of a ferromagnetic ring magnet. In some embodiments, the two magnetoresistance elements 1504a, 1504b (A1, A2) have a separation 1520 to the two magnetoresistance elements 1508a, 1508b (C1, C2) between about one half and about twice the width 914 of the target feature 912a. However, in other embodiments, the separation 1520 is much smaller than half of the width 914, for example, one one hundredth of the width 914, or larger than twice the width 914.

In some embodiments used in examples below, the separation 1520 is about equal to the width 914 of the target feature 912a.

Similarly, in some embodiments, the two magnetoresistance elements 1506a, 1506b (B1, B2) have a separation 1522 to the two magnetoresistance elements 1510a, 1510b (D1, D2) between about one half and about one and one half of the width 914 of the target feature 912a, for example, a gear tooth of a ferromagnetic gear or a magnetic domain of a ferromagnetic ring magnet. In some embodiments, the two magnetoresistance elements 1506a, 1506b (B1, B2) have a separation 1522 to the two magnetoresistance elements 1510a, 1510b (D1, D2) between about one half and about twice the width 914 of the target feature 912a. However, in other embodiments, the separation 1522 is much smaller than half of the width 914, for example, one one hundredth of the width 914, or larger than twice the width 914.

In some embodiments used in examples below, the separation 1522 is about equal to the width 914 of the target feature 912a.

In some other embodiments, the two magnetoresistance elements 1504a, 1504b (A1, A2) have a separation 1524 to the two magnetoresistance elements 1506a, 1506b (B1, B2) between about one half and about one and one half of the width 914 of the target feature 912a. In some other embodiments, the two magnetoresistance elements 1504a, 1504b (A1, A2) have a separation 1524 to the two magnetoresistance elements 1506a, 1506b (B1, B2) between about one half and twice the width 914 of the target feature 912a. However, in other embodiments, the separation 1524 is much smaller than half of the width 914, for example, one one hundredth of the width 914, or larger than twice the width 914.

In some embodiments used in examples below, the separation 1524 is about equal to the width 914 of the target feature 912a.

Similarly, in some other embodiments, the two magnetoresistance elements 1508a, 1508b (C1, C2) have a separation 1526 to the two magnetoresistance elements 1510a, 1510b (D1, D2) between about one half and about one and one half of the width 914 of the target feature 912a. In some other embodiments, the two magnetoresistance elements 1508a, 1508b (C1, C2) have a separation 1526 to the two magnetoresistance elements 1510a, 1510b (D1, D2) between about twice the width 914 of the target feature 912a. However, in other embodiments, the separation 1526 is much smaller than half of the width 914, for example, one one hundredth of the width 914, or larger than twice the width 914.

In some embodiments used in examples below, the separation 1526 is about equal to the width 914 of the target feature 912a.

In operation, the eight magnetoresistance elements 1504a, 1504b, 1506a, 1506b, 1508a, 1508b, 1510a, 1510b (A1, A2, B1, B2, C1, C2, D1, D2) can generate at least two output signals. FIG. 14 is representative of ways in which the eight magnetoresistance elements 1504a, 1504b, 1506a, 1506b, 1508a, 1508b, 1510a, 1510b (A1, A2, B1, B2, C1, C2, D1, D2) can generate at least two output signals. In FIG. 14 the designations A1, A2, B1, B2, C1, C2, D1, D2 are indicative of resistances and are also indicative of physical placement in relation to FIG. 15.

Using as an example the target feature 912a with a width 914 equal to the spacings 1520, 1522, when the target feature 912a is centered about (i.e., between) the eight magnetoresistance elements 1504a, 1504b, 1506a, 1506b, 1508a, 1508b, 1510a, 1510b (A1, A2, B1, B2, C1, C2, D1, D2), it can be shown that any magnetoresistance element(s) (e.g., 1504a, 1504b, 1506a, 1506b (A1, A2, B1, B2) on one side of a center of the target feature 912a experiences a projected magnetic field pointed in one direction along the axis 1514, and any magnetoresistance element(s) (e.g., 1508a, 1508b, 1510a, 1510b (C1, C2, D1, D1)) on the other side of the center of the target feature 912a experiences a projected magnetic field pointed in the other direction.

Therefore, when the target feature 912a is centered about eight magnetoresistance elements 1504a, 1504b, 1506a, 1506b, 1508a, 1508b, 1510a, 1510b (A1, A2, B1, B2, C1, C2, D1, D2), any magnetoresistance element(s) (e.g., 1504a, 1504b, 1506a, 1506b (A1, A2, B1, B2)) on one side of the center of the target feature 912a changes resistance in one direction, and any magnetoresistance element(s) (e.g., 1508a, 1508b, 1510a, 1510b (C1, C2, D1, D2)) on the other side of the center of the target feature 912a changes resistance in the other direction.

In contrast, when an edge of the target feature 912a is centered about (i.e., between) the eight magnetoresistance elements 1504a, 1504b, 1506a, 1506b, 1508a, 1508b, 1510a, 1510b (A1, A2, B1, B2, C1, C2, D1, D2), it can be shown that the four magnetoresistance elements 1504a, 1504b, 1510a, 1510b (A1, A2, D1, D2) experience projected magnetic fields pointed in the same direction along the axis 1514. Thus, resistances the four magnetoresistance elements 1504a, 1504b, 1510a, 1510b (A1, A2, D1, D2) change in the same direction.

At the same time, when an edge of the target feature 912a is centered, the four magnetoresistance elements 1506a, 1506b, 1508a, 1508b (B1, B2, C1, C2) experience projected magnetic fields pointed in the same direction along the axis 1514, but opposite in direction from the projected magnetic fields experienced by the four magnetoresistance elements 1504a, 1504b, 1510a, 1510b (A1, A2, D1, D2). Thus, resistance of four magnetoresistance elements 1506a, 1506b, 1508a, 1508b (B1, B2, C1, C2) change in the same direction but opposite to the resistance change of the four magnetoresistance elements 1504a, 1504b, 1510a, 1510b (A1, A2, D1, D2).

While a particular example of the spacings 1520, 1515 and 1524, 1526 relative to the width 914 of the target feature 912a is given above, it should be appreciated that for other relative dimensions, magnetic fields at the eight magnetoresistance elements 1504a, 1504b, 1506a, 1506b, 1508a, 1508b, 1510a, 1510b (A1, A2, B1, B2, C1, C2, D1, D2) may not be exactly as described above and some resistance changes may be in other directions. However, it should be apparent how to modify equations shown in figures below to accomplish both a feature signal and an edge signal.

While a magnet not shown, it should be understood that in some embodiments, the magnetic field sensor 1500 can include a magnet.

Figure 16:
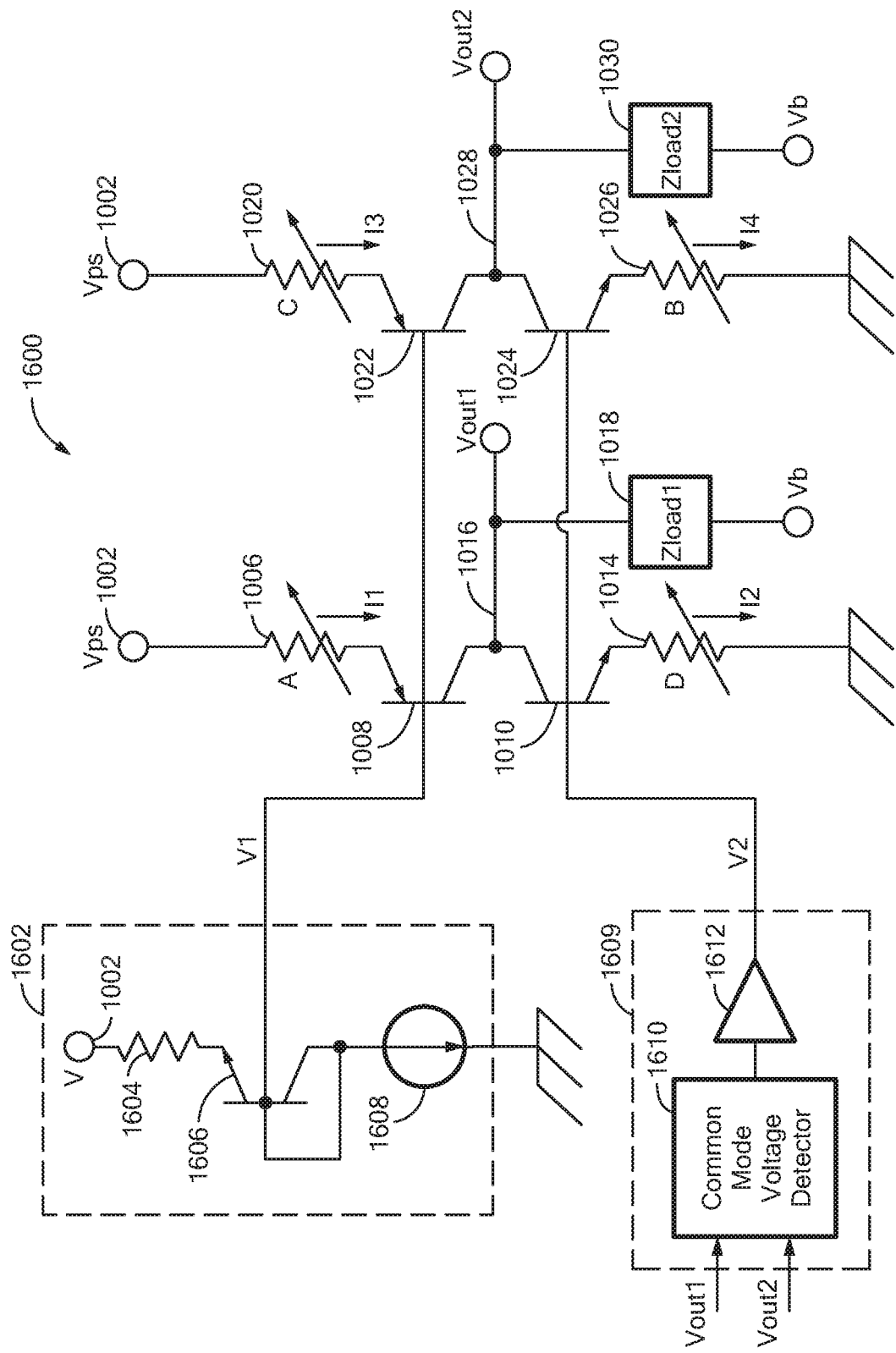
FIG. 16 is a schematic diagram of an example of another electronic circuit as may be used in another magnetic field sensor, and which has or is otherwise coupled to four magnetoresistance elements.

Referring now to FIG. 16, in which like elements of FIGS. 10, 11, and 12 are shown having like reference designations, another example of an electronic circuit 1600 can be used in another magnetic field sensor. In the electronic circuit 1600, a current mirror reference leg 1602 and a common mode voltage detector circuit 1609 are exchanged in position and couplings with the current mirror reference leg 1102 and a common mode voltage detector circuit 1202 of FIG. 12. Operation of the electronic circuit 1600 is similar to operation of the electronic circuit 1200 of FIG. 12.

It should be understood how a current mirror reference leg and a common mode voltage detector circuit can be coupled in either way to all of the above electronic circuits.

In FIG. 16, the designation A, B, C, and D are indicative of resistances and are also indicative of physical placement in relation to FIG. 13.

Figure 17:
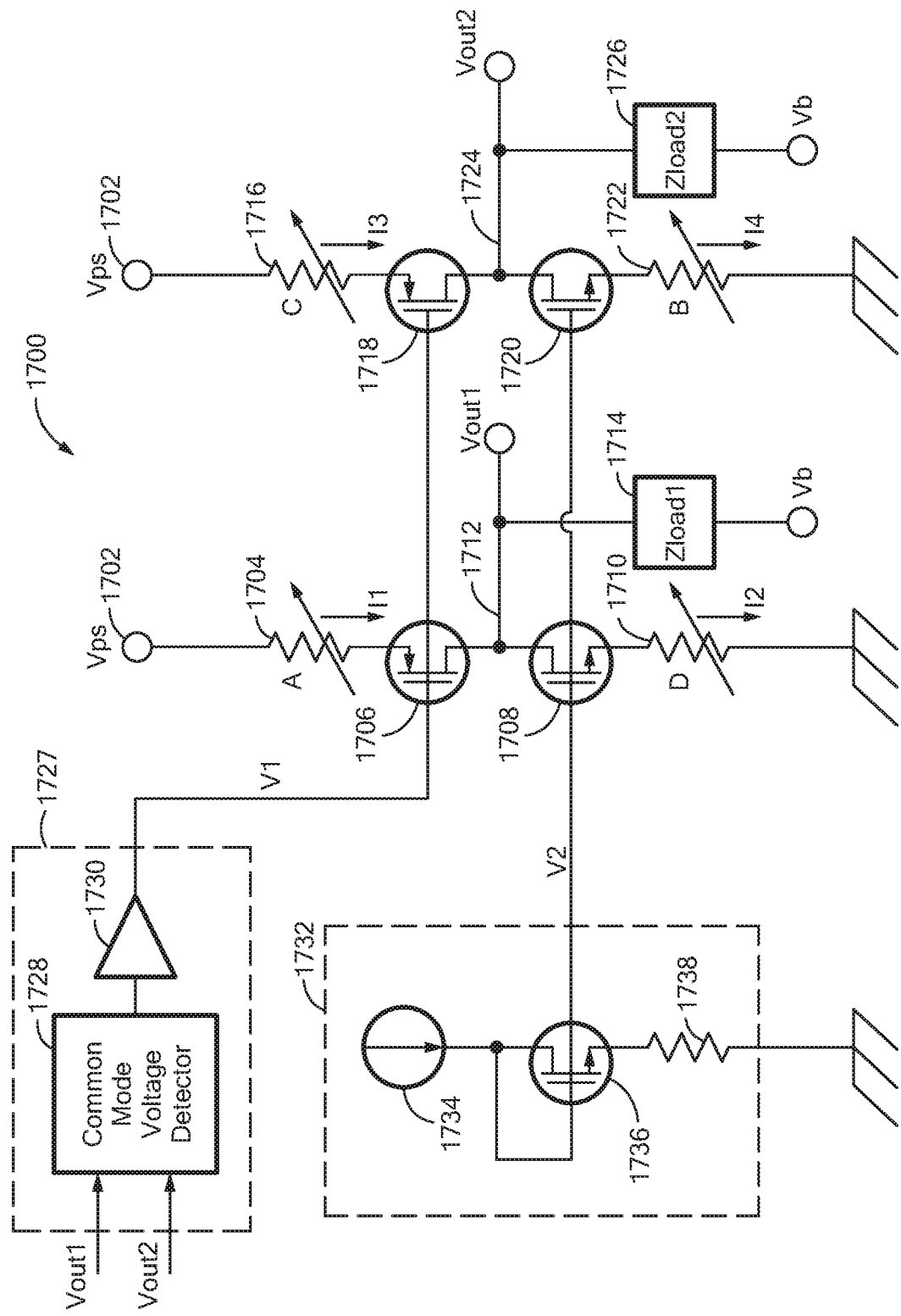
FIG. 17 is a schematic diagram of an example of another electronic circuit as may be used in another magnetic field sensor, and which has or is otherwise coupled to four magnetoresistance elements.

Referring now to FIG. 17, another example of an electronic circuit 1700 can be used in another magnetic field sensor. The electronic circuit 1700 can include a magnetoresistance element 1704 having first and second terminals, wherein the first terminal of the magnetoresistance element 1704 is coupled to receive a voltage 1702 and the second terminal of the magnetoresistance element 1704 is coupled to a source of a P-channel field effect transistor 1706.

The electronic circuit 1700 can include a common mode voltage detector circuit 1727 coupled to a gate of the P-channel field effect transistor 1706.

The electronic circuit 1700 can include another magnetoresistance element 1710 having first and second terminals, wherein the first terminal of the magnetoresistance element 1710 is coupled to a source of an N-channel field effect transistor 1708 and the second terminal of the magnetoresistance element 1710 is coupled to a voltage reference, for example, a ground voltage.

The electronic circuit 1700 can include a current mirror reference leg 1732 coupled a gate of the N-channel field effect transistor 1708.

A drain of the P-channel field effect transistor 1706 can be coupled to a drain of the N-channel field effect transistor 1708 at a junction node.

A load 1714, which can be a resistive or a complex load, can be coupled between the junction node and t a bias voltage, Vb. Current can flow into and/or out of the load 1714.

The load 1714 is labeled Zload1. The nomenclature, Zload1, is not intended to limit the load 1714 to one or more passive electronic components. Instead, the load 1714 can be comprised of passive electronic components, active electronic components, or both.

An output voltage 1712 can be generated at the drain of the P-channel field effect transistor 1706 (i.e., at the junction node).

It should be appreciated that the common mode voltage detector circuit 1727, the magnetoresistance element 1704, and the P-channel field effect transistor 1706 form a variable current source operable to provide a variable current, I1. The variable current, I1, varies in accordance with a variable resistance of the magnetoresistance element 1704, which varies in accordance with a sensed magnetic field.

It should be appreciated that the current mirror reference leg 1732, the magnetoresistance element 1710, and the N-channel field effect transistor 1708 form a variable current sink operable to provide a variable current, I2. The variable current, I2, varies in accordance with a variable resistance of the magnetoresistance element 1710, which varies in accordance with a sensed magnetic field. Thus, the output voltage 1712 is generated according to the following:

$$V\text{out1}=(I1+I2)\times Z\text{load1}$$

Equations used to describe the voltage, Vout1, can be similar to the equations used to describe Vout1 in conjunction with FIG. 10 above, except that Vbe is replaced by Vgs, where Vgs=a gate source voltage of the field effect transistors (which can be different for P-channel and N-channel field defect transistors). A gate-source voltage can be near one volt.

In the electronic circuit 1700, it should be appreciated that the same current, I1 flows through the P-channel field effect transistor 1706 and through the magnetoresistance element 1704. Also, the same current, I2, flows through the N-channel field effect transistor 1708 and through the magnetoresistance element 1710.

The electronic circuit 1700 can also include a magnetoresistance element 1716 having first and second terminals, wherein the first terminal of the magnetoresistance element 1716 is coupled to receive the voltage 1702 and the second terminal of the magnetoresistance element 1716 is coupled to a source of a P-channel field effect transistor 1718.

The common mode voltage detector circuit 1727 can be coupled to a gate of the P-channel field effect transistor 1718.

The electronic circuit 1700 can include another magnetoresistance element 1722 having first and second terminals, wherein the first terminal of the magnetoresistance element 1722 is coupled to a source of an N-channel field effect transistor 1720 and the second terminal of the magnetoresistance element 1722 is coupled to a voltage reference, for example, a ground voltage.

The current mirror reference leg 1732 is coupled to a gate of the N-channel field effect transistor 1720.

A drain of the P-channel field effect transistor 1718 can be coupled to a drain of the N-channel field effect transistor 1720 at a junction node.

A load 1726, which can be a resistive or a complex load, can be coupled between the junction node and a bias voltage, Vb. Current can flow into and/or out of the load 1726.

The load 1726 is labeled Zload2. The nomenclature, Zload2, is not intended to limit the load 1726 to one or more passive electronic components. Instead, the load 1726 can be comprised of passive electronic components, active electronic components, or both.

An output voltage 1724 can be generated at the drain of the P-channel field effect transistor 1718 (i.e., at the junction node).

It should be appreciated that the common mode voltage detector circuit 1727, the magnetoresistance element 1716, and the P-channel field effect transistor 1718 form a variable current source operable to provide a variable current, I3. The variable current, I3, varies in accordance with a variable resistance of the magnetoresistance element 1716, which varies in accordance with a sensed magnetic field.

It should be appreciated that the current mirror reference leg 1732, the magnetoresistance element 1722, and the N-channel field effect transistor 1720 form a variable current sink operable to provide a variable current, I4. The variable current, I4, varies in accordance with a variable resistance of the magnetoresistance element 1722, which varies in accordance with a sensed magnetic field. Thus, the output voltage 1724 is generated according to the following:

$$V\text{out2}=(I3-I4)\times Z\text{load2}$$

Equations used to describe the voltage, Vout2, can be similar to the equations used to describe Vout2 in conjunction with FIG. 10 above, except that Vbe is replaced by Vgs where Vgs=a gate source voltage of the field effect transistors (which can be different for P-channel and N-channel field defect transistors). A gate-source voltage can be near one volt.

In the electronic circuit 1700, it should be appreciated that the same current, I1, flows through the P-channel field effect transistor 1706 and through the magnetoresistance element 1704. Also, the same current, I2, flows through the N-channel field effect transistor 1708 and through the magnetoresistance element 1710.

In the electronic circuit 1700, it should be appreciated that the same current, I3, flows through the P-channel field effect transistor 1718 and through the magnetoresistance element 1716. Also, the same current, I4, flows through the N-channel field effect transistor 1720 and through the magnetoresistance element 1722.

For the electronic circuit 1700, the output voltages 1712, 1724 can be taken individually (i.e., single ended signals). In other embodiments, the electronic circuit 1700 provides a differential signal, Vdiff=voltage 1712 voltage 1724=Vout1−Vout2.

It should be understood that the loads 1714, 1726 can be made to have high impedances to achieve single ended gains not obtained with the electronic circuits of FIGS. 1-4 described above. Furthermore, the above described differential signal has an amplitude that is double the amplitude of the single ended signals.

In FIG. 17, the designation A, B, C, and D are indicative of resistances and are also indicative of physical placement in relation to FIG. 13.

It should be understood that all of the above electronic circuits can use field effect transistors in place of bipolar junction transistors.

Some embodiments described above show two loads. Similar embodiments can instead drive different ends of the same load. Some embodiments described above show four loads. Similar embodiments can instead drive different ends of two loads. Other load couplings are also possible.

While transistors are used in electronic circuits shown and described herein, it should be understood that any electronic component or element now known or later discovered that has a control node to control a current passing between two current passing nodes can be used in place of transistors.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An electronic circuit coupled to receive a power supply voltage, comprising:
  a first magnetoresistance element having first and second terminals, each one of the first and second terminals directly coupled to the magnetoresistance element;
  a first transistor having a control node, a first current passing node, and a second current passing node;
  a first fixed voltage generating source having first and second nodes between which a first fixed voltage is generated, wherein the first fixed voltage does not change in response to a changing magnetic field, wherein the first terminal of the first magnetoresistance element is coupled to the first current passing node of the first transistor, wherein the control node of the first transistor receives the first fixed voltage, and the second node of the first fixed voltage generating source is coupled to the second terminal of the first magnetoresistance element, wherein the electronic circuit is operable to generate a first current signal at the second current passing node of the first transistor related to a resistance value of the first magnetoresistance element;
  a first fixed resistor having a first fixed resistance that does not change in response to the changing magnetic field and having first and second terminals;
  a second transistor having a control node, a first current passing node, and a second current passing node;
  a second fixed voltage generating source having first and second nodes between which a second fixed voltage is generated, wherein the second fixed voltage does not change in response to the changing magnetic field; and
  a first load coupled to the second current passing node of the first transistor, wherein the second current passing node of the first transistor is coupled to the second current passing node of the second transistor, wherein the first terminal of the first fixed resistor is coupled to the first current passing node of the second transistor, wherein the control node of the second transistor receives the second fixed voltage, and the second node of the second fixed voltage generating source is coupled to the second terminal of the first fixed resistor, wherein the electronic circuit is operable to generate a second current signal at the second current passing node of the second transistor related to a resistance value of the first fixed resistor, wherein a current passing through the first load is equal to a difference between the first current signal and the second current signal.

2. The electronic circuit of claim 1, wherein the first transistor is an NPN bipolar transistor and the second transistor is a bipolar PNP transistor.

3. The electronic circuit of claim 1, wherein the first transistor is a PNP bipolar transistor and the second transistor is an NPN bipolar transistor.

4. The electronic circuit of claim 1, wherein the first fixed voltage generating source comprises a reference leg of a current mirror circuit.

5. The electronic circuit of claim 1, further comprising:
  a comparator coupled to the second current passing node of the first transistor for generating a two state output signal.

6. The electronic circuit of claim 1, further comprising:
  a second magnetoresistance element having first and second terminals;
  a third transistor having a control node, and first current passing node, and a second current passing node;
  a third fixed voltage generating source having first and second nodes between which a third fixed voltage is generated, wherein the third fixed voltage does not change in response to the changing magnetic field, wherein the first terminal of the second magnetoresistance element is coupled to the first current passing node of the third transistor, wherein the control node of the third transistor receives the third fixed voltage, and the second node of the third fixed voltage generating source is coupled to the second terminal of the second magnetoresistance element, wherein the electronic circuit is operable to generate a third current signal at the second current passing node of the third transistor related to a resistance value of the second magnetoresistance element, wherein the electronic circuit further comprises:

a second fixed resistor having a second fixed resistance that does not change in response to a changing magnetic field and having first and second terminals;

a fourth transistor having a control node, a first current passing node, and a second current passing node;

a fourth fixed voltage generating source having first and second nodes between which a fourth fixed voltage is generated, wherein the fourth fixed voltage does not change in response to the changing magnetic field; and a second load coupled to the second current passing node of the third transistor, wherein the second current passing node of the third transistor is coupled to the second current passing node of the fourth transistor, wherein the first terminal of the second fixed resistor is coupled to the first current passing node of the fourth transistor, wherein the control node of the fourth transistor receives the fourth fixed voltage, and the second node of the fourth fixed voltage generating source is coupled to the second terminal of the second fixed resistor, wherein the electronic circuit is operable to generate a fourth current signal at the second current passing node of the fourth transistor related to a resistance value of the second fixed resistor, wherein a current passing through the second load is equal to a difference between the third current signal and the fourth current signal.

7. The electronic circuit of claim 6, wherein the first fixed voltage generating source and the third fixed voltage generating source are a same first common fixed voltage generating source.

8. The electronic circuit of claim 7, wherein the same first common fixed voltage generating source comprises a reference leg of a current mirror circuit.

9. The electronic circuit of claim 7, wherein the second fixed voltage generating source and the fourth fixed voltage generating source are a same second common fixed voltage generating source.

10. The electronic circuit of claim 9, wherein the same first common fixed voltage generating source comprises a reference leg of a current mirror circuit and wherein the same second common fixed voltage generating source comprises a common mode voltage detector circuit coupled to the first and second loads and configured to generate the first and third fixed voltages as the same common mode voltage related to a common mode voltage between the first and second loads.

11. The electronic circuit of claim 6, wherein the second fixed voltage generating source and the fourth fixed voltage generating source are a same common fixed voltage generating source.

12. The electronic circuit of claim 11, wherein the same common fixed voltage generating source comprises a common mode voltage detector circuit coupled to the first and second loads and configured to generate the first and third fixed voltages as the same common mode voltage related to a common mode voltage between the first and second loads.

13. An electronic circuit coupled to receive a power supply voltage, comprising:

a first magnetoresistance element having first and second terminals, each one of the first and second terminals directly coupled to the magnetoresistance element;

a first transistor having a control node, a first current passing node, and a second current passing node;

a first fixed voltage generating source having first and second nodes between which a first fixed voltage is generated, wherein the first fixed voltage does not change in response to a changing magnetic field, wherein the first terminal of the first magnetoresistance element is coupled to the first current passing node of the first transistor, wherein the control node of the first transistor receives the first fixed voltage, and the second node of the first fixed voltage generating source is coupled to the second terminal of the first magnetoresistance element, wherein the electronic circuit is operable to generate a first current signal at the second current passing node of the first transistor related to a resistance value of the first magnetoresistance element;

a second magnetoresistance element having first and second terminals;

a second transistor having a control node, a first current passing node, and a second current passing node;

a second fixed voltage generating source having first and second nodes between which a second fixed voltage is generated, wherein the second fixed voltage does not change in response to the changing magnetic field; and a first load coupled to the second current passing node of the first transistor, wherein the second current passing node of the first transistor is coupled to the second current passing node of the second transistor, wherein the first terminal of the second magnetoresistance element is coupled to the first current passing node of the second transistor, wherein the control node of the second transistor receives the second fixed voltage, and the second node of the second fixed voltage generating source is coupled to the second terminal of the second magnetoresistance element, wherein the electronic circuit is operable to generate a second current signal at the second current passing node of the second transistor related to a resistance value of the second magnetoresistance element, wherein a current passing through the first load is equal to a difference between the first current signal and the second current signal, wherein the second terminals of the first and second magnetoresistance elements are not coupled together.

14. The electronic circuit of claim 13, wherein the first fixed voltage generating source comprises a reference leg of a current mirror circuit.

15. The electronic circuit of claim 13, further comprising:

a comparator coupled to the second current passing node of the first transistor for generating a two state output signal.

16. The electronic circuit of claim 13, further comprising:

a third magnetoresistance element having first and second terminals;

a third transistor having a control node, and first current passing node, and a second current passing node;

a third fixed voltage generating source having first and second nodes between which a third fixed voltage is generated, wherein the third fixed voltage does not change in response to the changing magnetic field, wherein the first terminal of the third magnetoresistance element is coupled to the first current passing node of the third transistor, wherein the control node of the third transistor receives the third fixed voltage, and the second node of the third fixed voltage generating source is coupled to the second terminal of the third magnetoresistance element, wherein the electronic circuit is operable to generate a third current signal at the second current passing node of the third transistor related to a resistance value of the third magnetoresistance element, wherein the electronic circuit further comprises:

a fourth magnetoresistance element having first and second terminals;

a fourth transistor having a control node, a first current passing node, and a second current passing node;

a fourth fixed voltage generating source having first and second nodes between which a fourth fixed voltage is generated, wherein the fourth fixed voltage does not change in response to the changing magnetic field; and a second load coupled to the second current passing node of the third transistor, wherein the second current passing node of the third transistor is coupled to the second current passing node of the fourth transistor, wherein the first terminal of the fourth magnetoresistance element is coupled to the first current passing node of the fourth transistor, wherein the control node of the fourth transistor receives the fourth fixed voltage, and the second node of the fourth fixed voltage generating source is coupled to the second terminal of the fourth magnetoresistance element, wherein the electronic circuit is operable to generate a fourth current signal at the second current passing node of the fourth transistor related to a resistance value of the fourth magnetoresistance element, wherein a current passing through the second load is equal to a difference between the third current signal and the fourth current signal.

17. The electronic circuit of claim 16, wherein the first fixed voltage generating source and the third fixed voltage generating source are a same first common fixed voltage generating source.

18. The electronic circuit of claim 17, wherein the same first common fixed voltage generating source comprises a reference leg of a current mirror circuit.

19. The electronic circuit of claim 17, wherein the second fixed voltage generating source and the fourth fixed voltage generating source are a same second common fixed voltage generating source.

20. The electronic circuit of claim 19, wherein the same first common fixed voltage generating source comprises a reference leg of a current mirror circuit and wherein the same second common fixed voltage generating source comprises a common mode voltage detector circuit coupled to the first and second loads and configured to generate the first and third fixed voltages as the same common mode voltage related to a common mode voltage between the first and second loads.

21. The electronic circuit of claim 16, wherein the second fixed voltage generating source and the fourth fixed voltage generating source are a same common fixed voltage generating source.

22. The electronic circuit of claim 21, wherein the same common fixed voltage generating source comprises a common mode voltage detector circuit coupled to the first and second loads and configured to generate the first and third fixed voltages as the same common mode voltage related to a common mode voltage between the first and second loads.

* * * * *

UNITED STATES PATENT AND TRADEMARK OFFICE
CERTIFICATE OF CORRECTION

PATENT NO. : 10,712,403 B2  
APPLICATION NO. : 15/624898  
DATED : July 14, 2020  
INVENTOR(S) : Mathew Drouin et al.

Page 1 of 1

It is certified that error appears in the above-identified patent and that said Letters Patent is hereby corrected as shown below:

In the Specification

Column 6, Line 13 delete "and" and replace with --an--.

Column 6, Line 20 delete "circuit" and replace with --circuits--.

Column 7, Line 34 delete "204" and replace with --104--.

Column 10, Line 3 delete "coupled a" and replace with --coupled to a--.

Column 11, Line 13 delete "coupled a" and replace with --coupled to a--.

Column 12, Line 30 delete "coupled a" and replace with --coupled to a--.

Column 14, Line 54 delete "coupled a" and replace with --coupled to a--.

Column 15, Line 54 delete "element" and replace with --elements--.

Column 17, Line 52 delete "coupled a" and replace with --coupled to a--.

Column 20, Line 2 delete "1180" and replace with --1108--.

Column 21, Line 56 delete "designation" and replace with --designations--.

Column 22, Line 39 delete "as a" and replace with --as--.

Column 22, Line 45 delete "1400" and replace with --1300--.

Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*